US011600520B2

(12) United States Patent
Wang et al.

(10) Patent No.: US 11,600,520 B2
(45) Date of Patent: Mar. 7, 2023

(54) AIR GAPS IN MEMORY ARRAY STRUCTURES

(71) Applicant: Taiwan Semiconductor Manufacturing Co., Ltd., Hsinchu (TW)

(72) Inventors: Sheng-Chen Wang, Hsinchu (TW); Kai-Hsuan Lee, Hsinchu (TW); Sai-Hooi Yeong, Zhubei (TW); Chia-Ta Yu, New Taipei (TW); Han-Jong Chia, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 26 days.

(21) Appl. No.: 17/159,830

(22) Filed: Jan. 27, 2021

(65) Prior Publication Data
US 2021/0407845 A1    Dec. 30, 2021

Related U.S. Application Data

(60) Provisional application No. 63/044,588, filed on Jun. 26, 2020.

(51) Int. Cl.
*H01L 21/768*    (2006.01)
*H01L 29/24*    (2006.01)
(Continued)

(52) U.S. Cl.
CPC .... *H01L 21/7682* (2013.01); *H01L 21/02565* (2013.01); *H01L 21/76802* (2013.01);
(Continued)

(58) Field of Classification Search
CPC ........... H01L 21/7682; H01L 21/02565; H01L 21/76802; H01L 21/76877; H01L 23/5226;
(Continued)

(56) References Cited

U.S. PATENT DOCUMENTS

| 10,256,247 B1 | 4/2019 | Kanakamedala et al. |
| 2020/0058673 A1 | 2/2020 | Nishikawa et al. |

(Continued)

FOREIGN PATENT DOCUMENTS

| TW | I643317 B | 12/2018 |
| TW | I643318 B | 12/2018 |
| TW | 201926642 A | 7/2019 |

*Primary Examiner* — Karen Kusumakar
(74) *Attorney, Agent, or Firm* — Slater Matsil, LLP

(57) ABSTRACT

A memory device includes first transistor over a semiconductor substrate, wherein the first transistor includes a first word line extending over the semiconductor substrate; a second transistor over the semiconductor substrate, wherein the second transistor includes a second word line extending over the first word line; a first air gap extending between the first word line and the second word line; a memory film extending along and contacting the first word line and the second word line; a channel layer extending along the memory film; a source line extending along the channel layer, wherein the memory film is between the source line and the word line; a bit line extending along the channel layer, wherein the memory film is between the bit line and the word line; and an isolation region between the source line and the bit line.

20 Claims, 55 Drawing Sheets

(51) Int. Cl.
*H01L 27/1159* (2017.01)
*H01L 27/11597* (2017.01)
*H01L 23/532* (2006.01)
*H01L 21/02* (2006.01)
*H01L 23/522* (2006.01)

(52) U.S. Cl.
CPC .... *H01L 21/76877* (2013.01); *H01L 23/5226* (2013.01); *H01L 23/5329* (2013.01); *H01L 27/1159* (2013.01); *H01L 27/11597* (2013.01); *H01L 29/24* (2013.01)

(58) Field of Classification Search
CPC ............. H01L 23/5329; H01L 27/1159; H01L 27/11597; H01L 29/24; H01L 27/11565; H01L 27/11578; H01L 27/11587; H01L 29/78391; H01L 29/792; H01L 21/764; H01L 27/11568; H01L 29/0642; H01L 29/6684
See application file for complete search history.

(56) References Cited

U.S. PATENT DOCUMENTS

| | | | |
|---|---|---|---|
| 2020/0075631 A1* | 3/2020 | Dong | H01L 29/7869 |
| 2020/0119025 A1* | 4/2020 | Jiang | G11C 5/12 |
| 2020/0194451 A1 | 6/2020 | Lee et al. | |
| 2021/0335805 A1* | 10/2021 | Kai | H01L 29/7926 |

* cited by examiner

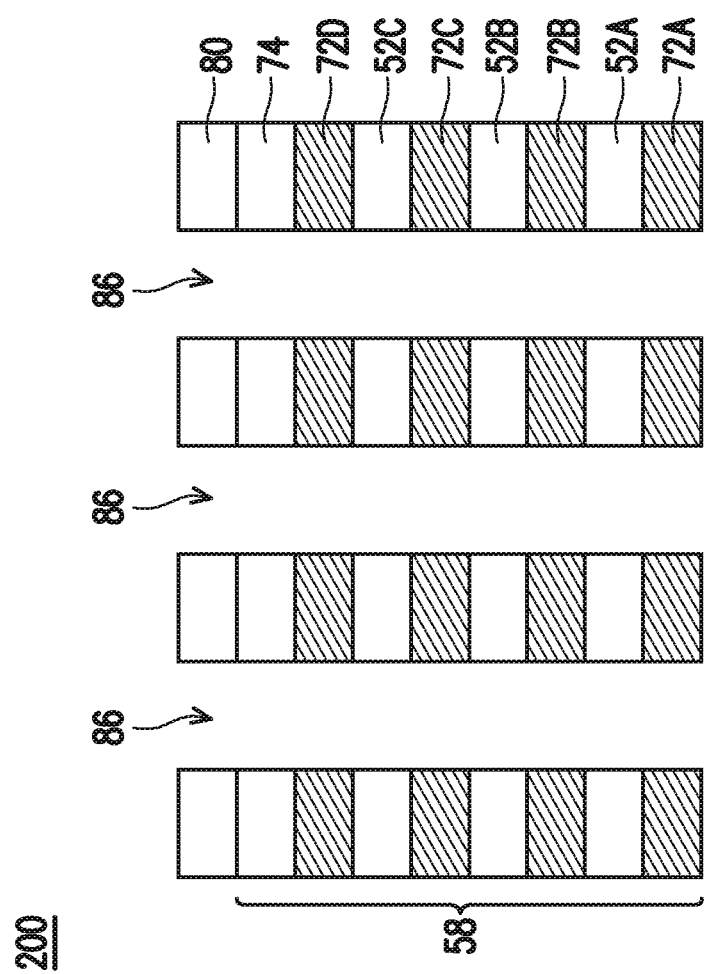

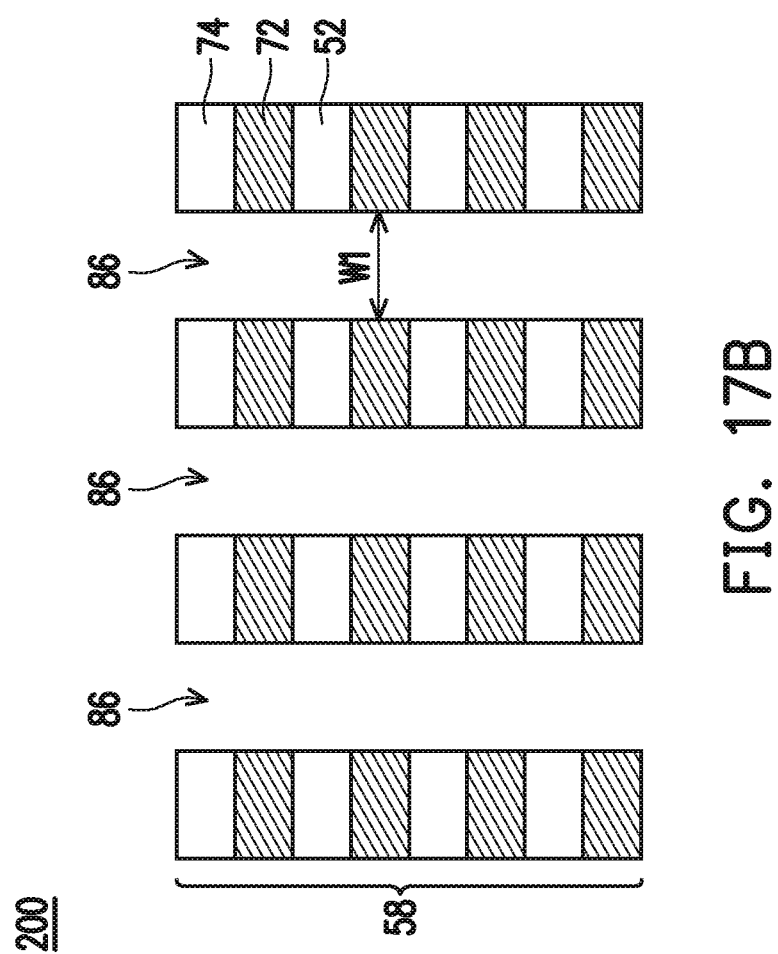

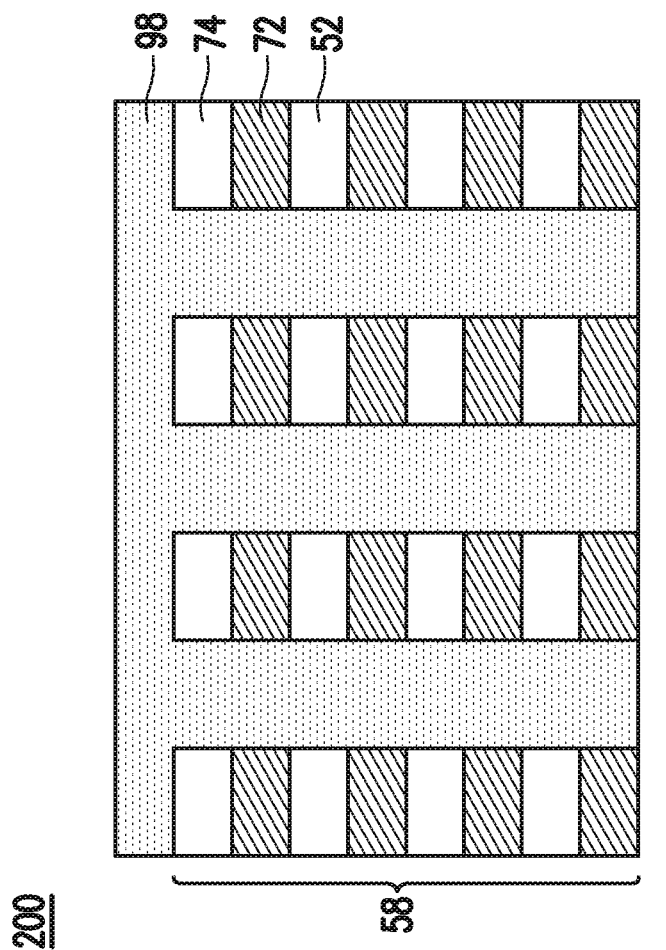

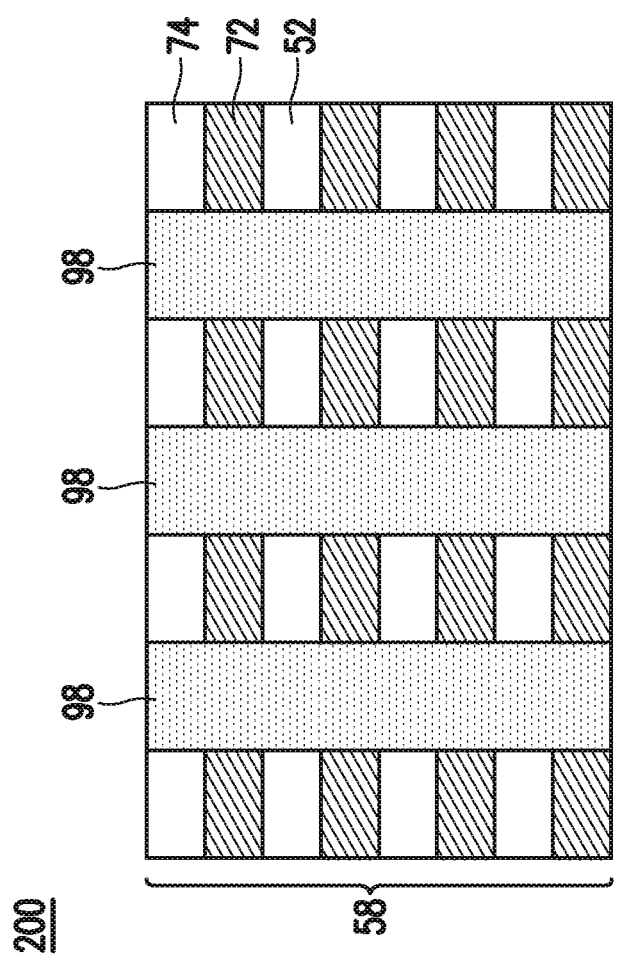

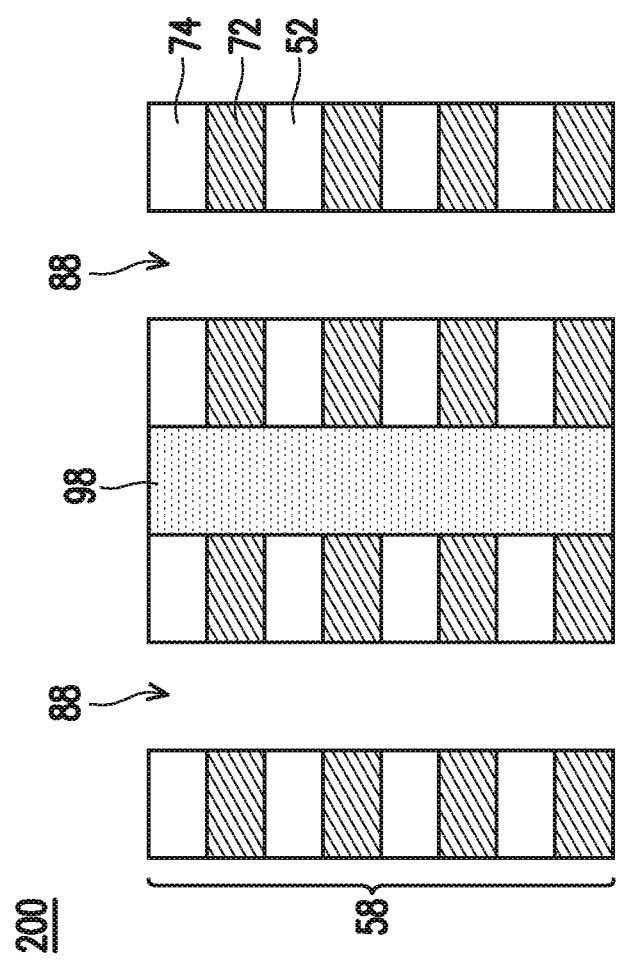

AIR GAPS IN MEMORY ARRAY STRUCTURES

PRIORITY CLAIM AND CROSS-REFERENCE

This application claims the benefit of U.S. Provisional Application No. 63/044,588, filed on Jun. 26, 2020, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is Ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4, 5, 6, 7, 8, 9, 10, 11, 12, 13, 14A, 14B, 15, 16, 17A, 17B, 18, 19A, 19B, 20A, 20B, 20C, 21, 22, 23A, 23B, 23C, 24A, 24B, 24C, 25A, 25B, 25C, 26A, 26B, 27, 28, 29, 30, 31A, 31B, 31C, and 31D illustrate varying views of intermediate steps in the manufacture of a memory array, in accordance with some embodiments.

DETAILED DESCRIPTION

Figure 1A:
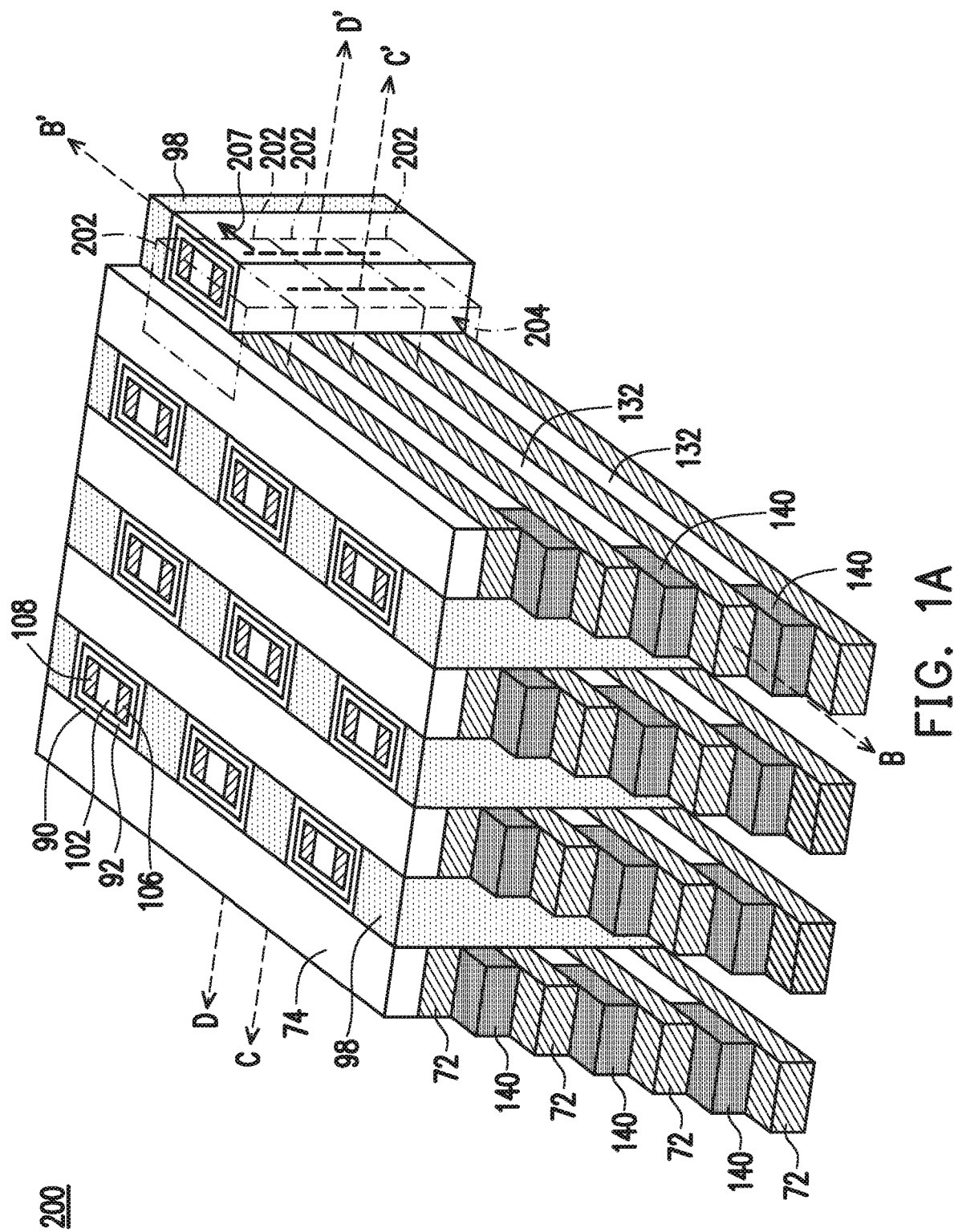
FIGS. 1A, 1B, and 1C illustrate a perspective view, a circuit diagram, and a top down view of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a 3D memory array with a plurality of vertically stacked memory cells. Each memory cell includes a transistor having a word line region acting as a gate electrode, a bit line region acting as a first source/drain electrode, and a source line region acting as a second source/drain electrode. Each transistor further includes an insulating memory film (e.g., as a gate dielectric) and an oxide semiconductor (OS) channel region. In some embodiments, isolation regions between adjacent word lines are formed as air gaps. By separating the word lines with air gaps, capacitance between the word lines can be reduced. The air gaps may be formed, for example, by initially forming a sacrificial material between the word lines, and then removing the sacrificial material using one or more etching processes. A material may be deposited to seal the ends of the air gaps to protect the air gaps and provide additional structural support. Forming air gaps between word lines in this manner can reduce parasitic effects such as parasitic capacitance between word lines, which can allow for higher-frequency operation of the transistors, improved device performance, and improved device efficiency.

Figure 1B:
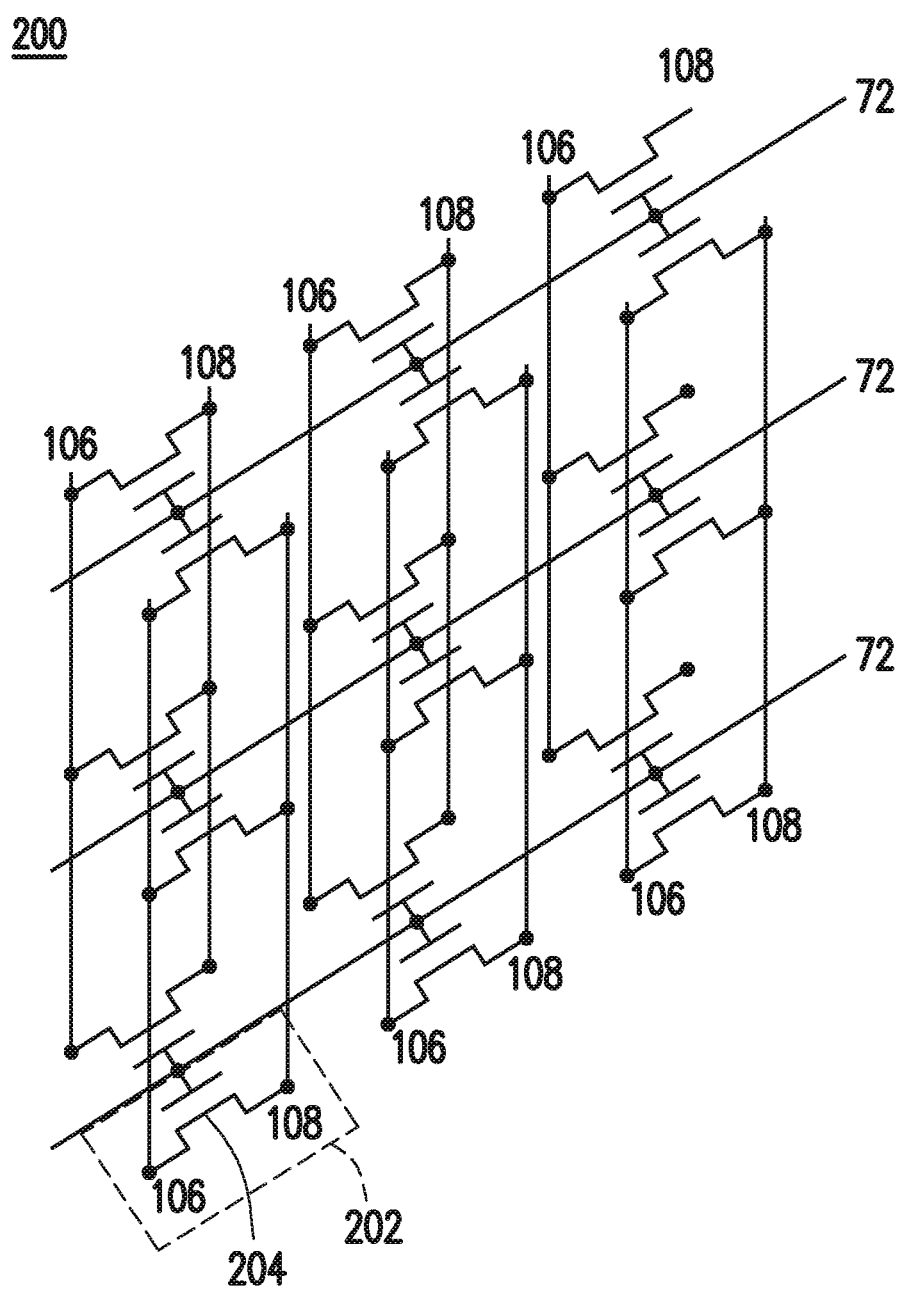
Figure 1C:
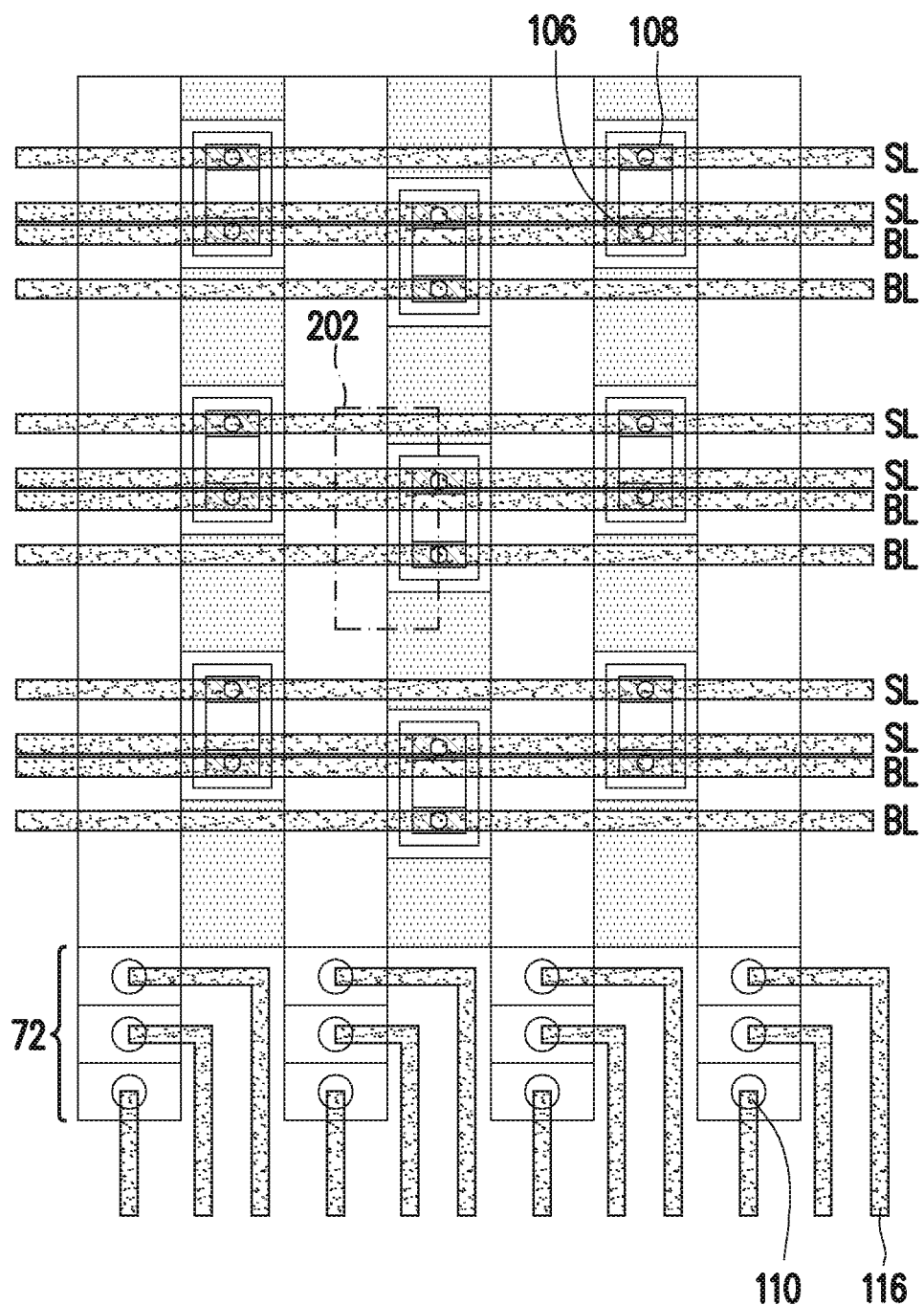

FIGS. 1A, 1B, and 1C illustrate examples of a memory array according to some embodiments. FIG. 1A illustrates an example of a portion of the memory array 200 in a three-dimensional view; FIG. 1B illustrates a circuit diagram of the memory array 200; and FIG. 1C illustrates a top down view (e.g., a plan view) of the memory array 200 in accordance with some embodiments. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array may be disposed in the interconnect layers of the semiconductor die, such as above one or more active devices (e.g., transistors or the like) formed on a semiconductor substrate.

In some embodiments, the memory array 200 is a non-volatile memory array, such as a NOR memory array, or the like. Each memory cell 202 may include a transistor 204 with an insulating memory film 90 as a gate dielectric. The transistor 204 may be a thin film transistor (TFT) in some embodiments. In some embodiments, a gate of each transistor 204 is electrically coupled to a respective word line (e.g., conductive line 72), a first source/drain region of each transistor 204 is electrically coupled to a respective bit line (e.g., conductive line 106), and a second source/drain region of each transistor 204 is electrically coupled to a respective source line (e.g., conductive line 108), which electrically couples the second source/drain region to ground. The memory cells 202 in a same horizontal row of the memory array 200 may share a common word line (e.g., 72), while the memory cells 202 in a same vertical column of the memory array 200 may share a common source line (e.g., 108) and a common bit line (e.g., 106).

The memory array 200 includes a plurality of vertically stacked conductive lines 72 (e.g., word lines) with air gaps 132 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, as shown in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72 (see, for example, FIGS. 31A-D). Each air gap 132 may be sealed at one or both ends by seals 140 formed of a dielectric material.

The memory array 200 further includes a plurality of conductive lines 106 (e.g., bit lines) and conductive lines 108 (e.g., source lines). The conductive lines 106 and 108 may each extend in a direction perpendicular to the conductive lines 72. A dielectric material 98 is disposed between and isolates adjacent ones of the conductive lines 106 and the conductive lines 108. Pairs of the conductive lines 106 and 108 along with an intersecting conductive line 72 define boundaries of each memory cell 202, and a dielectric material 102 is disposed between and isolates adjacent pairs of the conductive lines 106 and 108. In some embodiments, the conductive lines 108 are electrically coupled to ground. Although FIG. 1A illustrates a particular placement of the conductive lines 106 relative the conductive lines 108, it should be appreciated that the placement of the conductive lines 106 and 108 may be flipped in other embodiments.

As discussed above, the memory array 200 may also include an oxide semiconductor (OS) layer 92. The OS layer 92 may provide channel regions for the transistors 204 of the memory cells 202. For example, when an appropriate voltage (e.g., higher than a respective threshold voltage ($V_{th}$) of a corresponding transistor 204) is applied through a corresponding conductive line 72, a region of the OS layer 92 that intersects the conductive line 72 may allow current to flow from the conductive lines 106 to the conductive lines 108 (e.g., in the direction indicated by arrow 207). Accordingly, the OS layer 92 may be considered a channel layer in some cases.

A memory film 90 is disposed between the conductive lines 72 and the OS layer 92, and the memory film 90 may provide gate dielectrics for the transistors 204. In some embodiments, the memory film 90 comprises a ferroelectric material, such as a hafnium oxide, hafnium zirconium oxide, silicon-doped hafnium oxide, or the like. Accordingly, the memory array 200 may also be referred to as a Ferroelectric Random Access Memory (FeRAM) array. Alternatively, the memory film 90 may be a multilayer structure comprising a layer of $SiN_x$ between two $SiO_x$ layers (e.g., an ONO structure), a different ferroelectric material, a different type of memory layer (e.g., capable of storing a bit), or the like.

In embodiments where the memory film 90 comprises a ferroelectric material, the memory film 90 may be polarized in one of two different directions, and the polarization direction may be changed by applying an appropriate voltage differential across the memory film 90 and generating an appropriate electric field. The polarization may be relatively localized (e.g., generally contained within each boundaries of the memory cells 202), and a continuous region of the memory film 90 may extend across a plurality of memory cells 202. Depending on a polarization direction of a particular region of the memory film 90, a threshold voltage of a corresponding transistor 204 varies, and a digital value (e.g., 0 or 1) can be stored. For example, when a region of the memory film 90 has a first electrical polarization direction, the corresponding transistor 204 may have a relatively low threshold voltage, and when the region of the memory film 90 has a second electrical polarization direction, the corresponding transistor 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the memory film 90 corresponding to the memory cell 202. The write voltage can be applied, for example, by applying appropriate voltages to a corresponding conductive line 72 (e.g., the word line) and the corresponding conductive lines 106/108 (e.g., the bit line/source line). By applying the write voltage across the portion of the memory film 90, a polarization direction of the region of the memory film 90 can be changed. As a result, the corresponding threshold voltage of the corresponding transistor 204 can also be switched from a low threshold voltage to a high threshold voltage or vice versa, and a digital value can be stored in the memory cell 202. Because the conductive lines 72 intersect the conductive lines 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the world line). Depending on the polarization direction of the corresponding region of the memory film 90, the transistor 204 of the memory cell 202 may or may not be turned on. As a result, the conductive line 106 may or may not be discharged through the conductive line 108 (e.g., a source line that is coupled to ground), and the digital value stored in the memory cell 202 can be determined. Because the conductive lines 72 intersect the conductive lines 106 and 108, individual memory cells 202 may be selected for the read operation.

FIG. 1A further illustrates reference cross-sections of the memory array 200 that are used in later figures. Reference Cross-section B-B' is along a longitudinal axis of conductive lines 72 and in a direction, for example, parallel to the direction of current flow of the transistors 204. Reference cross-section C-C' is perpendicular to cross-section B-B' and is parallel to a longitudinal axis of the conductive lines 72. Reference cross-section C-C' extends through the conductive lines 106 and/or the conductive lines 108. Reference cross-section D-D' is parallel to reference cross-section C-C' and extends through the dielectric material 102. Subsequent figures refer to these reference cross-sections for clarity.

Figure 2:
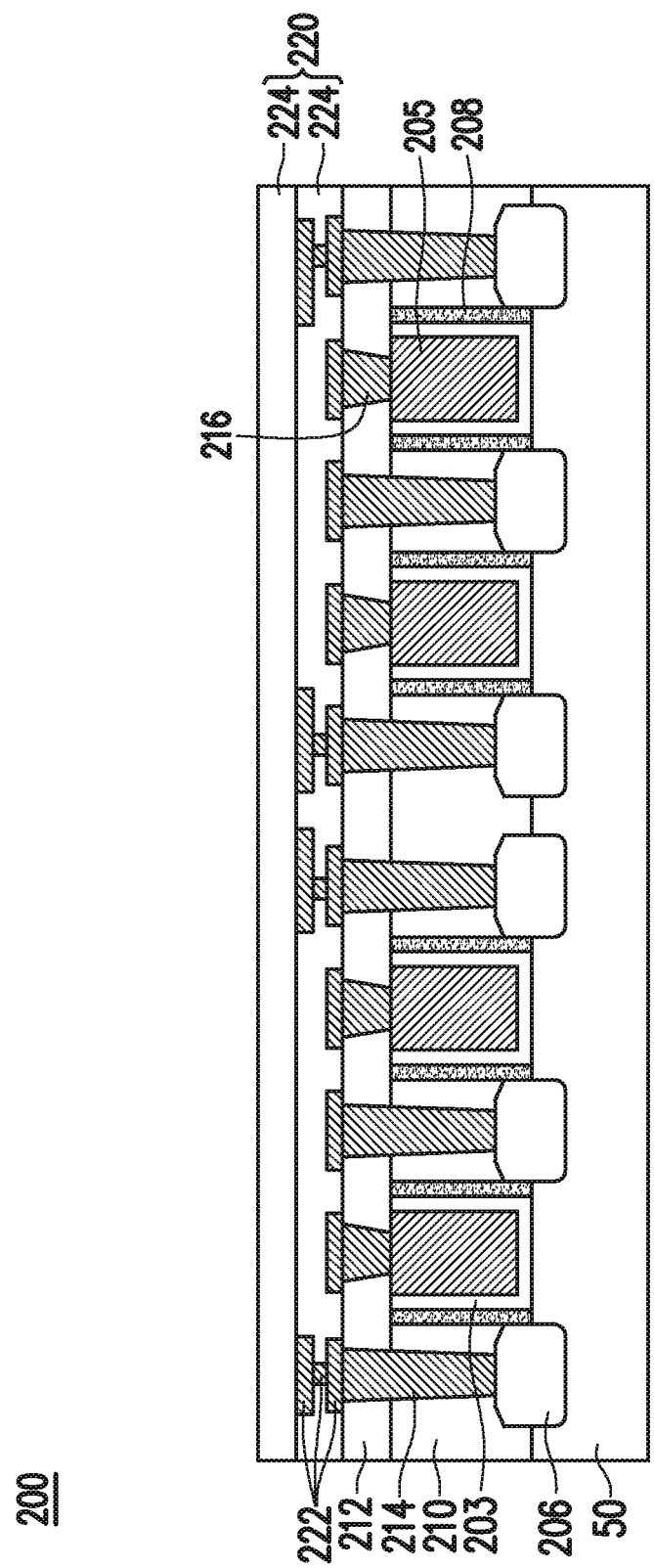

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include active devices (e.g., transistors) at a top surface of the substrate 50. The transistors may include gate dielectric layers 203 over top surfaces of the substrate 50 and gate electrodes 205 over the gate dielectric layers 203. Source/drain regions 206 are disposed in the substrate 50 on opposite sides of the gate dielectric layers 203 and the gate electrodes 205. Gate spacers 208 are formed along sidewalls of the gate dielectric layers 203 and separate the source/drain regions 206 from the gate electrodes 205 by appropriate lateral distances. In some embodiments, the transistors may be planar field effect transistors (FETs), fin field effect transistors (FinFETs), nano-field effect transistors (nanoFETs), or the like.

A first ILD 210 surrounds and isolates the source/drain regions 206, the gate dielectric layers 203, and the gate electrodes 205 and a second ILD 212 is over the first ILD 210. Source/drain contacts 214 extend through the second ILD 212 and the first ILD 210 and are electrically coupled to the source/drain regions 206 and gate contacts 216 extend through the second ILD 212 and are electrically coupled to the gate electrodes 205. An interconnect structure 220, including one or more stacked dielectric layers 224 and conductive features 222 formed in the one or more dielectric layers 224, is over the second ILD 212, the source/drain contacts 214, and the gate contacts 216. Although FIG. 2 illustrates two stacked dielectric layers 224, it should be appreciated that the interconnect structure 220 may include any number of dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
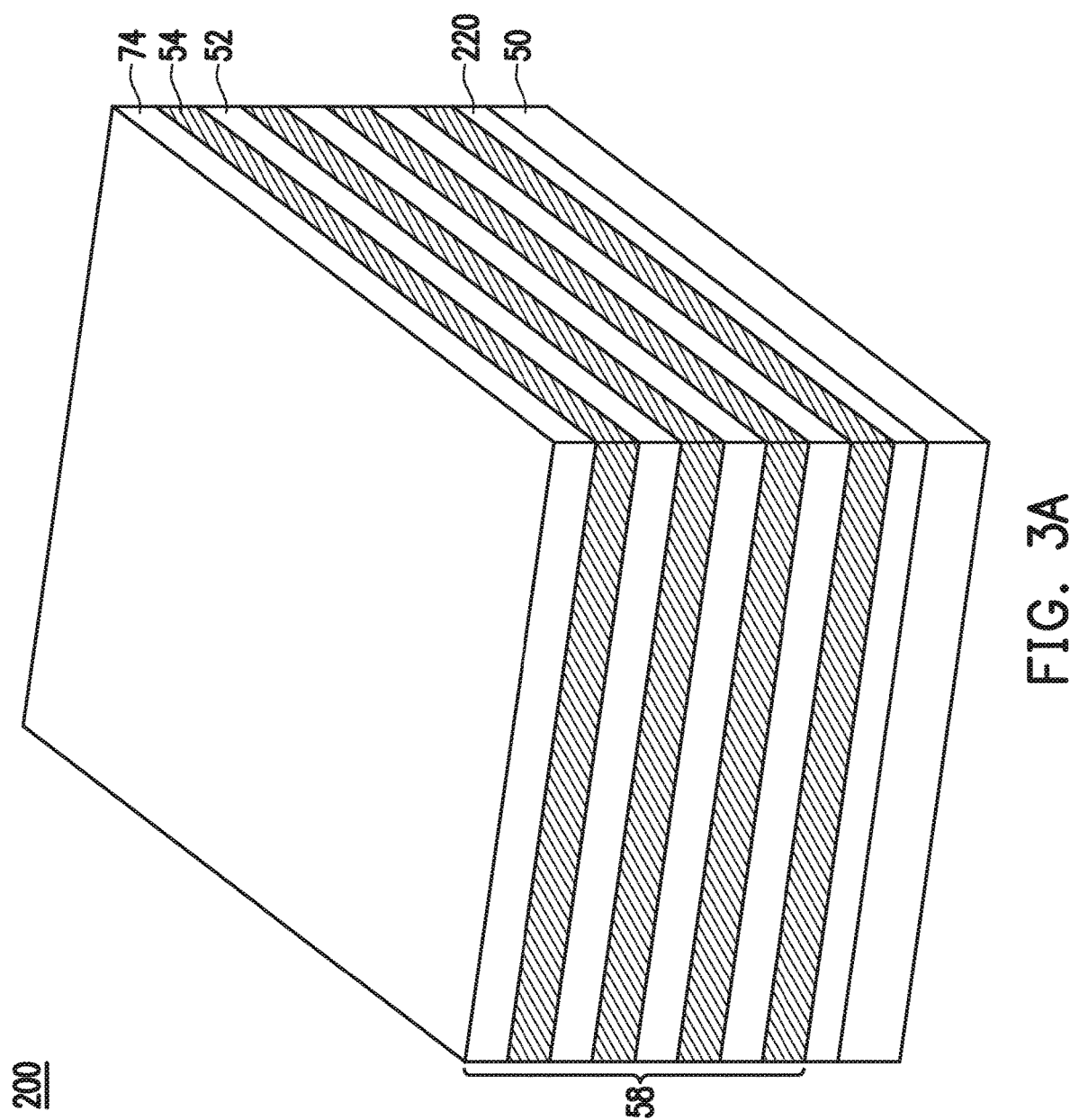
Figure 3B:
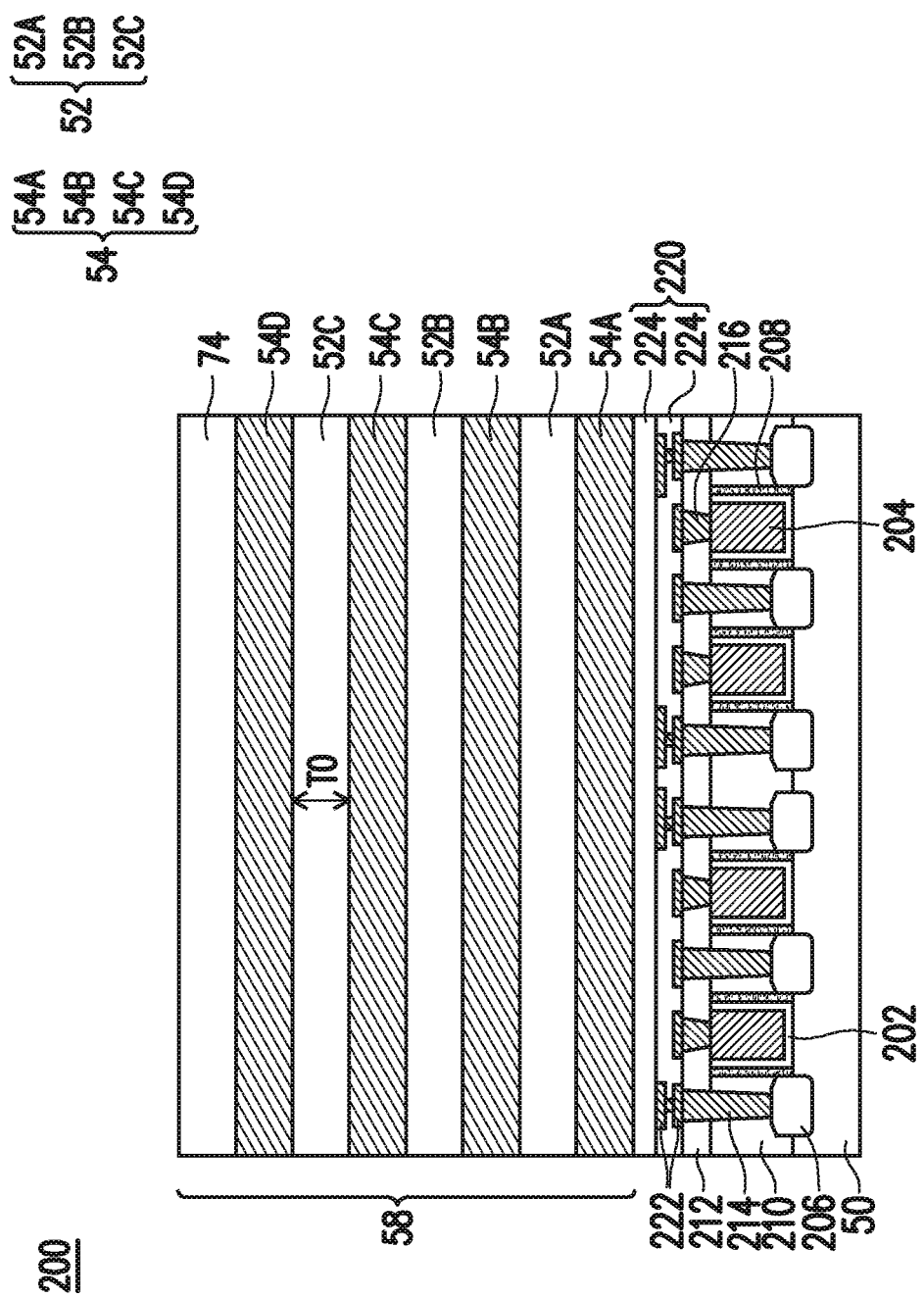

In FIGS. 3A and 3B, a multi-layer stack 58 is formed over the structure of FIG. 2. The substrate 50, the transistors, the ILDs, and the interconnect structure 220 may be omitted from subsequent drawings for the purposes of simplicity and clarity. Although the multi-layer stack 58 is illustrated as contacting the dielectric layers 224 of the interconnect structure 220, any number of intermediate layers may be disposed between the substrate 50 and the multi-layer stack 58. For example, one or more additional interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B).

The multi-layer stack 58 includes alternating layers of conductive layers 54A-D (collectively referred to as conductive layers 54) and sacrificial layers 52A-C (collectively referred to as sacrificial layers 52). The multi-layer stack 58 includes an insulating layer 74 over the topmost conductive layer 54. The conductive layers 54 may be patterned in subsequent steps to define the conductive lines 72 (e.g., word lines). The conductive layers 54 may comprise a conductive material, such as, copper, titanium, titanium nitride, tantalum, tantalum nitride, tungsten, ruthenium, aluminum, combinations thereof. The sacrificial layers 52 may be a material such as silicon, germanium, silicon germanium (SiGe), silicon nitride, silicon oxide, combinations thereof, or the like. The insulating layer 74 may comprise an insulating material, such as silicon oxide, silicon nitride, silicon oxynitride, combinations thereof, or the like. In some embodiments, the material of the insulating layer 74 and the material of the sacrificial layers 52 are chosen so that the sacrificial layers 52 may be selectively etched without significantly etching the insulting layer 74. For example, the sacrificial layers 52 may be silicon and the insulting layer 74 may be silicon oxide, though other materials are possible.

The conductive layers 54, sacrificial layers 52, and insulating layer 74 may be each formed using, for example, chemical vapor deposition (CVD), atomic layer deposition (ALD), physical vapor deposition (PVD), plasma enhanced CVD (PECVD), or the like. In some embodiments, the sacrificial layers 52 are formed having a thickness TO that is in the range of about 20 nm to about 80 nm. Other thicknesses are possible. The sacrificial layers 52 of the multi-layer stack 58 may all have about the same thickness, or two or more of the sacrificial layers 52 may have different thicknesses. Although FIGS. 3A and 3B illustrate a particular number of conductive layers 54 and sacrificial layers 52, other embodiments may include a different number of conductive layers 54 and sacrificial layers 52.

FIGS. 4 through 12 are views of intermediate stages in the manufacturing a staircase structure of the memory array 200, in accordance with some embodiments. FIGS. 4 through 11 and 12 are illustrated along reference cross-section B-B' illustrated in FIG. 1.

Figure 4:
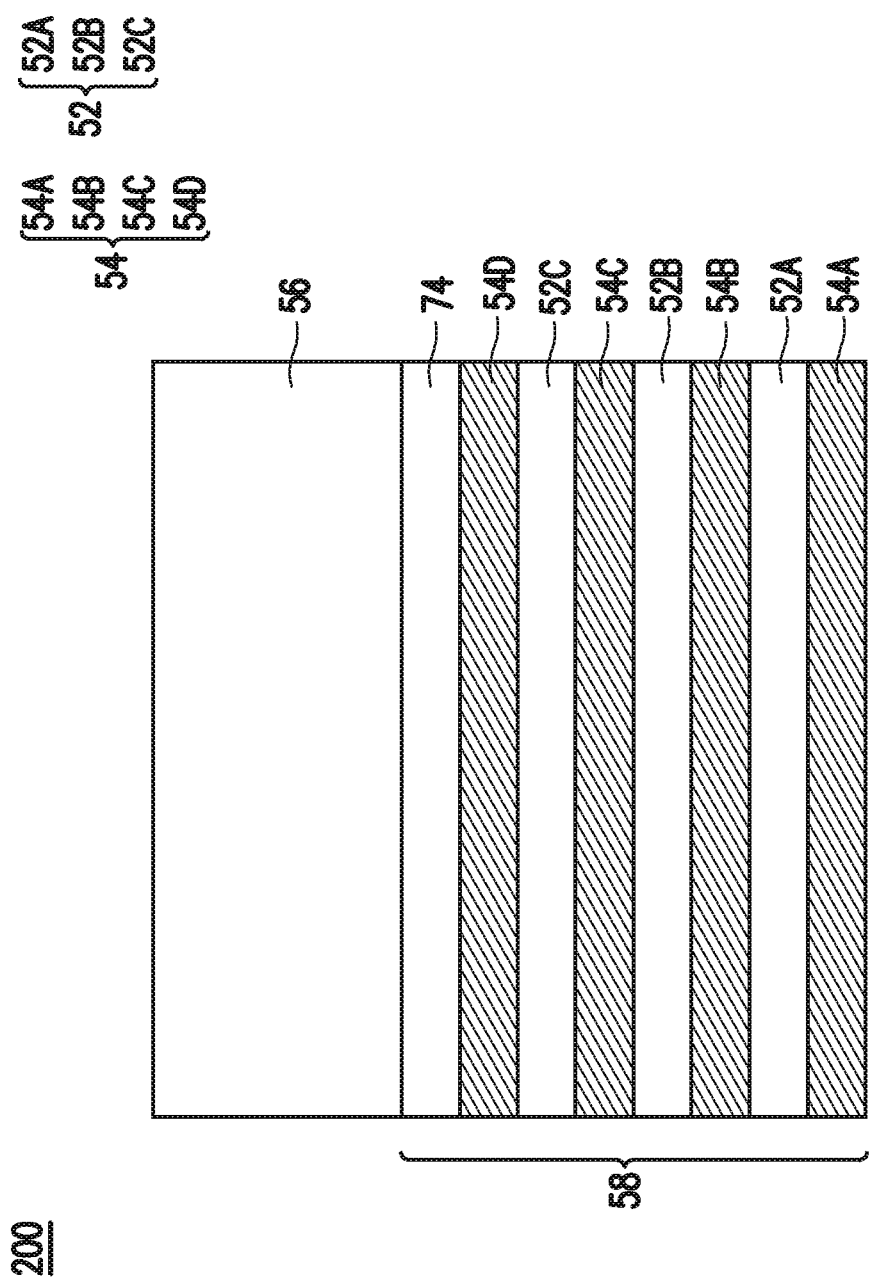

In FIG. 4, a photoresist 56 is formed over the multi-layer stack 58. As discussed above, the multi-layer stack 58 may comprise alternating layers of the conductive layers 54 (labeled 54A, 54B, 54C, and 54D) and the sacrificial layers 52 (labeled 52A, 52B, and 52C), and may be covered by the insulating layer 74. The photoresist 56 can be formed by using a suitable technique, such as by a spin-on technique.

Figure 5:
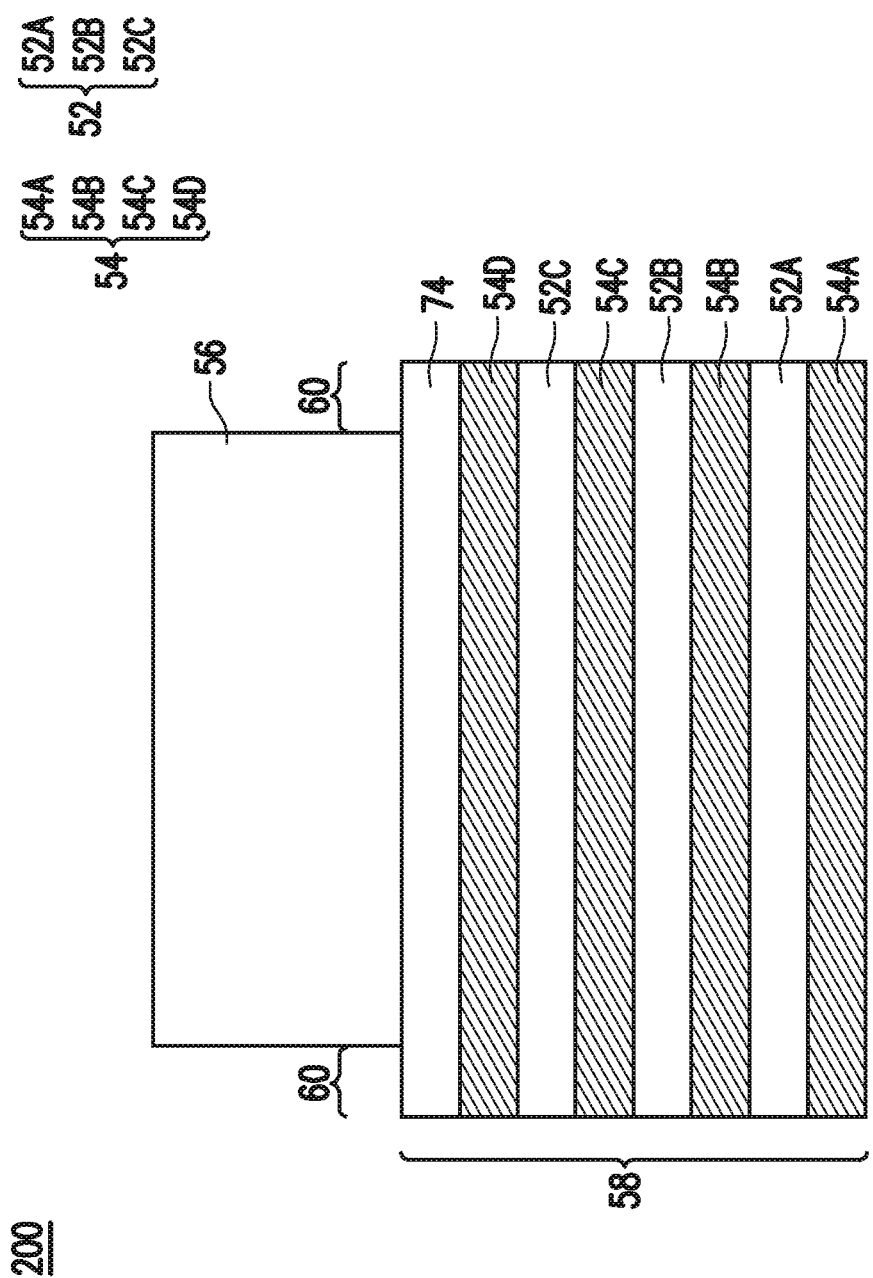
Figure 6:
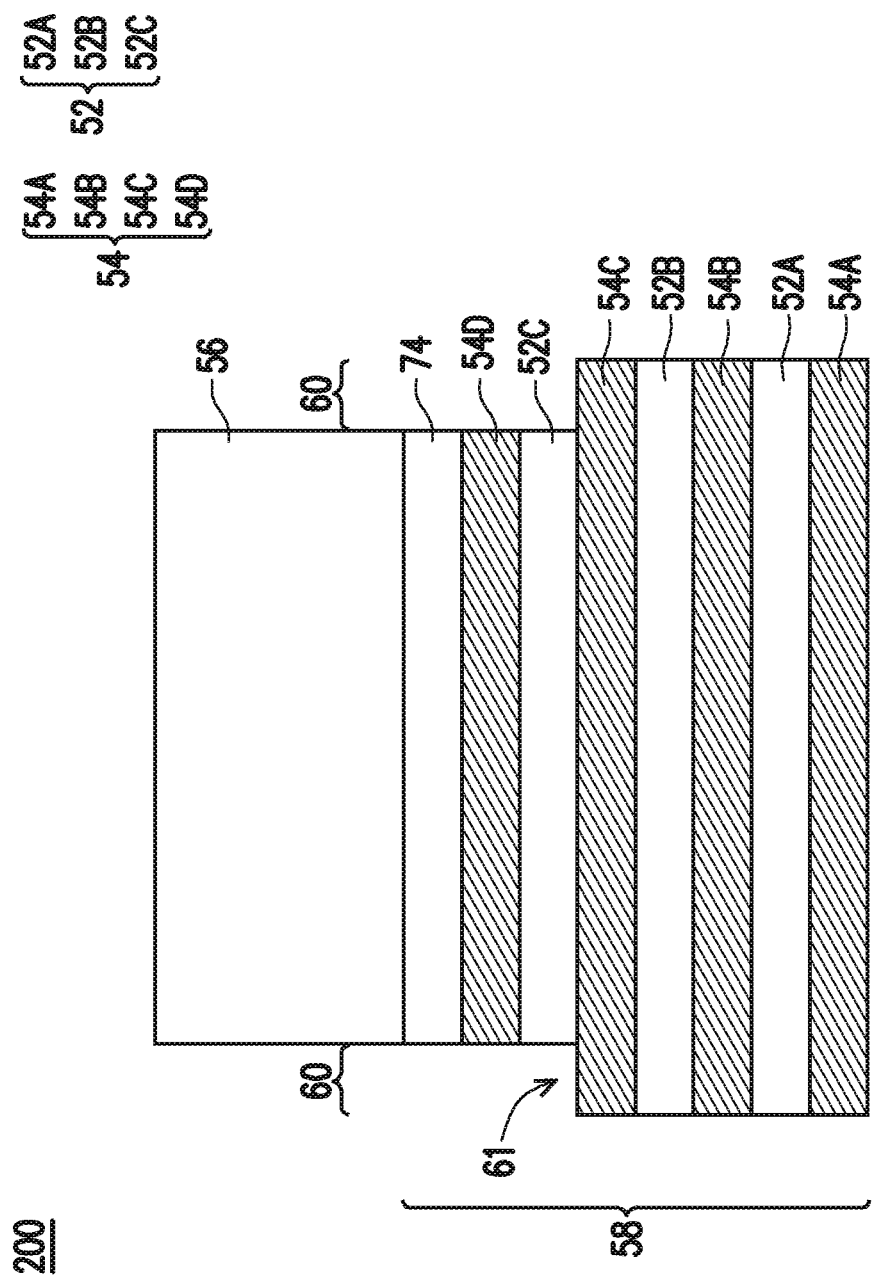

In FIG. 5, the photoresist 56 is patterned to expose the multi-layer stack 58 in regions 60 while masking remaining portions of the multi-layer stack 58. For example, a topmost layer of the multi-layer stack 58 (e.g., the insulating layer 74) may be exposed in the regions 60. The photoresist 56 may be patterned using acceptable photolithography techniques In FIG. 6, the exposed portions of the multi-layer stack 58 in the regions 60 are etched using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may remove portions of the conductive layer 54D and sacrificial layer 52C in the regions 60 and define openings 61. Because the insulating layer 74, the conductive layer 54D, and the sacrificial layer 52C have different material compositions, etchants used to remove exposed portions of these layers may be different. In some embodiments, the sacrificial layer 52C acts as an etch stop layer while etching the conductive layer 54D, and the conductive layer 54C acts as an etch stop layer while etching sacrificial layer 52C. As a result, the portions of the insulating layer 74, the conductive layer 54D, and the sacrificial layer 52C may be selectively removed without removing remaining layers of the multi-layer stack 58, and the openings 61 may be extended to a desired depth. Alternatively, a timed etch processes may be used to stop the etching of the openings 61 after the openings 61 reach a desired depth. In the resulting structure, the conductive layer 54C is exposed in the regions 60.

Figure 7:
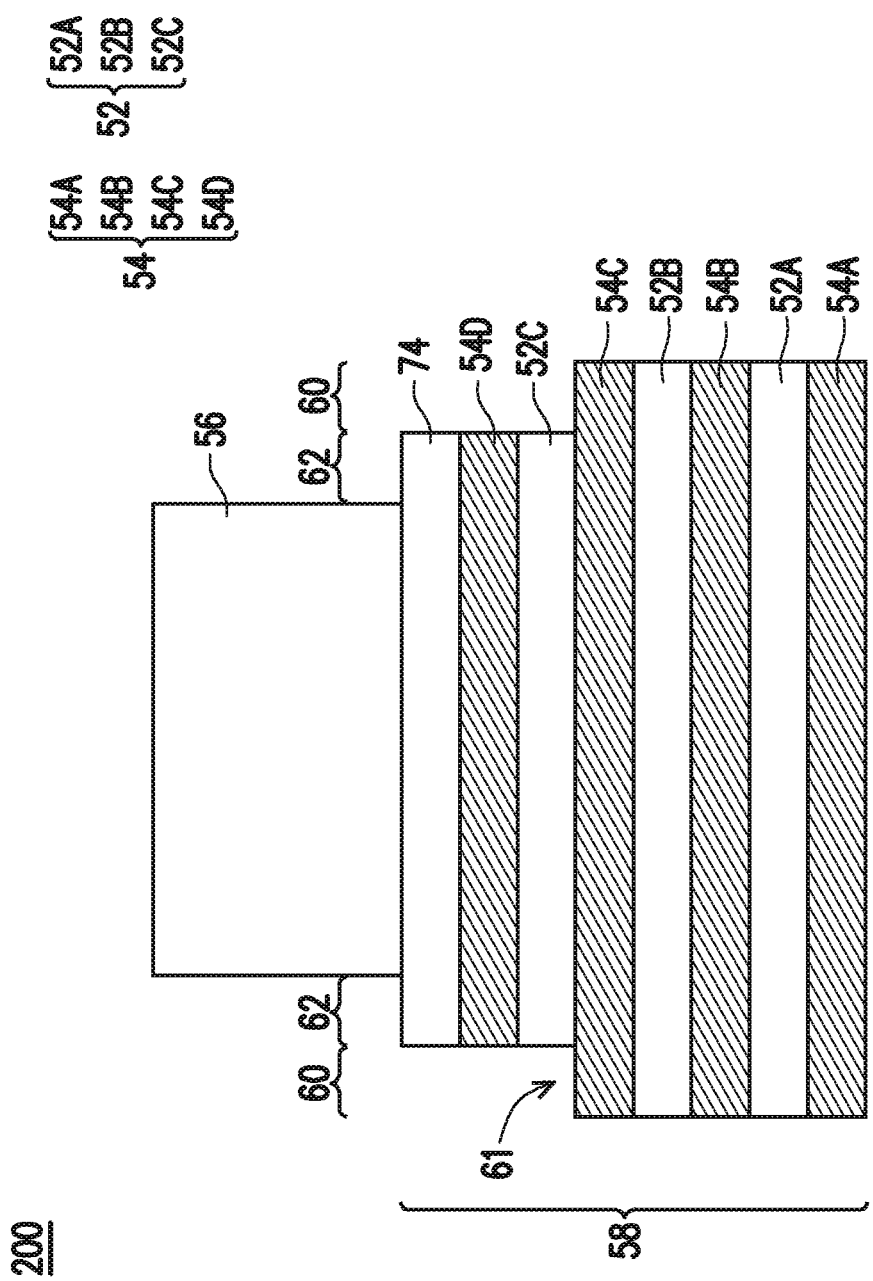

In FIG. 7, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60 and 62 may be exposed. For example, a top surface of the insulating layer 54C may be exposed in the regions 60, and a top surface of the insulating layer 74 may be exposed in the regions 62.

Figure 8:
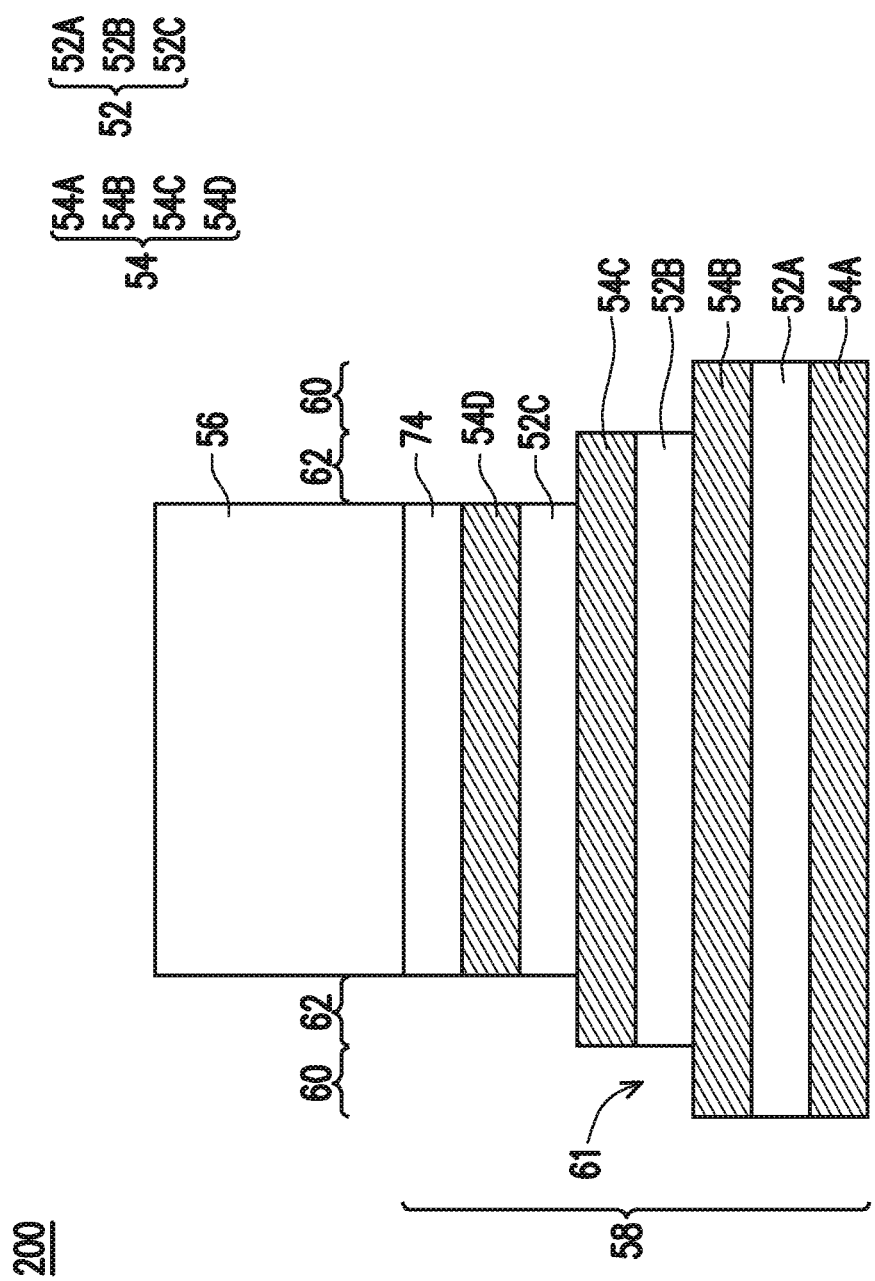

In FIG. 8, portions of the insulating layer 74, the conductive layer 54D, the sacrificial layer 52C, the conductive layer 54C, and the sacrificial layer 52B in the regions 60 and 62 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. Because the insulating layer 74, the conductive layers 54D/54C, and the sacrificial layers 52C/52B have different material compositions, etchants used to remove exposed portions of these layers may be different. In some embodiments, the sacrificial layer 52C acts as an etch stop layer while etching the conductive layer 54D; the conductive layer 54C acts as an etch stop layer while etching sacrificial layer 52C; the sacrificial layer 52B acts as an etch stop layer while etching the conductive layer 54C; and the conductive layer 54B acts as an etch stop layer while etching the sacrificial layer 52B. As a result, portions of the conductive layers 54D/54C and the sacrificial layer 52C/52B may be selectively removed without removing remaining layers of the multi-layer stack 58, and the openings 61 may be extended to a desired depth. Further, during the etching processes, unetched portions of the conductive layers 54 and sacrificial layers 52 act as a mask for underlying layers, and as a result a previous pattern of the conductive layer 54D and sacrificial layer 52C (see FIG. 7) may be transferred to the underlying conductive layer 54C and sacrificial layer 52B. In the resulting structure, the conductive layer 54B is exposed in the regions 60, and the conductive layer 54C is exposed in the regions 62.

Figure 9:
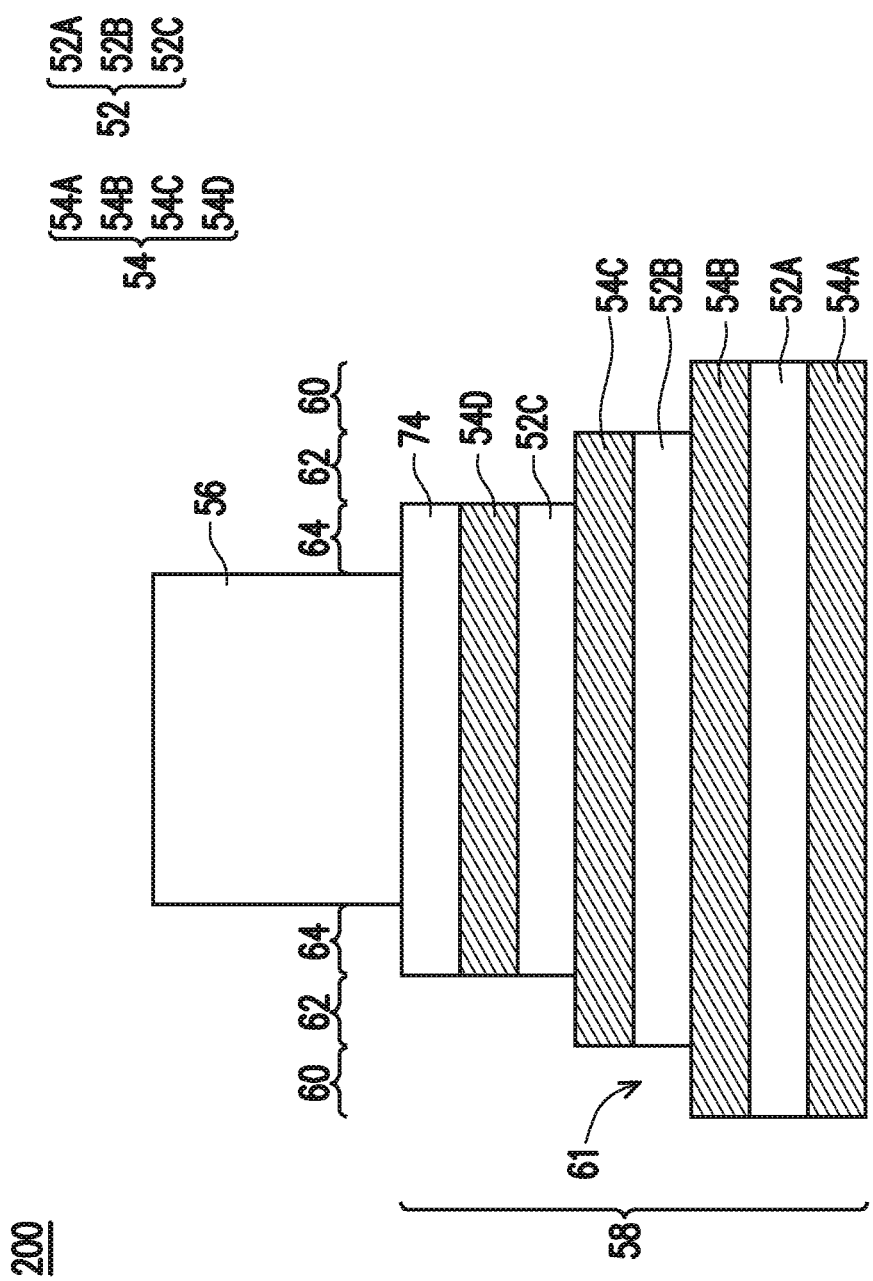

In FIG. 9, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60, 62, and 64 may be exposed. For example, a top surface of the conductive layer 54B may be exposed in the regions 60; a top surface of the conductive layer 54C may be exposed in the regions 62; and a top surface of the insulating layer 74 may be exposed in the regions 64.

Figure 10:
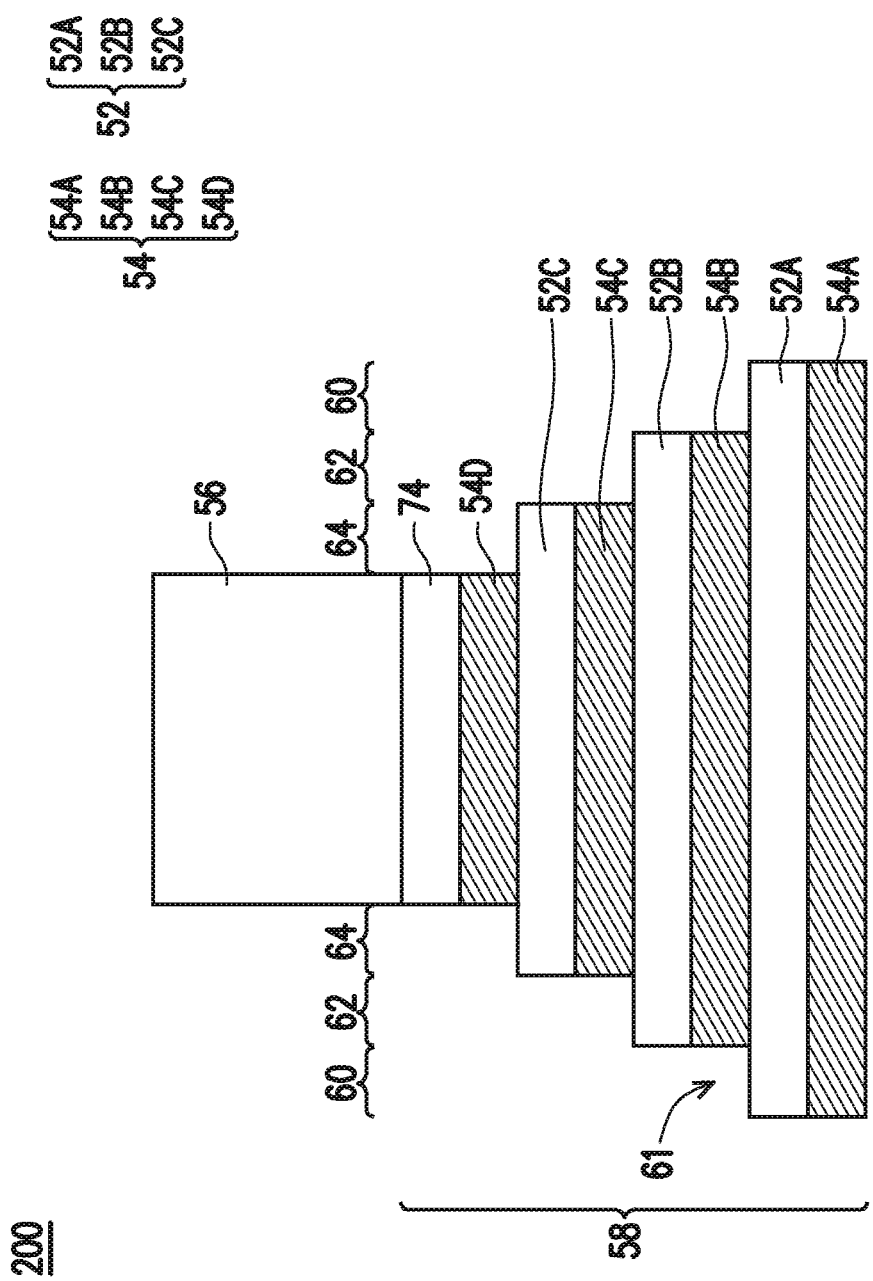

In FIG. 10, portions of the insulating layer 74 in the region 64 and portions of the conductive layers 54D, 54C, and 54B in the regions 60, 62, and 64 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. In some embodiments, the sacrificial layer 52C acts as an etch stop layer while etching the conductive layer 54D; the sacrificial layer 52B acts as an etch stop layer while etching the conductive layer 54C; and the sacrificial layer 52A acts as an etch stop layer etching the conductive layer 54B. As a result, portions of the conductive layers 54D, 54C, and 54B may be selectively removed without removing remaining layers of the multi-layer stack 58, and the openings 61 may be extended to a desired depth. Further, during the etching processes, each of the sacrificial layers 52 act as a mask for underlying layers, and as a result a previous pattern of the sacrificial layers 52C/52B (see FIG. 9) may be transferred to the underlying conductive layers 54C/54B. In the resulting structure, the sacrificial layer 52A is exposed in the regions 60; the sacrificial layer 52B is exposed in the regions 62; and the sacrificial layer 52C is exposed in the regions 64.

Figure 11:
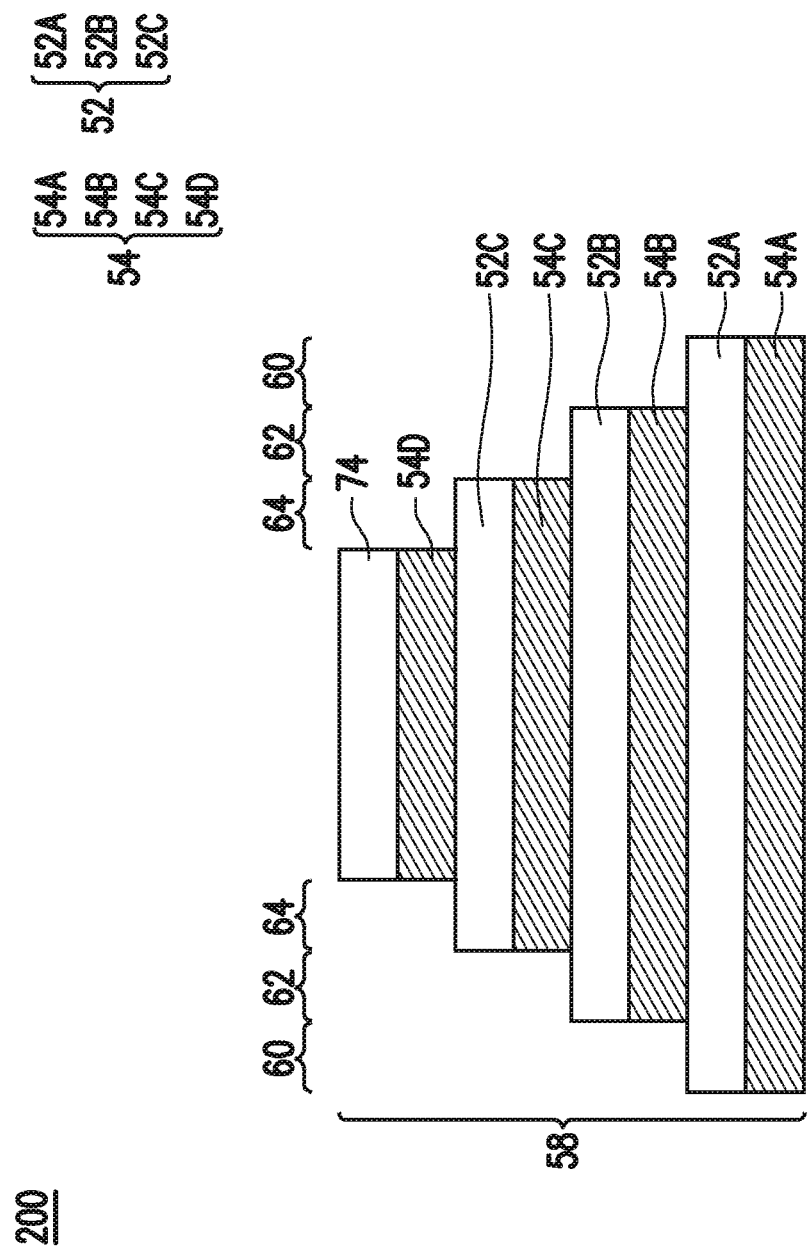

In FIG. 11, the photoresist 56 may be removed, such as by an acceptable ashing or wet strip process. Thus, a staircase structure 68 is formed. The staircase structure comprises a stack of alternating ones of the conductive layers 54 and the sacrificial layers 52, with the top conductive layer (e.g., conductive layer 54D) covered by the insulating layer 74. Lower conductive layers 54 are wider and extend laterally past upper conductive layers 54, and a width of each of the conductive layers 54 increases in a direction towards the substrate 50. For example, the conductive layer 54A may longer than the conductive layer 54B; the conductive layer 54B may be longer than the conductive layer 54C; and the conductive layer 54C may be longer than the conductive layer 54D. As a result, conductive contacts can be made from above the staircase structure 68 to each of the conductive layers 54 in subsequent processing steps.

Figure 12:
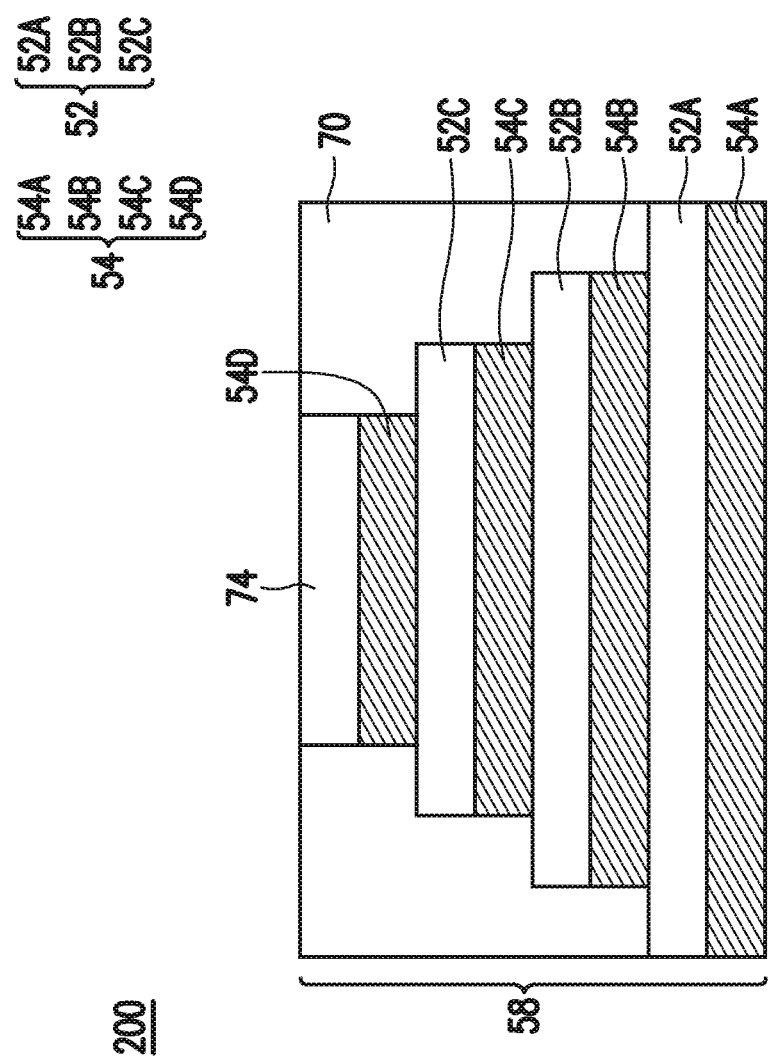

In FIG. 12, an inter-metal dielectric layer (IMD) 70 is deposited over the multi-layer stack 58. The IMD 70 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The IMD 70 extends along sidewalls of the insulating layer 74, the conductive layers 54, and the sacrificial layers 52. Further, the IMD 70 may contact top surfaces of each of the sacrificial layers 52.

As further illustrated in FIG. 12, a removal process may be performed to the IMD 70 to remove excess dielectric material over the multi-layer stack 58. In some embodiments, a planarization process such as a chemical mechanical polish (CMP), a grinding process, an etch-back process, combinations thereof, or the like may be utilized. The planarization process exposes the multi-layer stack 58 such that top surfaces of the multi-layer stack 58 (e.g., top surfaces of the insulating layer 74) and the IMD 70 are level after the planarization process is complete.

FIGS. 13 through 19B are views of intermediate stages in the manufacturing of the memory array 200, in accordance with some embodiments. In FIGS. 13 through 19B, the multi-layer stack 58 is formed and trenches are formed in the multi-layer stack 58, thereby defining the conductive lines 72. The conductive lines 72 may correspond to word lines in the memory array 200, and the conductive lines 72 may further provide gate electrodes for the resulting transistors of the memory array 200. FIGS. 14A, 17A, and 19A are illustrated in a three-dimensional view. FIGS. 13, 14B, 15, 16, 17B, 18, and 19B are illustrated along reference cross-section C-C' illustrated in FIG. 1A.

Figure 13:
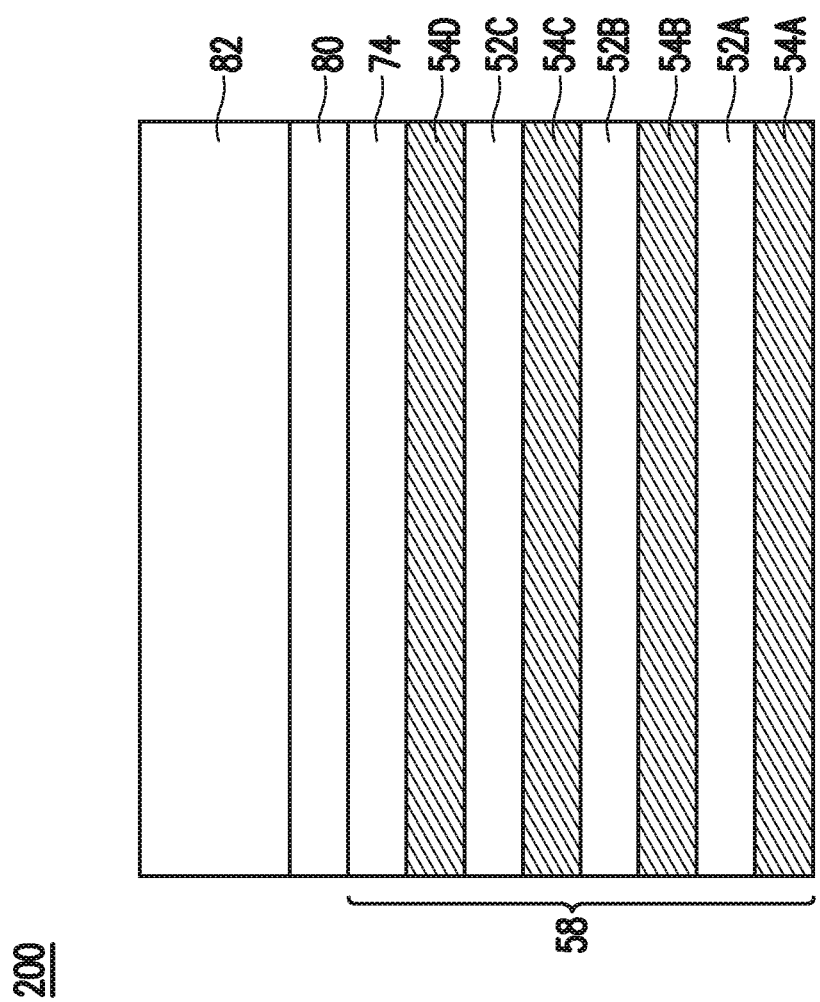

In FIG. 13, a hard mask 80 and a photoresist 82 are deposited over the multi-layer stack 58. The hard mask 80 may include, for example, silicon nitride, silicon oxynitride, or the like, which may be deposited by CVD, PVD, ALD, PECVD, or the like. The photoresist 82 can be formed by using a spin-on technique, for example.

Figure 14A:
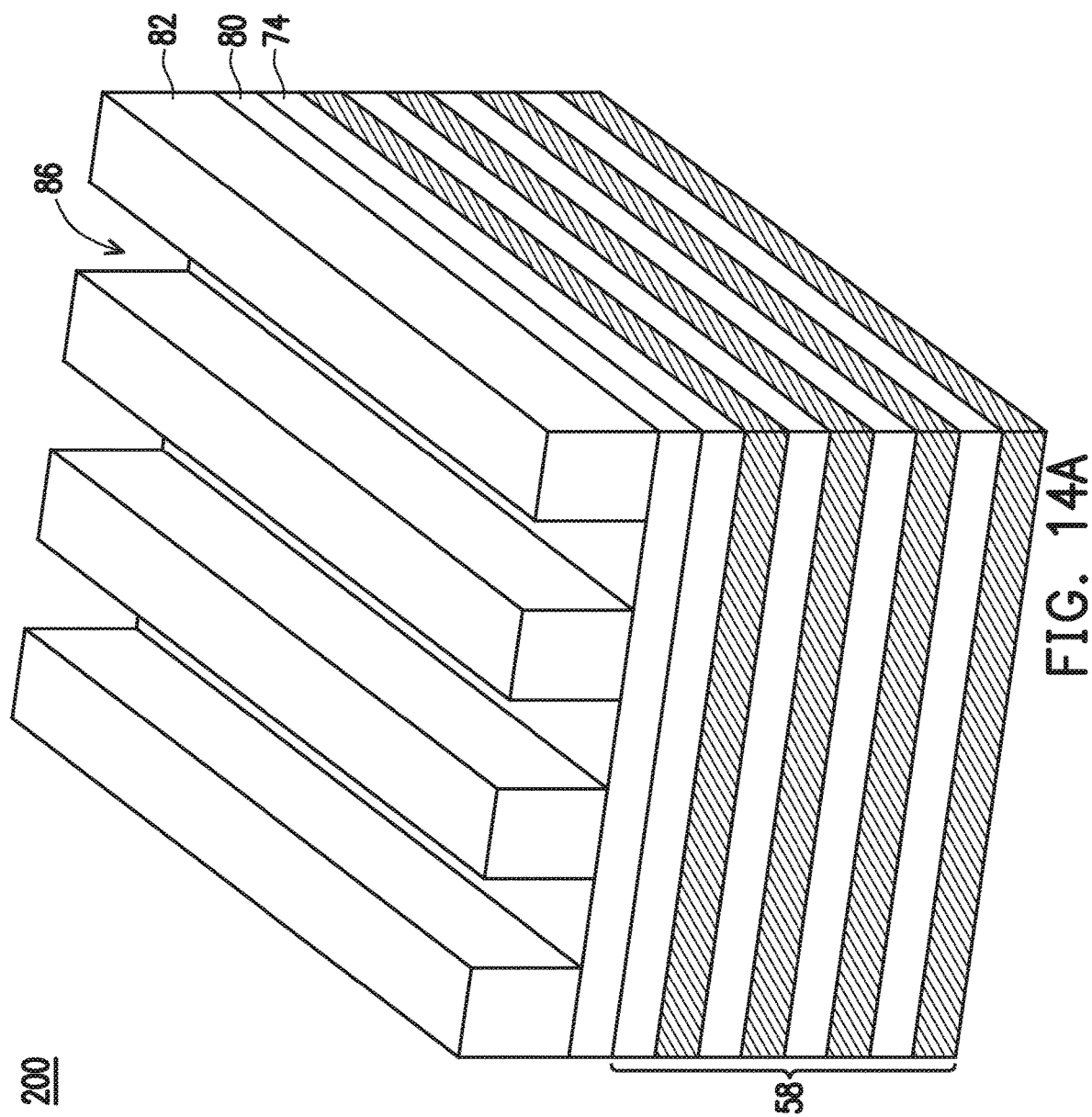
Figure 14B:
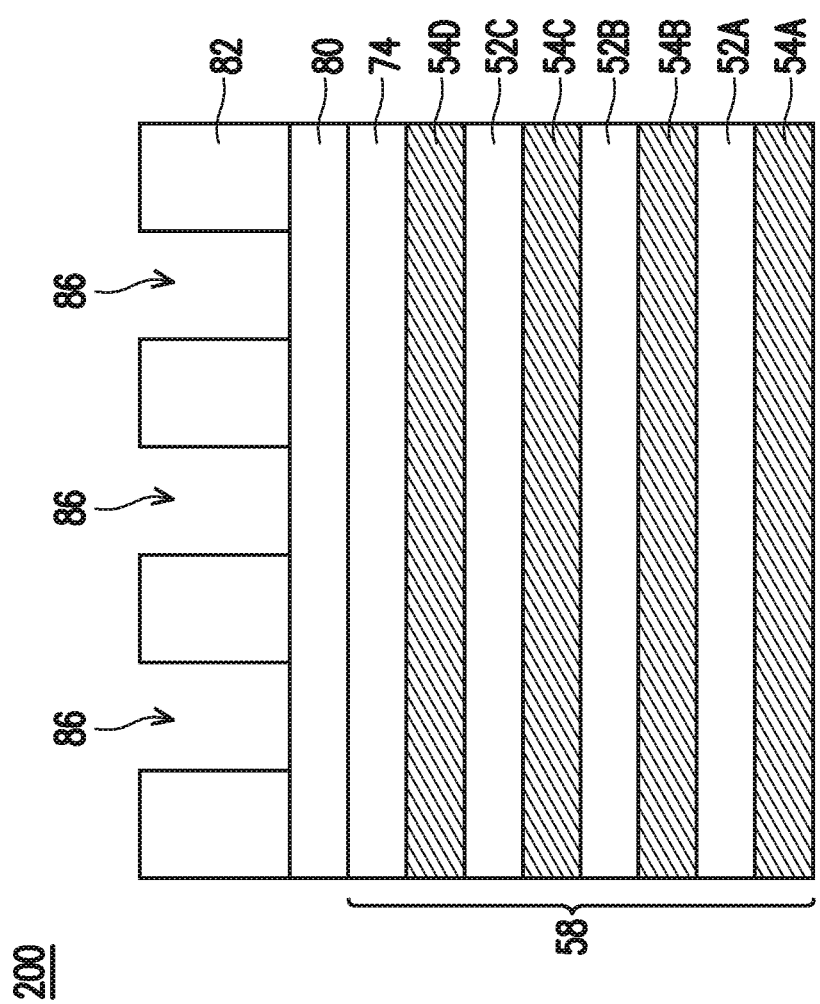

In FIGS. 14A and 14B, the photoresist 82 is patterned to form trenches 86. The photoresist 82 can be patterned using acceptable photolithography techniques. For example, the photoresist 82 be exposed to light for patterning. After the exposure process, the photoresist 82 may be developed to remove exposed or unexposed portions of the photoresist 82 depending on whether a negative or positive resist is used, thereby defining the pattern of the trenches 86.

Figure 15:
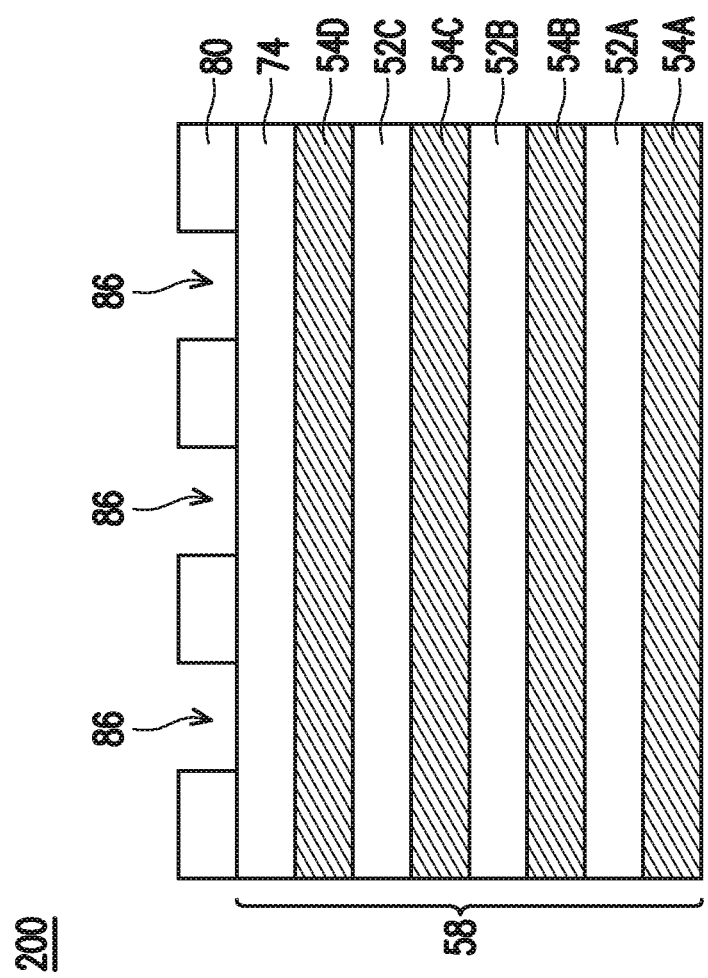
Figure 17A:
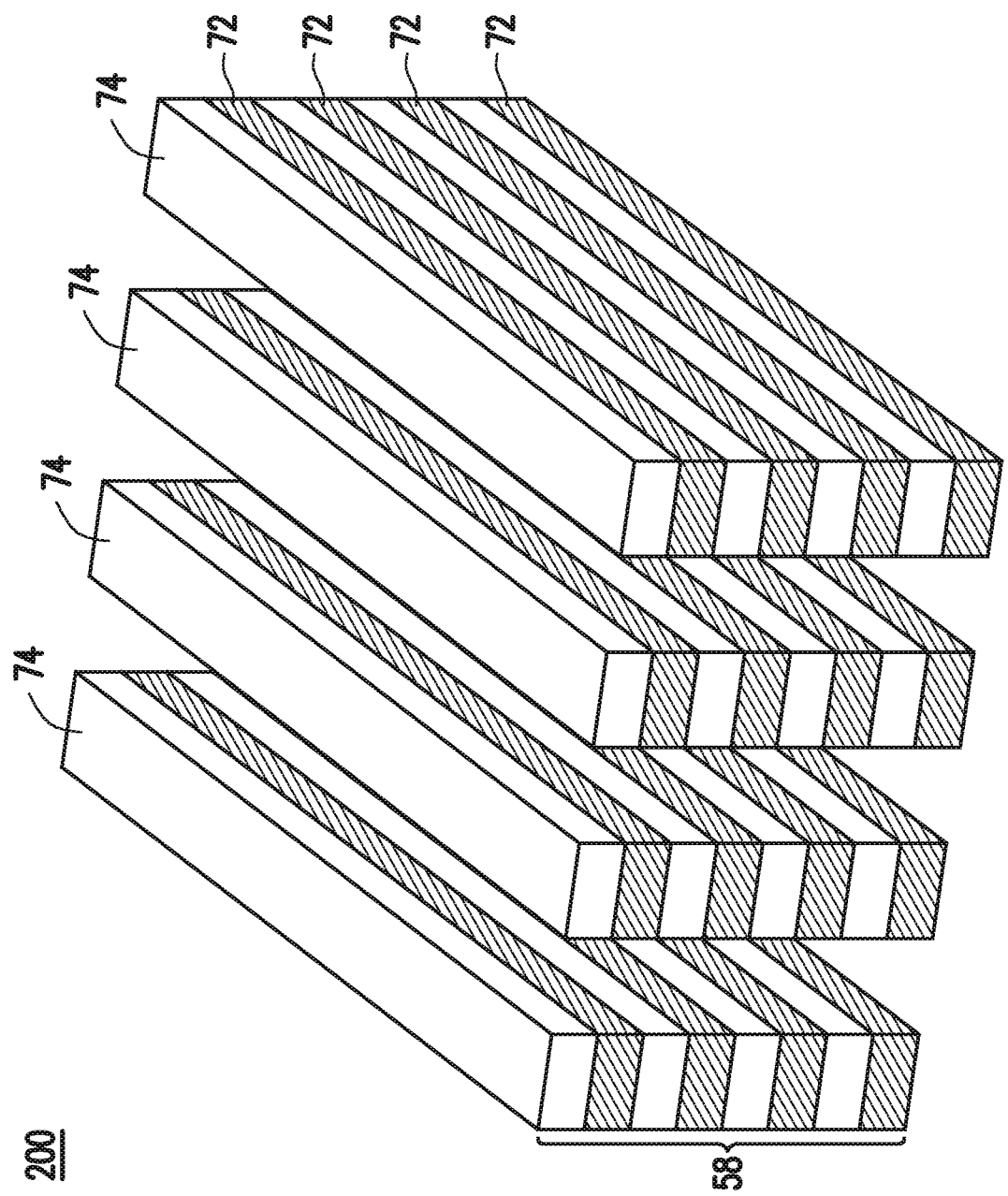

In FIG. 15, a pattern of the photoresist 82 is transferred to the hard mask 80 using an acceptable etching process, such as by wet or dry etching, a reactive ion etch (RIE), neutral beam etch (NBE), the like, or a combination thereof. The etching may be anisotropic. Thus, trenches 86 are formed extending through the hard mask 80. The photoresist 82 may be removed by an ashing process, for example.

In FIG. 16, a pattern of the hard mask 80 is transferred to the multi-layer stack 58 using one or more acceptable etching processes, such as by wet or dry etching, a reactive ion etch (RIE), neutral beam etch (NBE), the like, or a combination thereof. The etching processes may be anisotropic. Thus, trenches 86 extended through the multi-layer stack 58, and the conductive lines 72 (e.g., word lines) are formed from the conductive layers 54. By etching trenches 86 through the conductive layers 54, adjacent conductive lines 72 can be separated from each other. Subsequently, in FIGS. 17A and 17B, the hard mask 80 may then be removed by an acceptable process, such as a wet etching process, a dry etching process, a planarization process, combinations thereof, or the like. Due to the staircase shape of the multi-layered stack 58 (see e.g., FIG. 12), the conductive lines 72 may have varying lengths that increase in a direction towards the substrate 50. For example, the conductive lines 72A may be longer than the conductive lines 72B; the conductive lines 72B may be longer than the conductive lines 72C; and the conductive lines 72C may be longer than the conductive lines 72D. In some embodiments, the trenches 86 may be formed having a width W1 that is in the range of about 50 nm to about 100 nm, though other widths are possible.

In FIG. 18, a dielectric material 98 is deposited on sidewalls and a bottom surface of the trenches 86. The dielectric material 98 may comprise, for example, silicon oxide, silicon nitride, silicon oxynitride, or the like, which may be deposited by CVD, PVD, ALD, PECVD, or the like. As shown in FIG. 18, the dielectric material 98 may fill the trenches 86 and may cover the multi-layer stack 58.

Figure 19A:
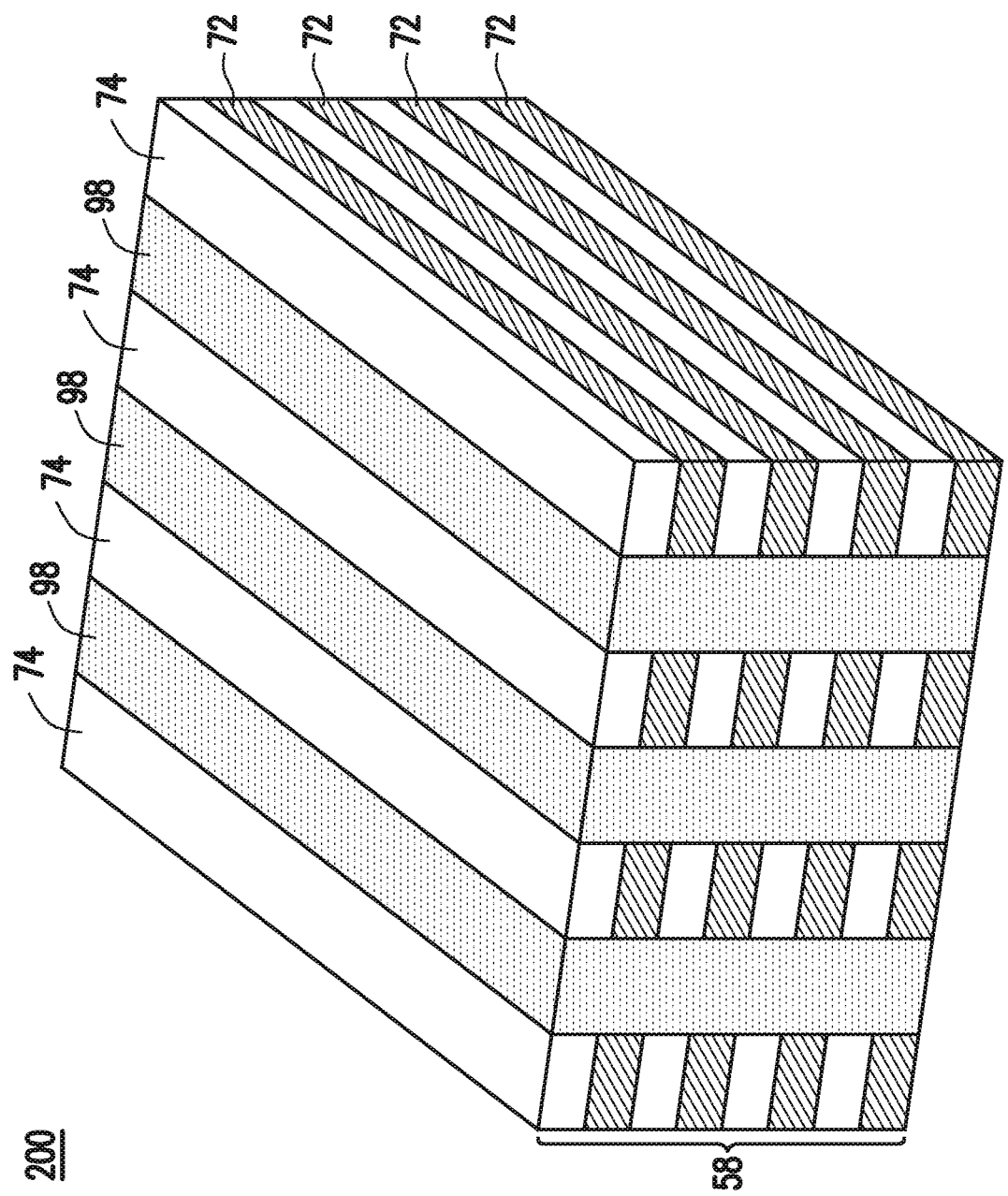

In FIGS. 19A and 19B, a removal process is then to remove excess dielectric material 98 over the multi-layer stack 58. In some embodiments, a planarization process such as a chemical mechanical polish (CMP), a grinding process, an etch-back process, combinations thereof, or the like may be utilized. The planarization process may expose the multi-layer stack 58 such that top surfaces of the multi-layer stack 58 (e.g., top surfaces of the insulating layer 74) are level after the planarization process is complete. FIG. 19A illustrates a three-dimensional view and FIG. 19B illustrates a cross-sectional view through the reference cross-section C-C' shown in FIG. 1A.

Figure 20A:
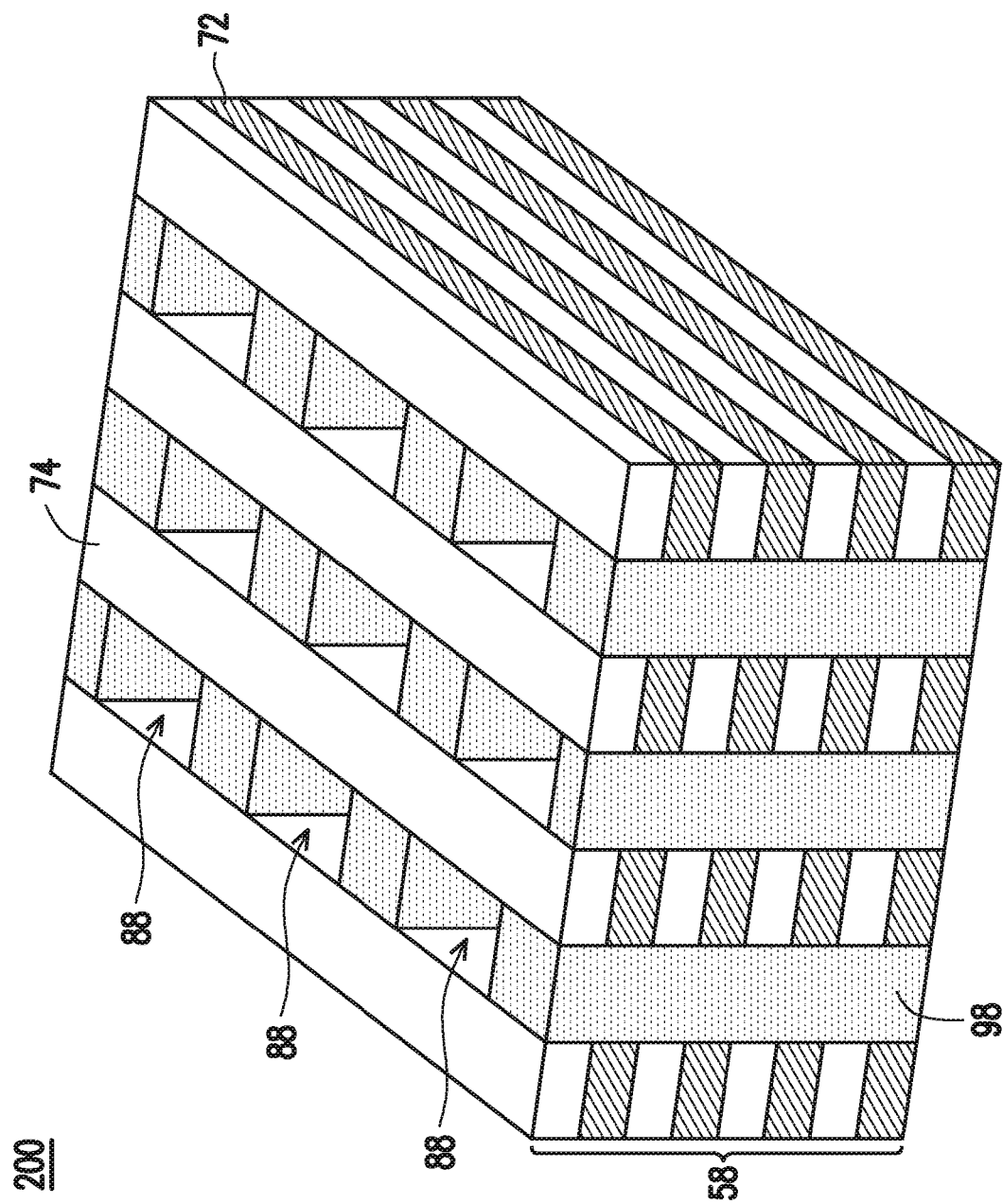
Figure 20B:
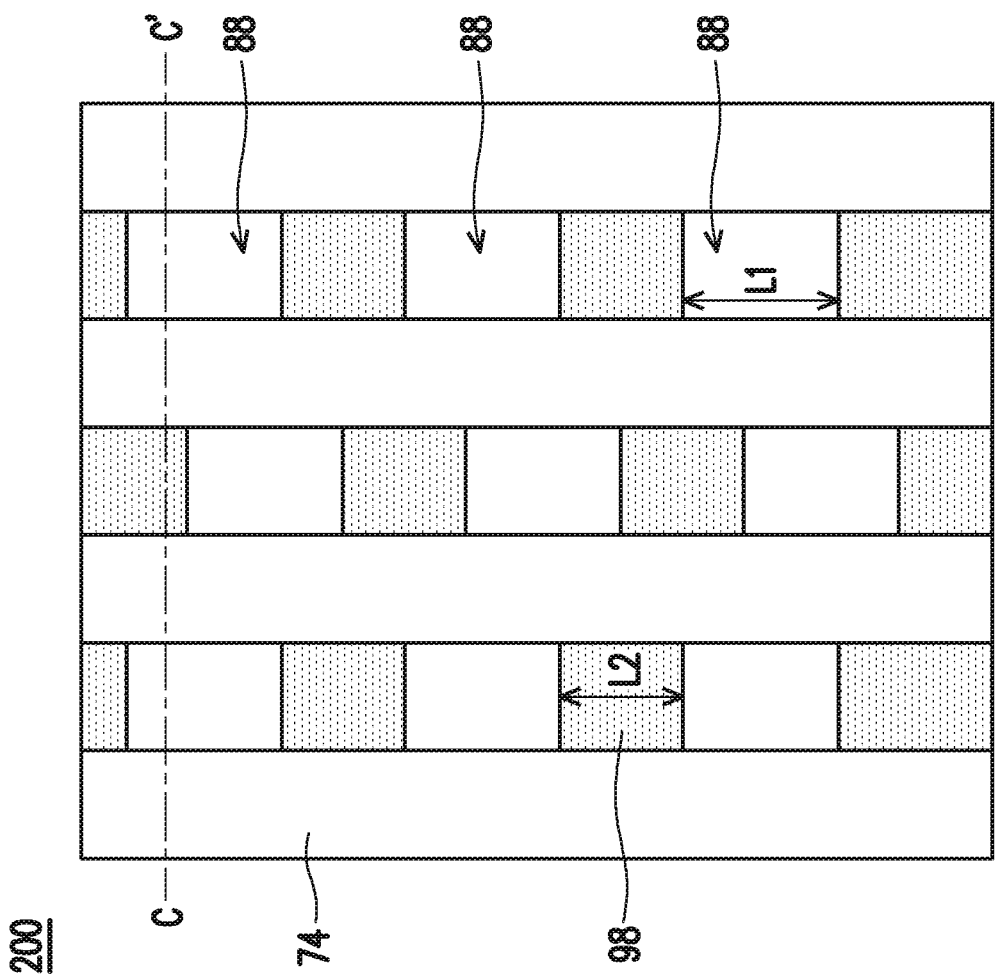

In FIGS. 20A, 20B, and 20C, trenches 88 are patterned through the dielectric material 98. FIG. 20A is illustrated in a three-dimensional view. FIG. 20B is illustrated in a plan view. FIG. 20C is illustrated in a cross-sectional view along reference cross-section C-C' of FIG. 1A. The trenches 88 may be disposed between opposing sidewalls of the multi-layer stack 58, and define regions where portions of the transistors are subsequently formed. Patterning the trenches 88 may be performed through a combination of photolithography and etching, in some embodiments. For example, a photoresist may be deposited over the multi-layer stack 58. The photoresist can be formed by using a suitable technique such as a spin-on technique, for example. The photoresist is then patterned to define openings that expose regions of the dielectric material 98. The photoresist can be patterned using acceptable photolithography techniques. For example, the photoresist may be exposed to light for patterning, and after the exposure process, the photoresist may be developed to remove exposed or unexposed portions of the photoresist depending on whether a negative or positive resist is used, thereby defining the pattern of the openings.

Portions of the dielectric material 98 exposed by the openings may be removed by etching, forming trenches 88 in the dielectric material 98. The etching may be any acceptable etch process, such as by wet or dry etching, a reactive ion etch (RIE), neutral beam etch (NBE), the like, or a combination thereof. The etching may be anisotropic. In some embodiments, the trenches 88 may have a length L1 that is in the range of about 80 nm to about 150 nm, though other dimensions are possible. In some embodiments, the trenches 88 are separated by a distance L2 that is in the range of about 30 nm to about 120 nm, though other distances are possible. In some embodiments, the trenches 88 may have a depth that is in the range of about 1000 nm to about 2000 nm, though other depths are possible. After the trenches 88 are patterned, the photoresist may be removed by ashing, for example. In some cases, the shape of the trenches 88 in plan view may be rectangular as shown in FIG. 20B, or may be a rounded rectangular shape or a rounded shape such as an elliptical or circular shape.

Figure 21:
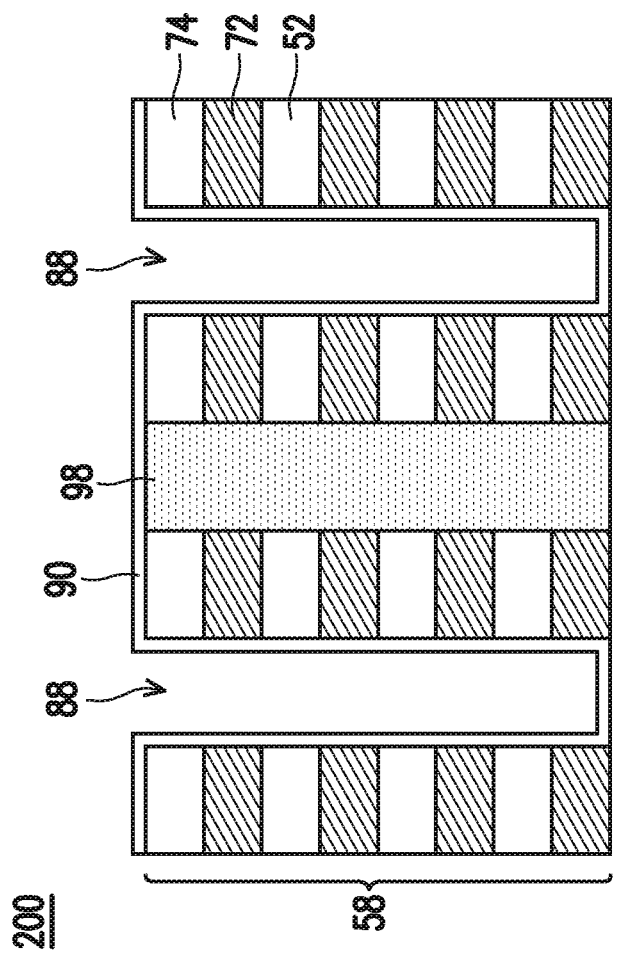

In FIG. 21, a memory film 90 is conformally deposited in the trenches 88. The memory film 90 may comprise a material that is capable of storing a bit, such as material capable of switching between two different polarization directions by applying an appropriate voltage differential across the memory film 90. For example, the polarization of the memory film 90 may change due to an electric field resulting from applying the voltage differential. In some embodiments, the memory film 90 comprises a high-k dielectric material, such as a hafnium (Hf) based dielectric material, or the like. In some embodiments, the memory film 90 comprises a ferroelectric material, such as, hafnium oxide, hafnium zirconium oxide, silicon-doped hafnium oxide, or the like. In other embodiments, the memory film 90 may be a multilayer structure comprising a layer of $SiN_x$ between two $SiO_x$ layers (e.g., an ONO structure). In still other embodiments, the memory film 90 comprises a different ferroelectric material or a different type of memory material. The memory film 90 may be deposited by CVD, PVD, ALD, PECVD, or the like to extend along sidewalls and bottom surfaces of the trenches 88. In some embodiments, after the memory film 90 is deposited, an annealing step may be performed. In some embodiments, the memory film 90 may be deposited to a thickness that is in the range of about 5 nm to about 15 nm, though other thicknesses are possible.

Figure 22:
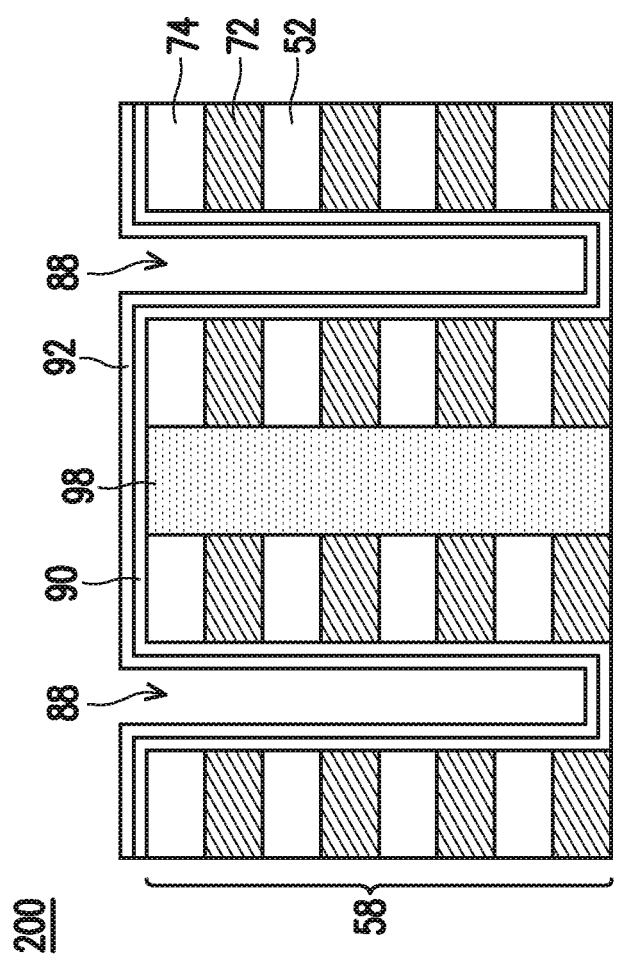

In FIG. 22, the OS layer 92 is conformally deposited in the trenches 88 over the memory film 90. The OS layer 92 comprises a material suitable for providing a channel region for a transistor (e.g., transistors 204, see FIG. 1A). In some embodiments, the OS layer 92 comprises an indium-comprising material, such as $In_xGa_yZn_zMO$, where M may be Ti, Al, Sn, W, or the like. X, Y, and Z may each be any value between 0 and 1. For example, the OS layer 92 may comprise indium gallium zinc oxide, indium titanium oxide, indium tungsten oxide, indium oxide, the like, or combinations thereof. In other embodiments, a different semiconductor material than these examples may be used for the OS layer 92. The OS layer 92 may be deposited by CVD, PVD, ALD, PECVD, or the like. The OS layer 92 may extend along sidewalls and along bottom surfaces of the memory film 90 within the trenches 88. In some embodiments, after the OS layer 92 is deposited, an annealing step (e.g., at a temperature range of about 300° C. to about 450° C.) in oxygen-related ambient may be performed to activate the charge carriers of the OS layer 92. In some embodiments, the OS layer 92 may be deposited to a thickness that is in the range of about 1 nm to about 15 nm, though other thicknesses are possible.

Figure 23A:
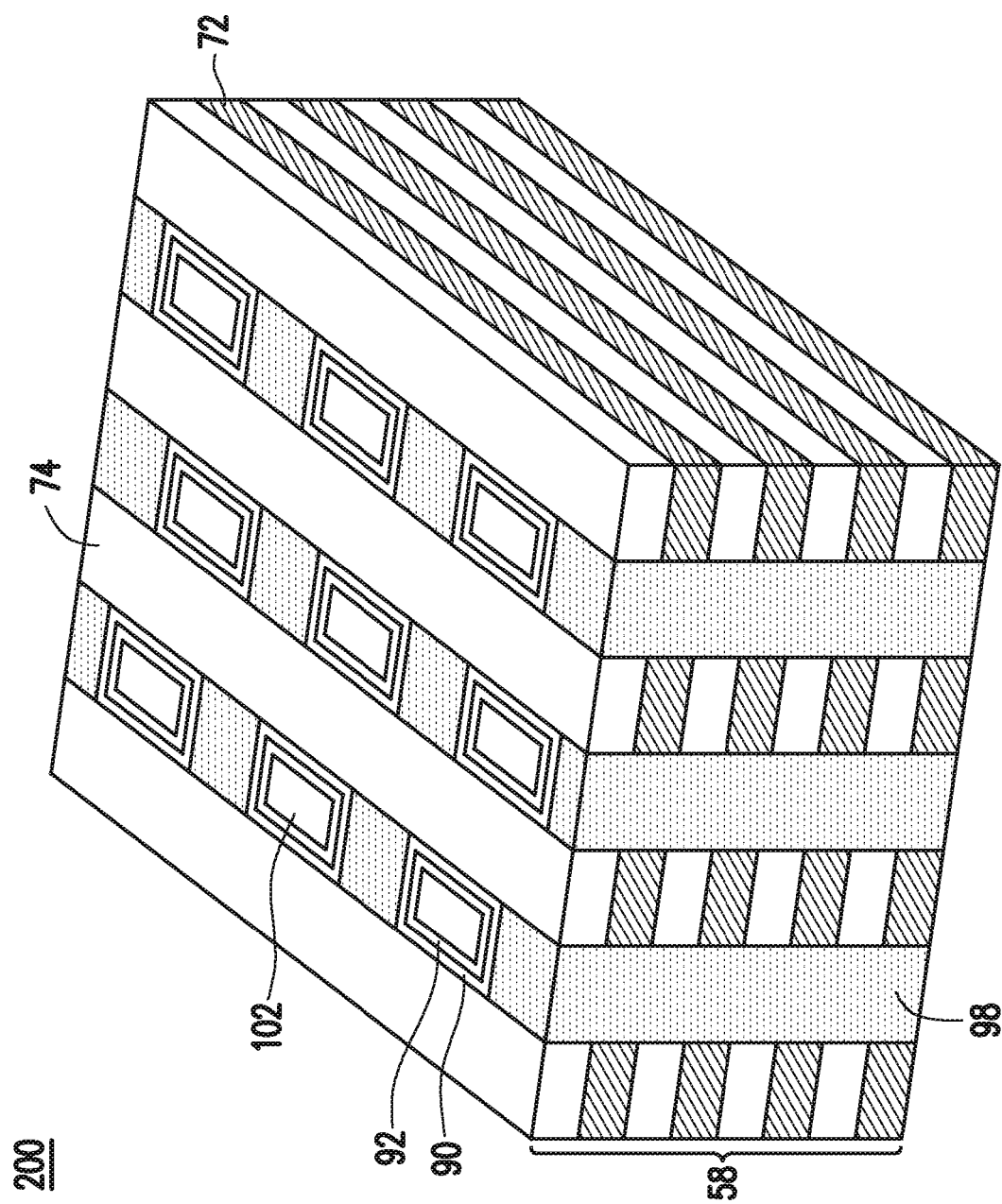
Figure 23B:
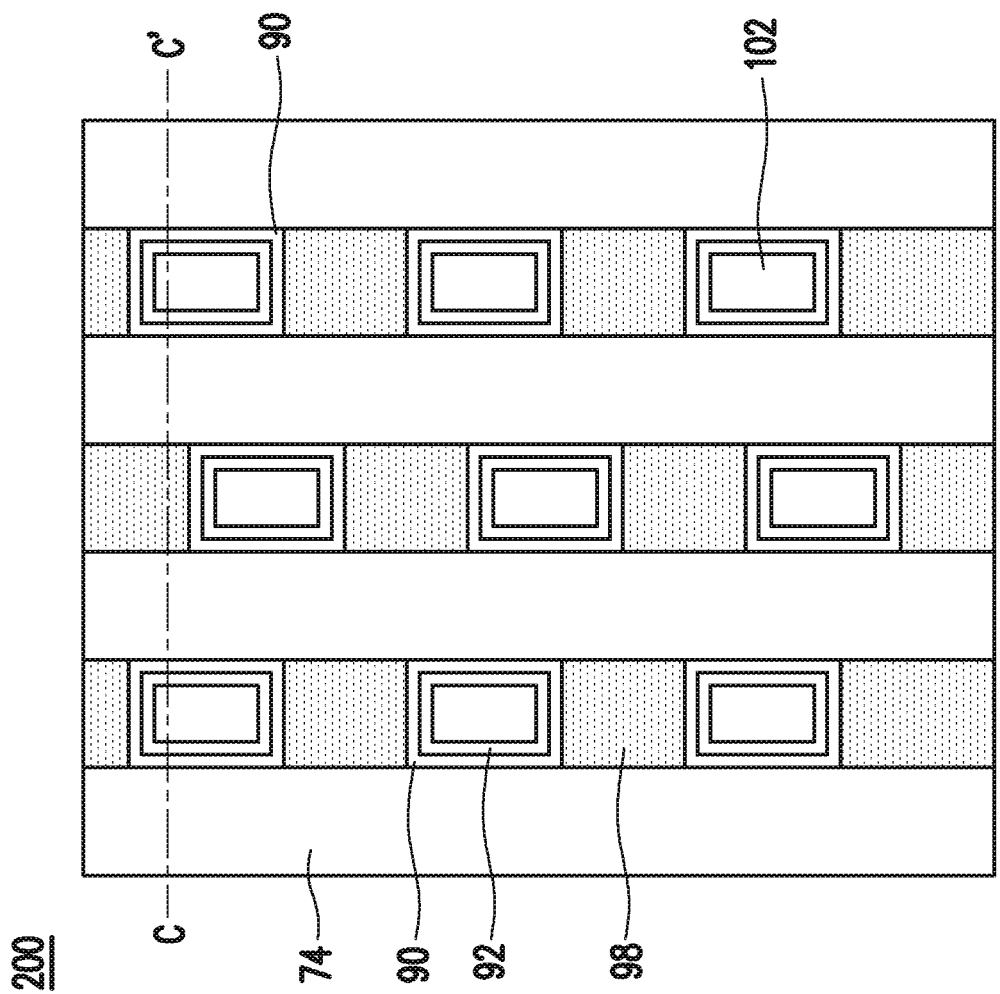
Figure 23C:
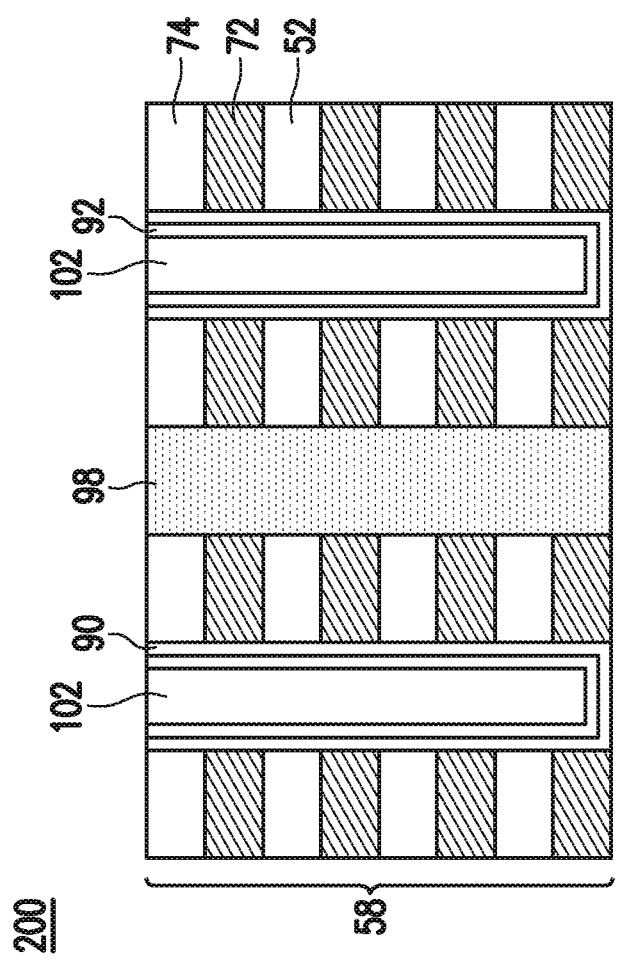

In FIGS. 23A, 23B, and 23C, a dielectric material 102 is deposited over the OS layer 92 and fills the trenches 88, in accordance with some embodiments. FIG. 23C illustrates a cross-sectional view of line C-C' in FIG. 23B. The dielectric material 102 may comprise, for example, silicon oxide, silicon nitride, silicon oxynitride, the like, or combinations thereof. The material of the dielectric material 102 may be the same as or different from the material of the dielectric material 98. The dielectric material 102 may be deposited using a suitable technique, such as CVD, PVD, ALD, PECVD, or the like. The dielectric material 102 may extend along sidewalls and along bottom surfaces of the OS layer 92 within the trenches 88. After deposition, a planarization process (e.g., a CMP, etch back, or the like) may be performed to remove excess portions of the dielectric material 102. In the resulting structure, top surfaces of the multi-layer stack 58, the memory film 90, the OS layer 92, and the dielectric material 102 may be substantially level.

Figure 24A:
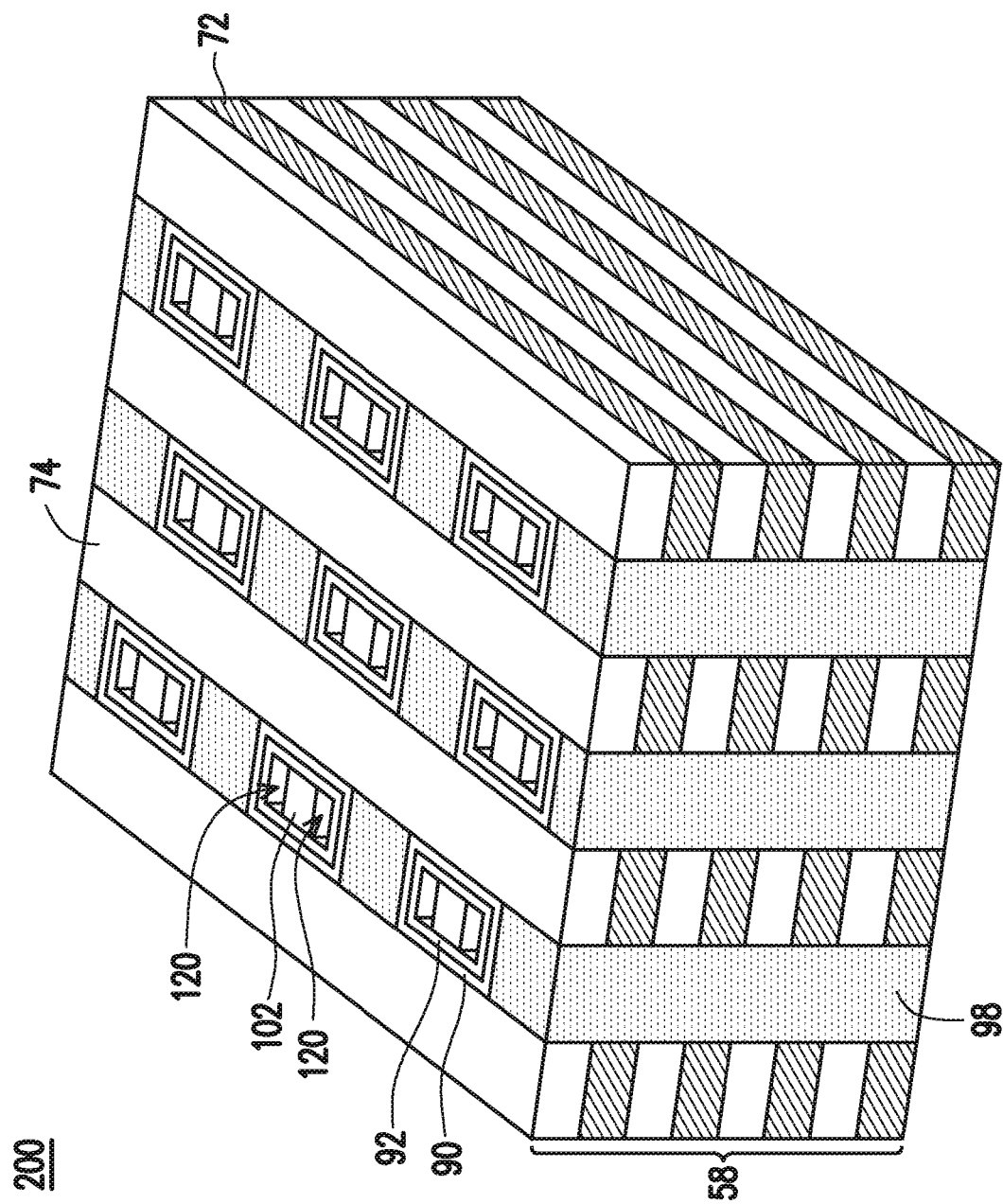
Figure 24B:
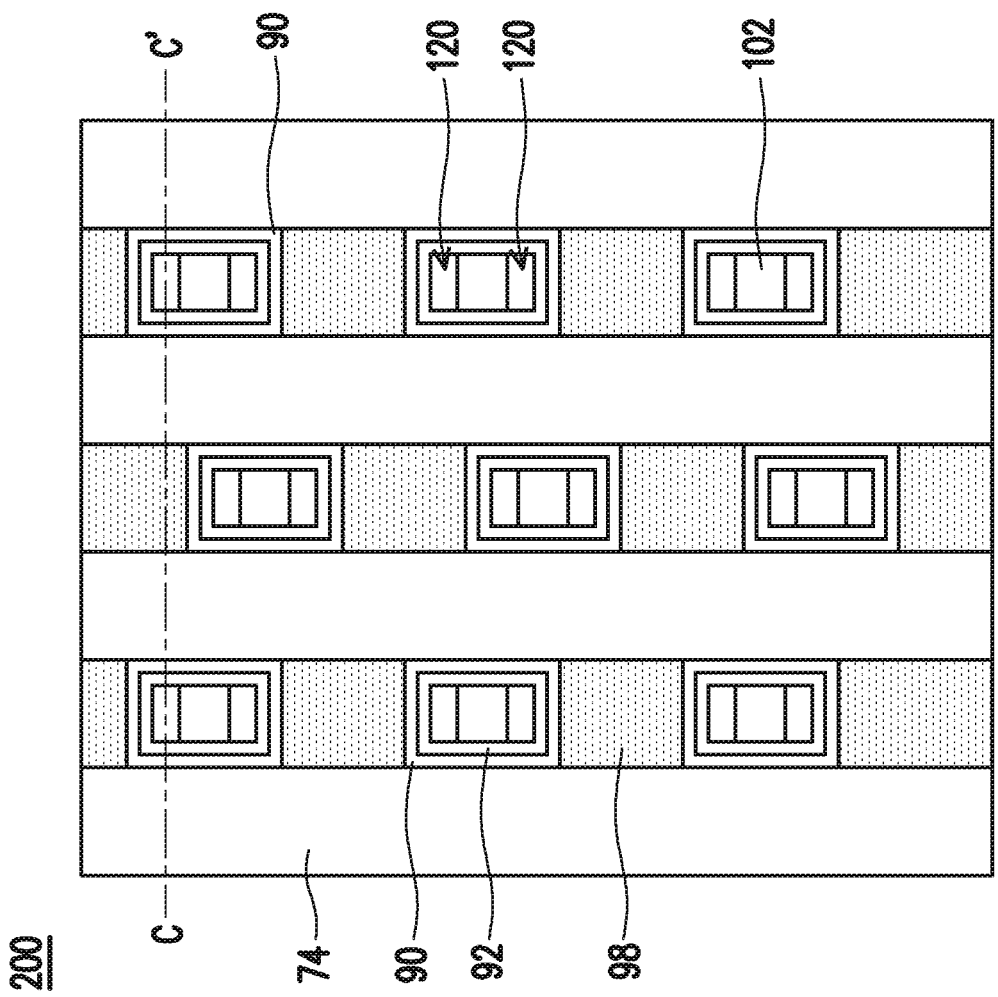
Figure 24C:
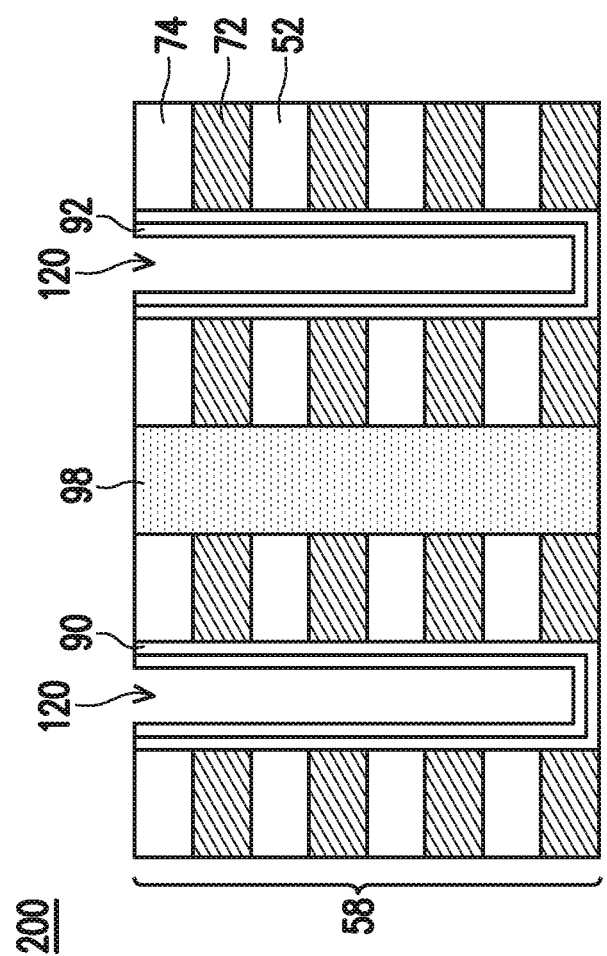
Figure 25A:
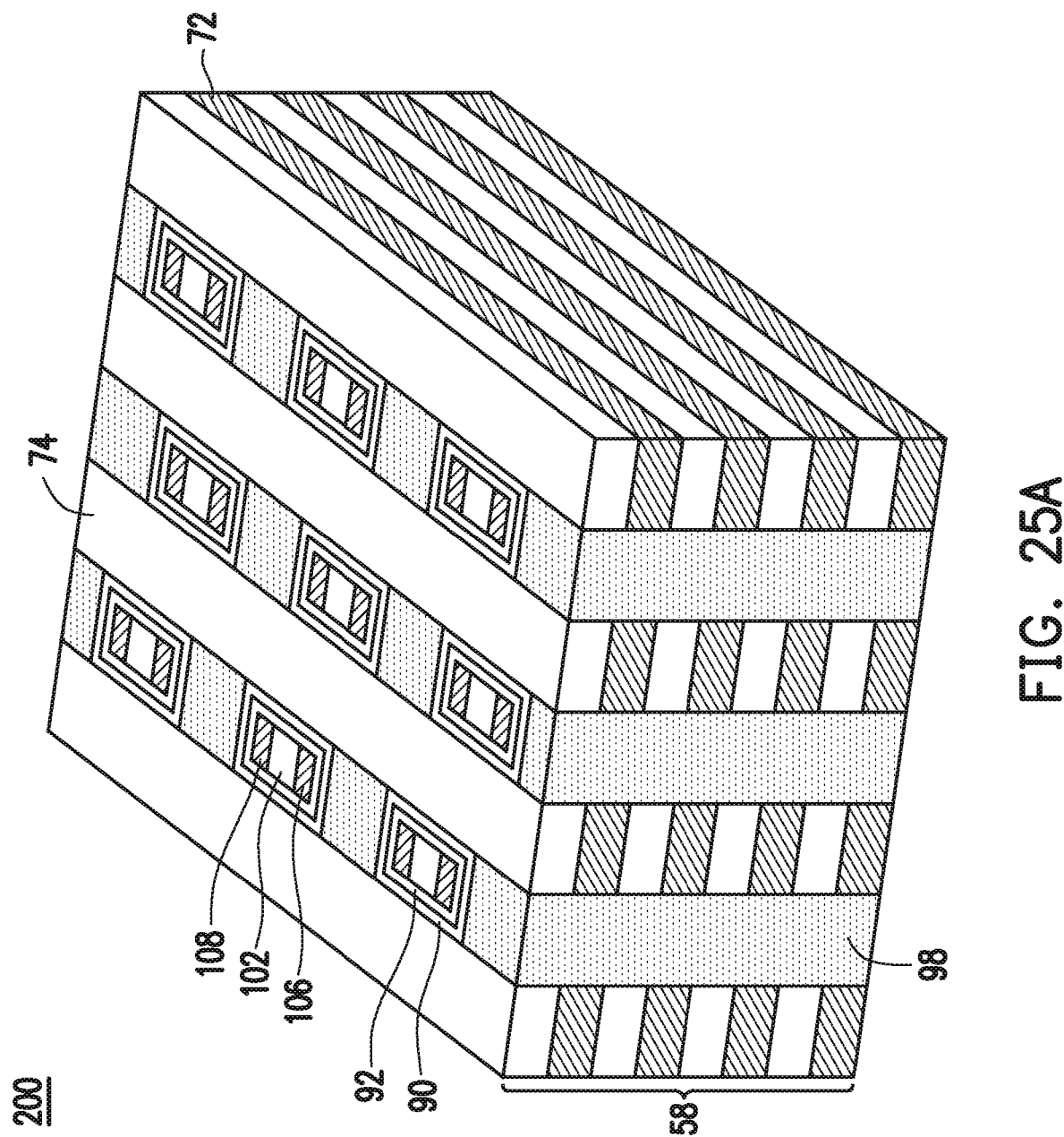
Figure 25B:
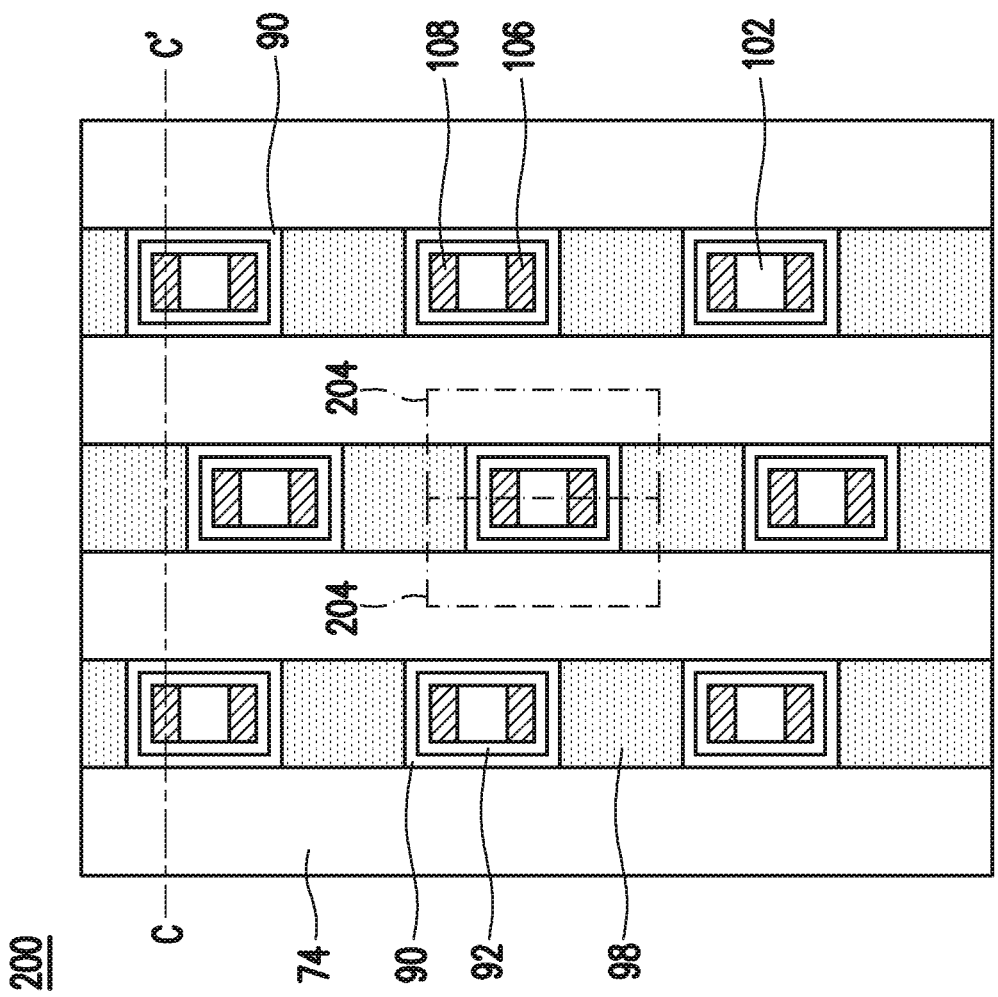
Figure 25C:
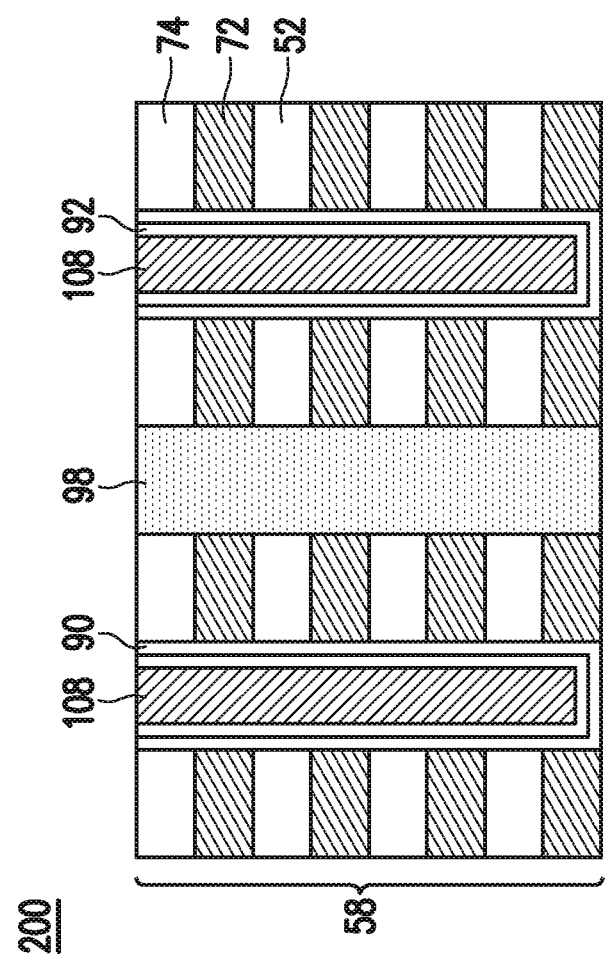

FIGS. 24A through 25C illustrate intermediate steps of manufacturing conductive lines 106 and 108 (e.g., source lines and bit lines) in the memory array 200. The conductive lines 106 and 108 may extend along a direction perpendicular to the conductive lines 72 such that individual cells of the memory array 200 may be selected for read and write operations. FIGS. 24A and 25A illustrate a three-dimensional view. FIGS. 24B and 25B illustrate a top down view. FIGS. 24C and 25C illustrate cross-sectional views along the reference cross-section C-C' shown in FIG. 1A and in, for example, FIG. 25B.

In FIGS. 24A, 24B, and 24C, trenches 120 are patterned in the dielectric material 102, in accordance with some embodiments. The trenches 120 are patterned by patterning the dielectric material 102 using a combination of photolithography and etching. For example, a photoresist may be deposited over the multi-layer stack 58, the dielectric material 98, the OS layer 92, and the memory film 90, and the dielectric material 102. The photoresist can be formed by using a spin-on technique, for example. The photoresist is patterned to define openings. Each of the openings may overlap corresponding regions of dielectric material 102. The openings do not completely overlap the dielectric material 102, and the portions of the dielectric material 102 that the openings do not overlap define isolation regions between adjacent conductive lines 106 and conductive lines 108. The photoresist can be patterned using acceptable photolithography techniques. For example, the photoresist be exposed to light for patterning. After the exposure process, the photoresist may be developed to remove exposed or unexposed portions of the photoresist depending on whether a negative or positive resist is used, thereby defining the openings.

Portions of the dielectric material 102 exposed by the openings may be removed by etching, forming trenches 120. The etching may be any acceptable etch process, such as by wet or dry etching, a reactive ion etch (RIE), neutral beam etch (NBE), the like, or a combination thereof. The etching may be anisotropic. In this way, the trenches 120 may define a pattern of regions where conductive lines 106 and conductive lines 108 are formed. FIG. 24C shows an embodiment in which the OS layer 92 is left remaining over the memory film 90 after forming the trenches 120. In other embodiments, the etching may remove sidewall portions and/or bottom portions of the OS layer 92, which may expose the memory film 90. After the trenches 120 are patterned, the photoresist may be removed by ashing, for example. In some cases, the shape of the trenches 120 in plan view may be rectangular as shown in FIG. 24B, or may be a rounded rectangular shape or a rounded shape such as an elliptical or circular shape.

In FIGS. 25A, 25B, and 25C the trenches 120 are filled with a conductive material, forming conductive lines 106 and conductive lines 108, in accordance with some embodiments. The conductive material may comprise one or more materials such as copper, titanium, titanium nitride, tantalum, tantalum nitride, tungsten, ruthenium, aluminum, molybdenum, combinations thereof, or the like, which may be each formed using, for example, CVD, ALD, PVD, PECVD, or the like. After the conductive material is deposited, a planarization process may be performed to remove excess portions of the conductive material. In the resulting structure, top surfaces of the multi-layer stack 58, the memory film 90, the OS layer 92, the insulating layer 74, and the conductive lines 106/108 may be substantially level (e.g., coplanar within process variations).

The conductive lines 106 may correspond to bit lines in the memory array, and the conductive lines 108 may correspond to source lines in the memory array 200. Although FIG. 25C illustrates a cross-sectional view that only shows the conductive lines 108, a cross-sectional view of the conductive lines 106 may be similar. Adjacent conductive lines 106 and conductive lines 108 are separated by an isolation region formed from the dielectric material 102.

In this manner, stacked transistors 204 may be formed in the memory array 200. Each transistor 204 comprises a gate electrode (e.g., a portion of a corresponding conductive line 72), a gate dielectric (e.g., a portion of a corresponding memory film 90), a channel region (e.g., a portion of a corresponding OS layer 92), and source and drain electrodes (e.g., portions of corresponding conductive lines 106 and 108). The dielectric material 102 isolates adjacent transistors 204 in a same column and at a same vertical level. The transistors 204 may be disposed in an array of vertically stacked rows and columns.

FIGS. 26A through 30 illustrate intermediate steps of manufacturing air gaps 132 between conductive lines 72, in accordance with some embodiments. The air gaps 132 are formed between vertically adjacent conductive lines 72 by removing the sacrificial layers 52, described in greater detail below. By replacing the sacrificial layers 52 with the air gaps 132, the capacitance between conductive lines 72 can be reduced, which can improve the speed and performance of the transistors, particularly at higher operational frequencies. In the process described in FIGS. 26 through 30, multiple air gaps 132 are formed using the same process steps. In other embodiments, the air gaps 132 may be formed sequentially by repeating similar process steps for forming each air gap 132.

Figure 26A:
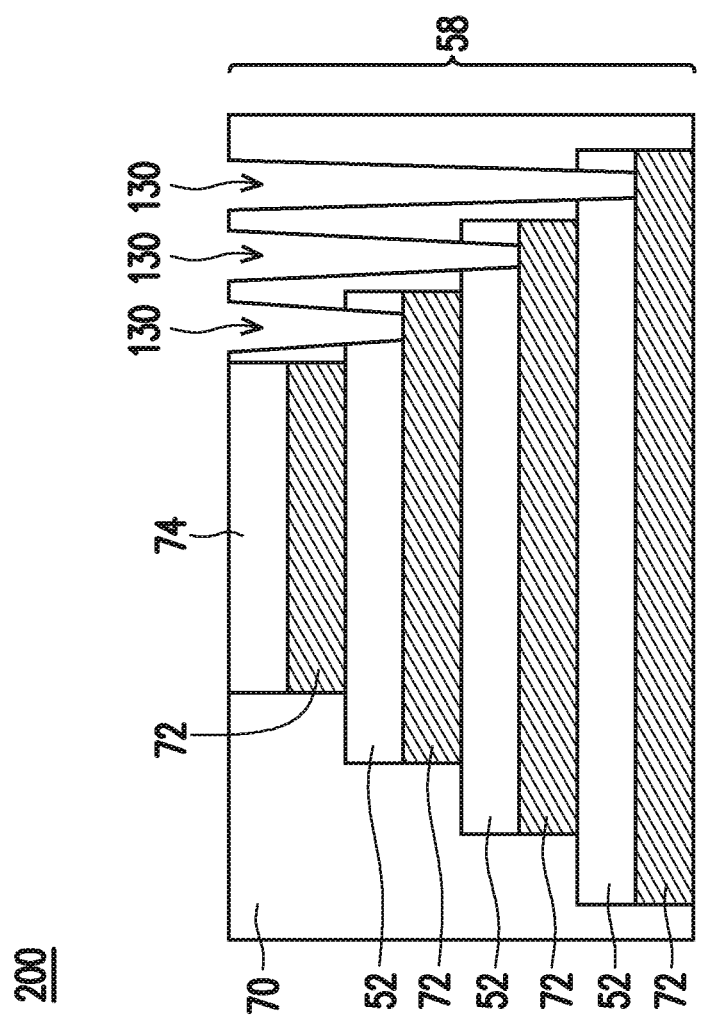
Figure 26B:
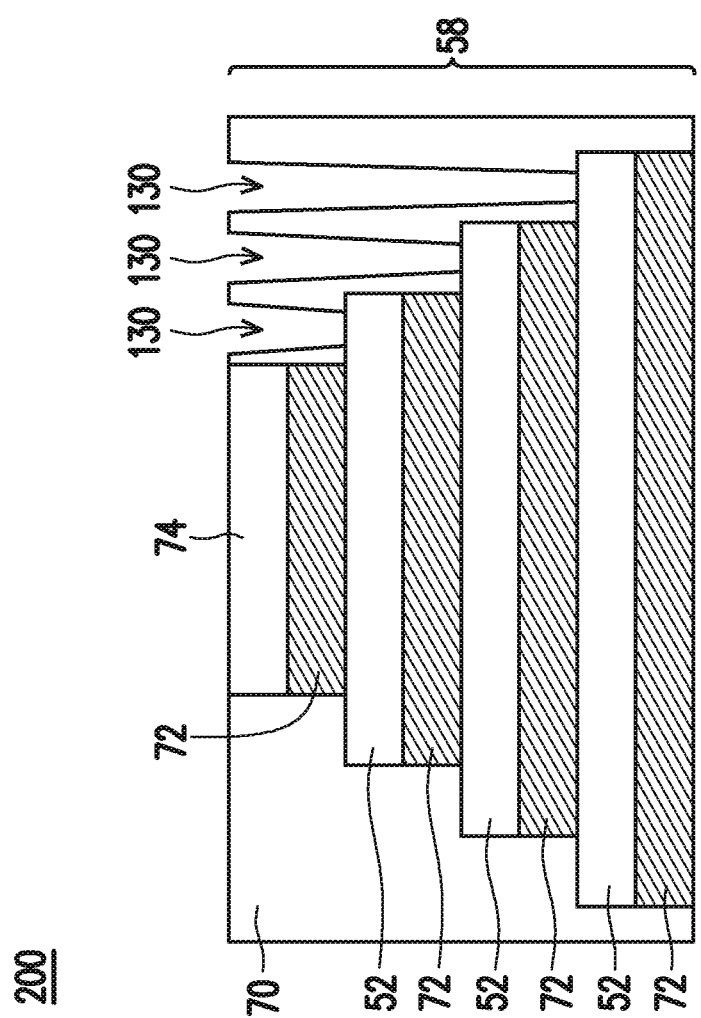

In FIGS. 26A-B, trenches 130 are formed to expose the sacrificial layers 52. The trenches 130 allow for removal of the sacrificial layers 52, formation of the seals 140 (see FIG. 28), and formation of the contacts 110. In some embodiments, the trenches 130 may extend through the sacrificial layers 52 to expose the underlying conductive lines 72, as shown in FIG. 26A. In other embodiments, the trenches 130 may expose the sacrificial layers 52 without exposing the conductive lines 72. For example, the trenches 130 may expose the top surfaces of the sacrificial layers 52, as shown in FIG. 26B. The trenches 130 may be formed to expose one region of each sacrificial layer 52, as shown in FIGS. 26A-B, or multiple regions of a sacrificial layer 52 may be exposed by multiple trenches 130. An example of trenches 130 being formed on both ends of each sacrificial layer 52 is shown below in FIG. 33.

The trenches 130 may be formed by patterning openings in the IMD 70 using a combination of photolithography and etching. As an example, a photoresist may be deposited over the multi-layer stack 58, and the IMD 70. The photoresist can be formed by using a spin-on technique, for example. The photoresist is patterned using acceptable photolithography techniques to define the openings. For example, the photoresist be exposed to light for patterning. After the exposure process, the photoresist may be developed to remove exposed or unexposed portions of the photoresist depending on whether a negative or positive resist is used, thereby defining the openings.

Portions of the IMD 70 exposed by the openings may be removed by etching, forming trenches 130. The etching may be any acceptable etch process, such as by wet or dry etching, a reactive ion etch (RIE), neutral beam etch (NBE), the like, or a combination thereof. The etching may be anisotropic. In some embodiments, the openings in the IMD 70 may be extended through the sacrificial layers 52 to form trenches 130 that expose the conductive lines 72, as shown in FIG. 26A. In these embodiments, the IMD 70 and the sacrificial layers 52 may be etched using the same etching steps or different etching steps. For example, the IMD 70 may be etched using a first etching process, and the sacrificial layers 52 may be etched using a second etching process that is different from the first etching process. In some embodiments, the second etching process may also remove the sacrificial layers 52 to form the air gaps 132, described in greater detail below. In some embodiments, the second etching process may selectively etch the sacrificial layers 52. After the trenches 130 are patterned, the photoresist may be removed by ashing, for example.

Figure 27:
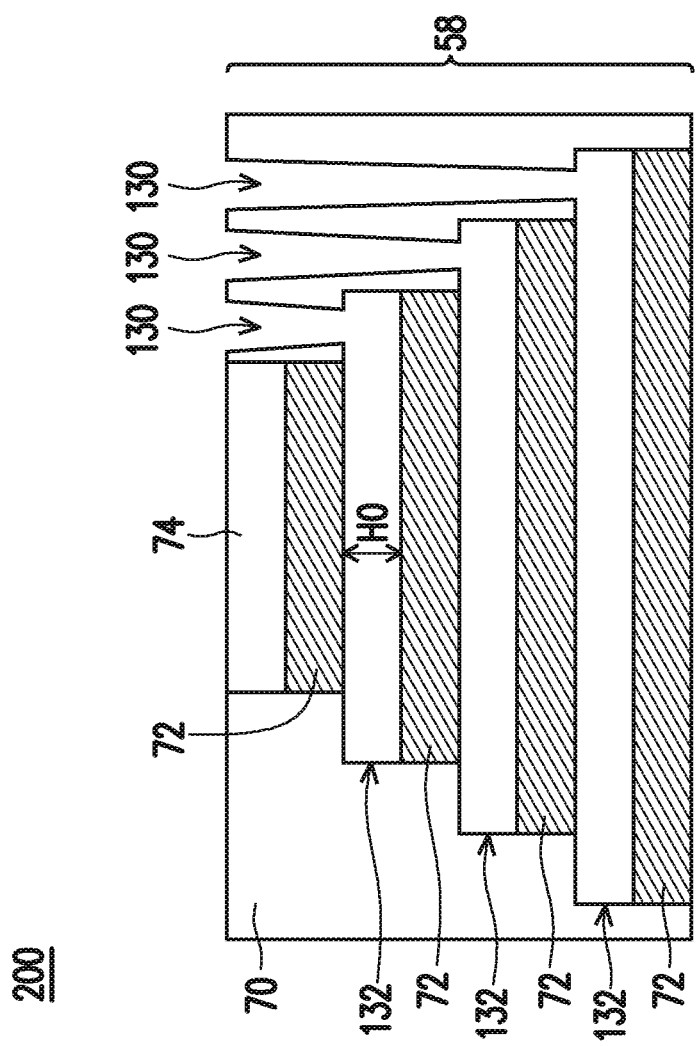

In FIG. 27, the sacrificial layers 52 are removed using an etching process, forming air gaps 132 between the conductive lines 54, in accordance with some embodiments. In some embodiments, the etching process that removes the sacrificial layers 52 may be performed as part of the formation of the trenches 130, as described above. In other words, the etching process that removes the sacrificial layers 52 may be performed during formation of the trenches 130 or after formation of the trenches 130. The etching process that removes the sacrificial layers 52 may be performed before or after removal of the photoresist used to pattern the trenches 130. In some embodiments, the air gaps 132 are formed having a height H0 that is in the range of about 20 nm to about 80 nm. Other heights are possible. The height H0 of an air gap 132 may be about the same as the thickness T0 of the corresponding sacrificial layer 52. In some embodiments, the height of an air gap 132 varies along its length, described in greater detail below for FIG. 35. The air gaps 132 of the may all have about the same height, or two or more of the air gaps 132 may have different heights.

The etching process that removes the sacrificial layers 52 may include one or more dry etching processes and/or one or more wet etching processes. The trenches 130 allow the etchants (e.g., process gases, plasma, wet etchants, etc.) of the etching process to reach and etch exposed surfaces of the sacrificial layers 52. In some embodiments, the plasma etching process uses process gases such as $O_2$, $CF_4$, $CHF_3$, $C_4F_8$, $BCl_3$, $CCl_4$, $Cl_2$, $SF_6$, HBr, $H_2$ combinations thereof, or the like. Other process gases are possible. In some embodiments, the process gases are flowed at a rate in the range from about 5 sccm to about 50 sccm. In some embodiments, the plasma etching process is performed at a process temperature in the range of about 200° C. to about 450° C., and at a process pressure in the range of about 0.1 mTorr to about 100 mTorr. In some embodiments, the plasma etching process is performed using a plasma power in the range from about 50 W to about 500 W, and is performed using a bias power in the range from about 50 W to about 500 W. Other dry etching processes or process parameters are possible.

In some embodiments, the wet etching process includes an etchant such as diluted hydrofluoric acid (dHF); a potassium hydroxide (KOH) solution; ammonia ($NH_4OH$); a solution comprising HF, nitric acid ($HNO_3$), and/or acetic acid (CH3COOH); combinations thereof; or the like. Other etchants are possible. The wet etching process may be conducted in a suitable manner such as by immersion in the etchant for a duration of time (e.g., less than one hour, or the like). Other wet etching processes are possible. In some embodiments, the sacrificial layers 52 are removed by performing a dry etching process and then performing a wet etching process. In some embodiments, a wet cleaning process is performed after removing the sacrificial layers 52.

Figure 28:
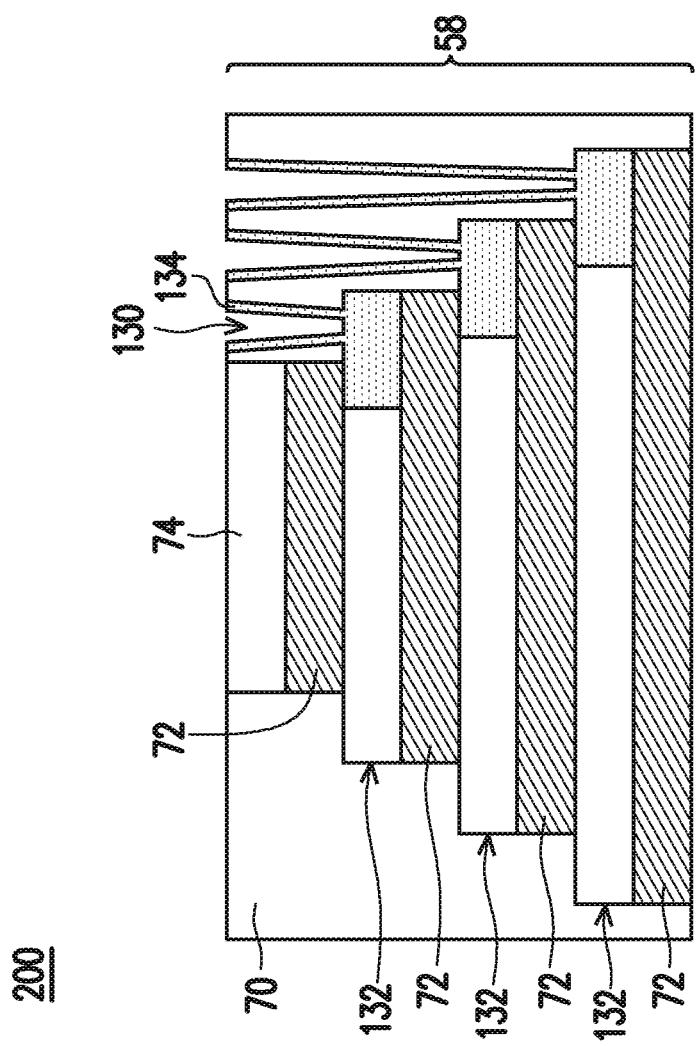

In FIG. 28, the air gaps 132 are at least partially filled with a seal material 134, in accordance with some embodiments. The seal material 134 is deposited to extend partially into the air gaps 132, sealing the air gaps 132. Sealing the air gaps 132 in this manner protects the air gaps 132 from being filled during subsequent processing steps and provides additional structural support. Additionally, sealing the air gaps 132 isolates the air gaps 132 from the subsequently formed contacts 110, described below. FIG. 28 shows the seal material 134 as partially filling the trenches 130, but in other embodiments the seal material 134 completely fills the trenches 130. In some embodiments, the seal material 134 is deposited to a thickness sufficient to seal the air gaps 132 but does not fill the trenches 130. In some cases, the seal material 134 may be present on sidewalls of the trenches 130 without filling the trenches 130, as shown in FIG. 28. The seal material 134 may extend along sidewalls and along bottom surfaces of the trenches 130. The seal material may extend on surfaces of the IMD 70 and/or on surfaces of conductive lines 72 that were exposed by the removal of the sacrificial layers 52. The relative thicknesses or amounts of the seal material 134 deposited within the air gaps 132 and within the trenches 130 may be different than shown in FIG. 28, and variations thereof are considered within the scope of the present disclosure. The portions of the seal material 134 extending into the air gaps 132 may have a substantially flat sidewall as shown in FIG. 28, may have a concave sidewall, or may have a convex sidewall, as shown and described below for FIG. 33. In some cases, the seal material 134 may contain voids (not shown in the figures).

The seal material 134 may comprise, for example, silicon oxide, silicon nitride, silicon oxynitride, the like, or combinations thereof. The material of the seal material 134 may be the same as or different from the material of the IMD 70. The seal material 134 may be deposited using a suitable technique, such as CVD, PVD, ALD, PECVD, or the like. For example, in some embodiments, the seal material 134 may be silicon oxide deposited using a PECVD process. For precursors, the PECVD process may use, for example, dichorosilane, silane, oxygen, combinations thereof, or the like. In some embodiments, the precursors of the PECVD process are flowed at a rate in the range of about 5 sccm to about 50 sccm. In some embodiments, the PECVD process is performed at a process temperature in the range of about 150° C. to about 350° C., and at a process pressure in the range of about 0.1 mTorr to about 100 mTorr. In some embodiments, the PECVD process is performed using a plasma power in the range of about 5 W to about 500 W. This is an example, and other process parameters, materials, combinations of materials, or deposition processes are possible.

Figure 29:
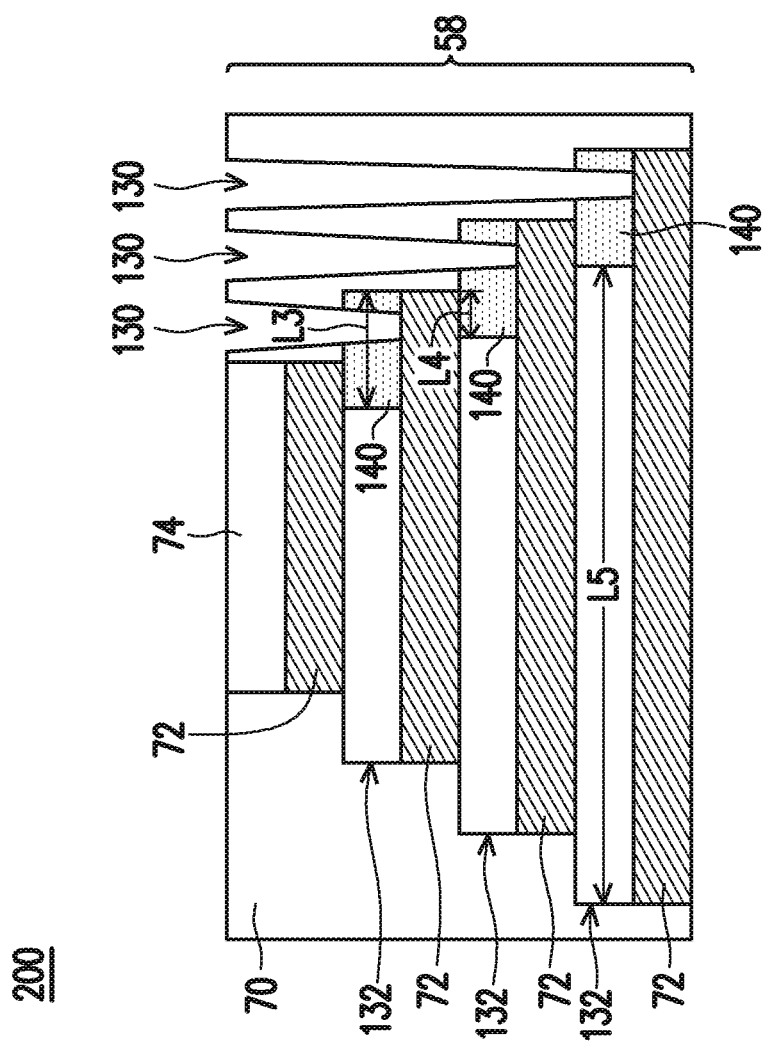

In FIG. 29, an etching process is performed to remove excess portions of the seal material 134 and form seals 140, in accordance with some embodiments. The seals 140 comprise the portions of the seal material 134 that remain after performing the etching process. The etching process may, for example, remove portions of seal material 134 from sidewalls and/or bottom surfaces of the trenches 130. In some embodiments, the etching process removes portions of the seal material 134 such that underlying conductive lines 72 are exposed. The etching process may include a dry etching process, a wet etching process, or a combination thereof. For example, the etching process may include an anisotropic dry etching process. In some embodiments, the etching process may include a process similar to an etching process described previously for etching the trenches 130 or for removing the sacrificial layers 52, though another etching process may be used in other embodiments.

In some embodiments, a seal 140 may have a total length L3 that is in the range of about 500 nm to about 1000 nm. In some embodiments, the length L3 of an air gap 132 may be between about 5% and about 80% of the length of the overlying conductive line 72 or may be between about 5% and about 80% of the length of the underlying conductive line 72. In some embodiments, the length L3 of a seal 140 may be between about 5% and about 80% of the length of the corresponding removed sacrificial layer 52. In some embodiments, a seal 140 may protrude underneath an overlying conductive line 72 a distance L4 that is in the range of about 250 nm to about 500 nm. Other lengths are possible.

In some embodiments, after forming the seals 140, an air gap 132 may have a length L5 that is in the range of about 30 μm to about 100 μm. Other lengths are possible. In some embodiments, the length L5 of an air gap 132 may be between about 20% and about 90% of the length of the overlying conductive line 72 or may be between about 20% and about 90% of the length of the underlying conductive line 72. In some embodiments, the volume of an air gap 132 may be between about 20% and about 90% of the volume of the overlying conductive line 72 or may be between about 20% and about 90% of the volume of the underlying conductive line 72. In some embodiments, the length L5 of an air gap 132 may be between about 20% and about 90% of the length of the corresponding removed sacrificial layer 52.

In some embodiments, different seals 140 may have the same lengths L3 or L4, or may have different lengths L3 or L4. Forming seals 140 having relatively shorter lengths L3 or L4 can allow for air gaps 132 having relatively longer lengths L5. In some embodiments, the lengths L3 or L4 of the seals 140 can be controlled by controlling the parameters of the process used to deposit the seal material 134. In some cases, forming longer air gaps 132 may allow for more reduced parasitic capacitance between the conductive lines 72, and may thereby improve device performance.

Figure 30:
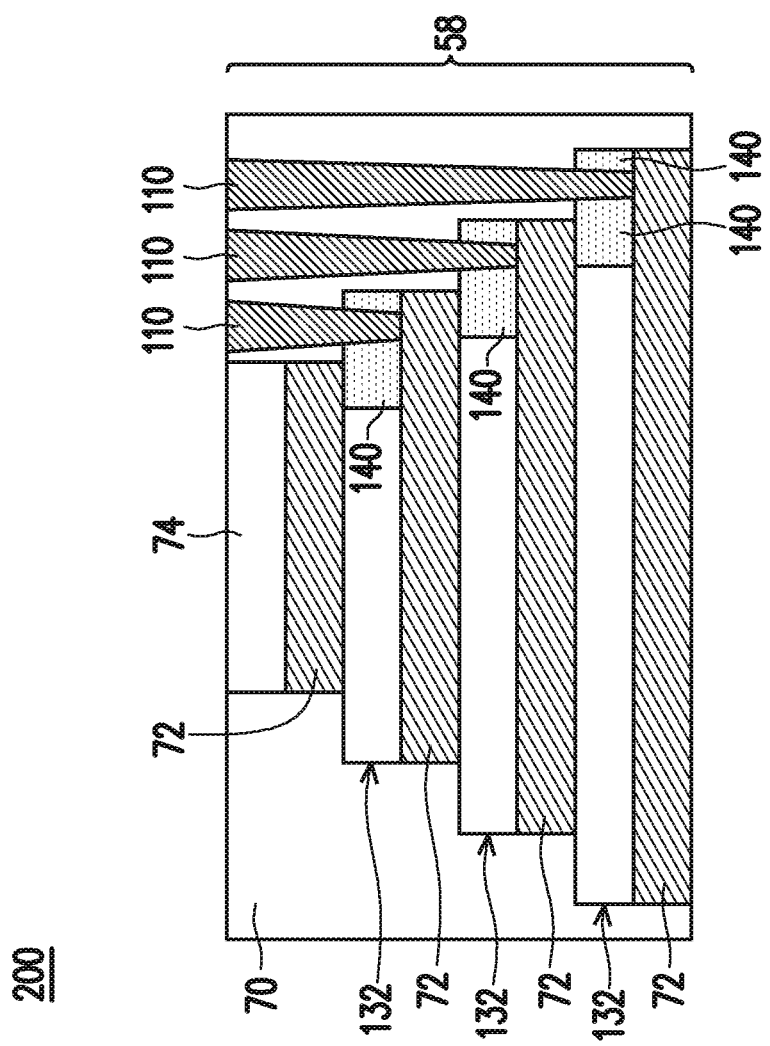

In FIG. 30, contacts 110 are formed in the trenches 130, in accordance with some embodiments. In some embodiments, the staircase shape of the conductive lines 72 may provide a surface on each of the conductive lines 72 for the contacts 110 to make electrical contact to. In some embodiments, a liner (not shown), such as a diffusion barrier layer, an adhesion layer, or the like, and a conductive material are formed in the trenches 130 to form the contacts 110. The liner may include titanium, titanium nitride, tantalum, tantalum nitride, combinations thereof, or the like. The conductive material may comprise copper, a copper alloy, silver, gold, tungsten, cobalt, aluminum, nickel, combinations thereof, or the like. A planarization process, such as a CMP, may be performed to remove excess material from the surface of the IMD 70 and the multi-layer stack 58. The remaining liner and conductive material in the trenches 130 form the contacts 110.

Figure 31A:
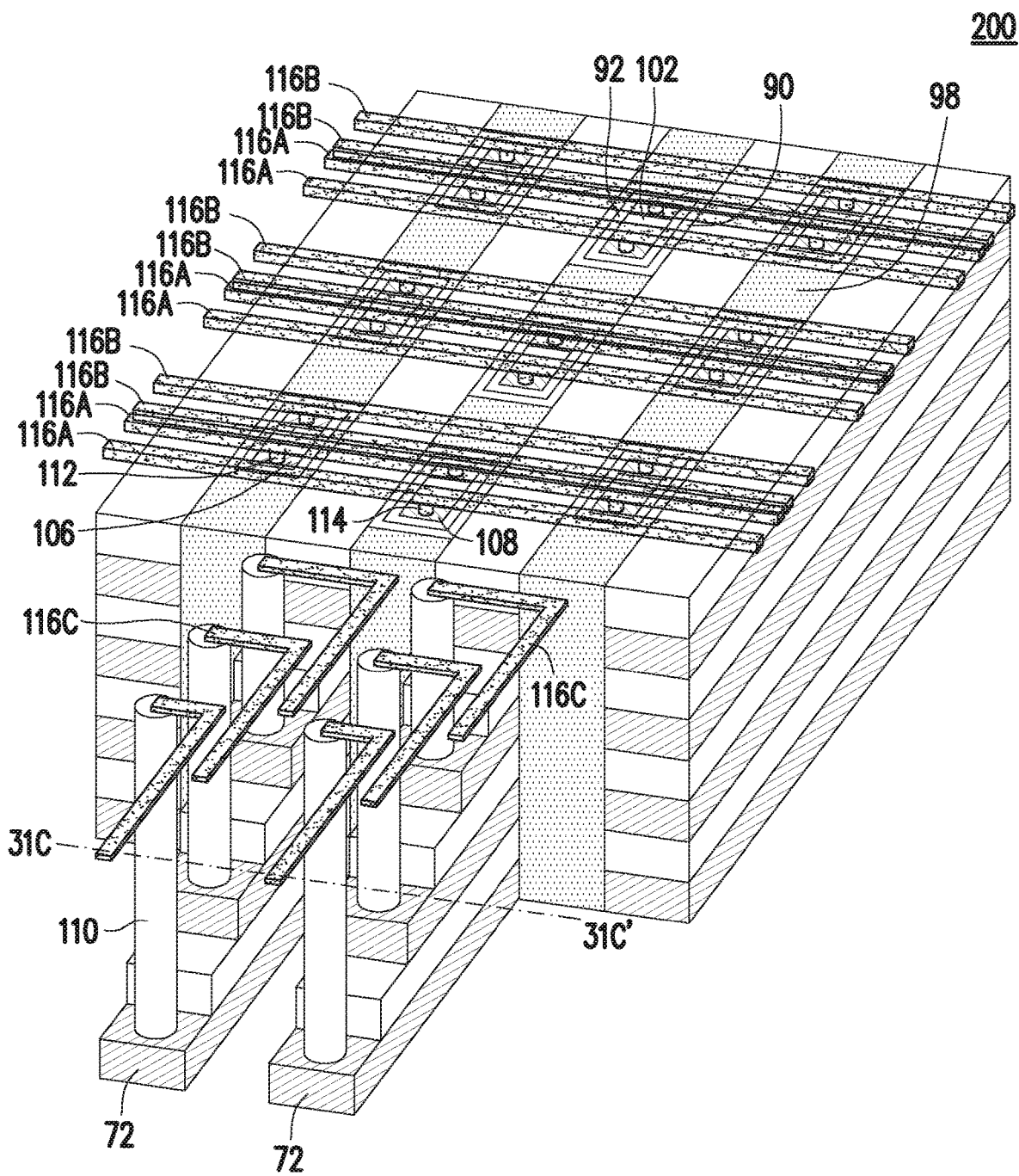
Figure 31B:
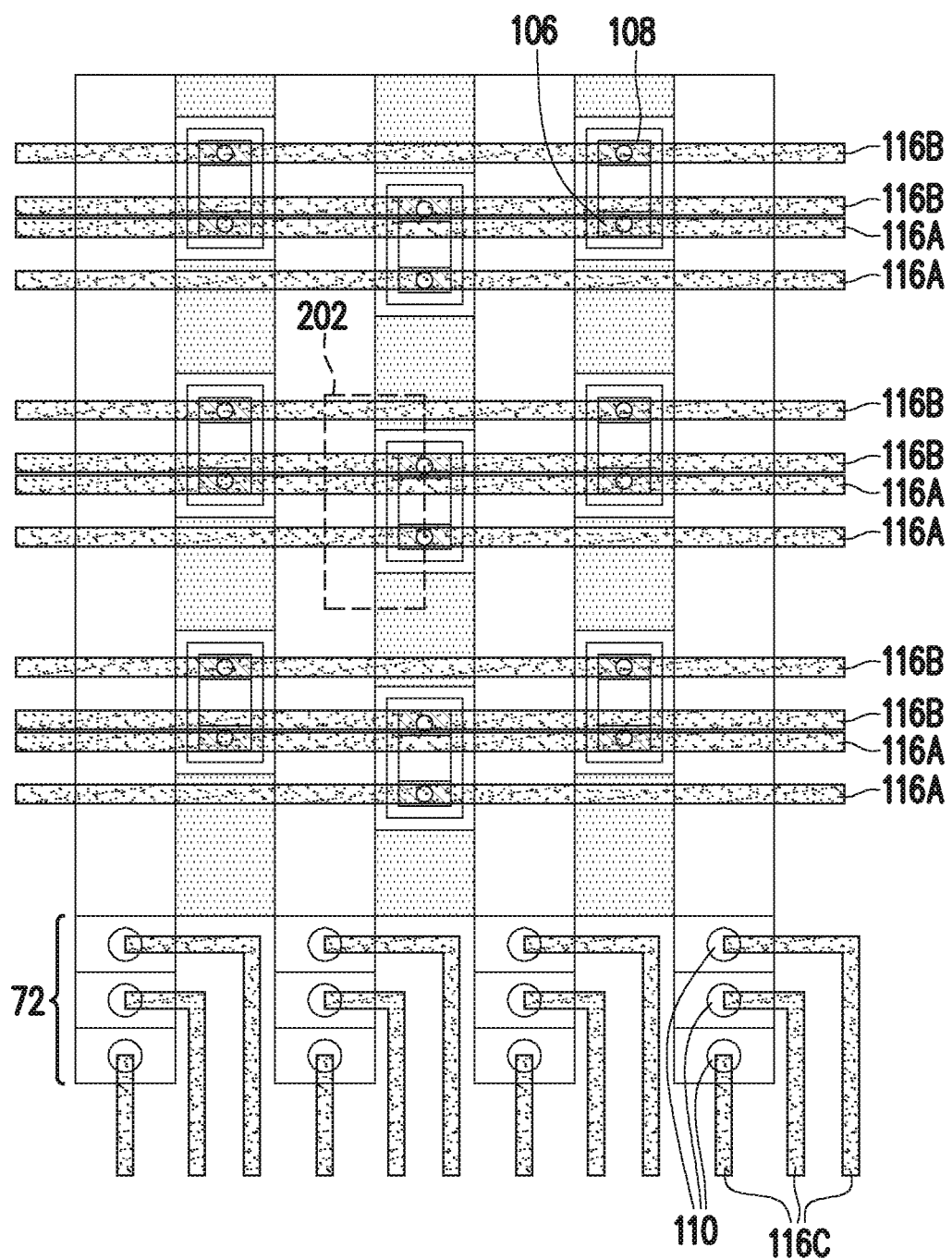
Figure 31C:
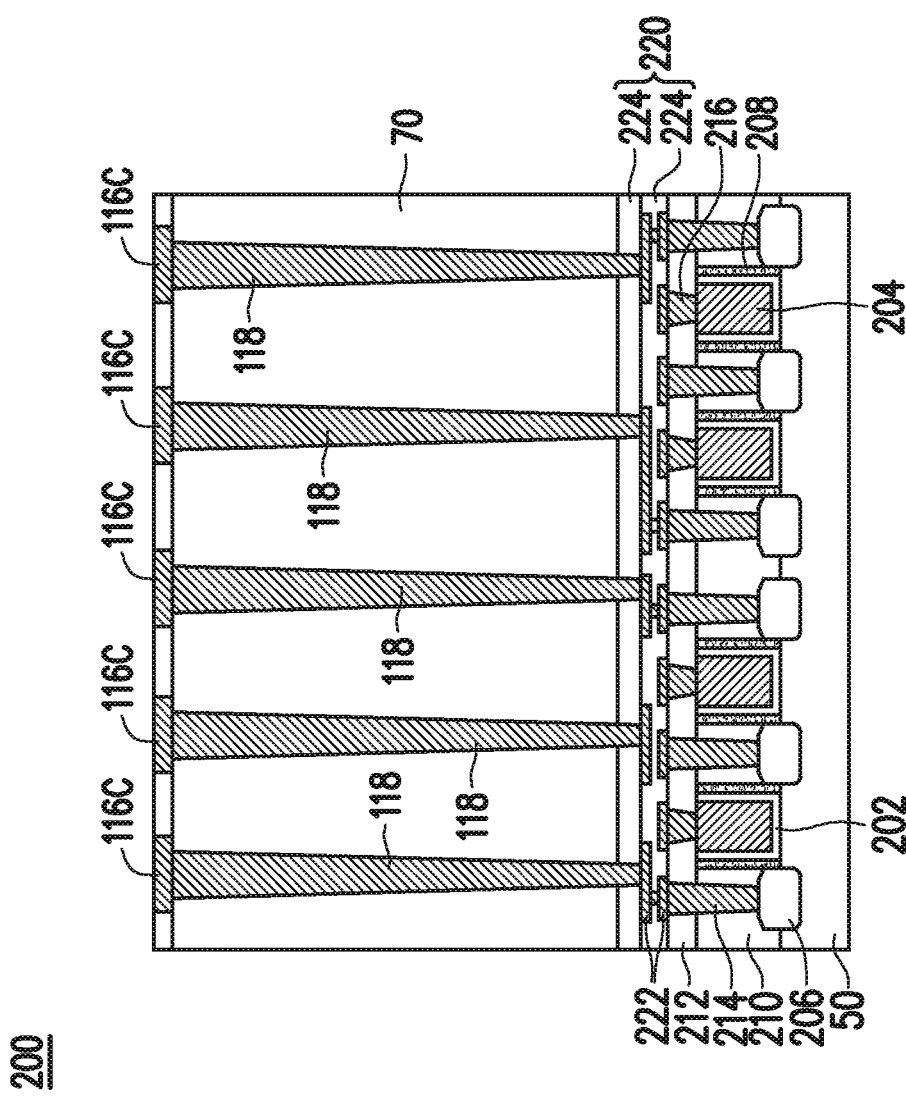
Figure 31D:
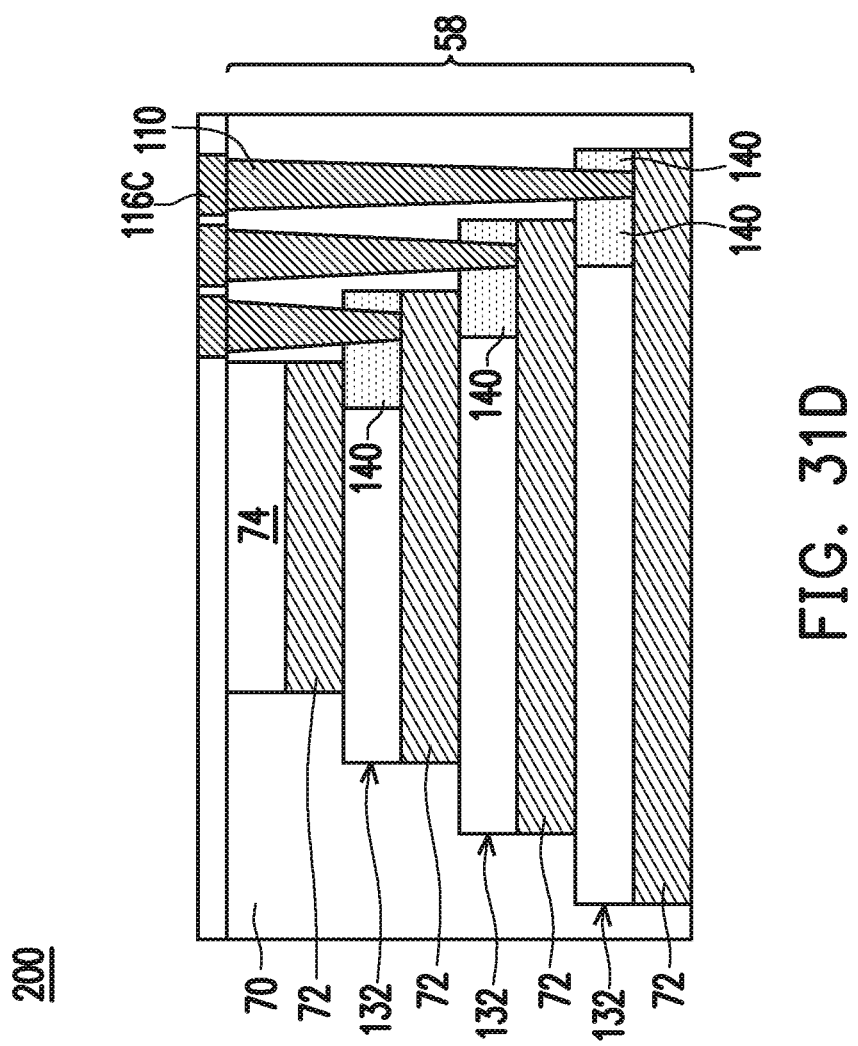

Turning to FIGS. 31A, 31B, 31C, and 31D, contacts 110 may also be formed on the conductive lines 106 and the conductive lines 108. FIG. 31A illustrates a perspective view of the memory array 200; FIG. 31B illustrates a top-down view of the memory array 200; and FIG. 31C illustrates a cross-sectional view of the device and underlying substrate alone the line 31C'-31C' of FIG. 31A; and FIG. 31D illustrates a cross-sectional view of the device along reference cross-section B-B' of FIG. 1A.

As illustrated by the perspective view of FIG. 31A, conductive contacts 112 and 114 may also be made to the conductive lines 106 and the conductive lines 108, respectively. The conductive contacts 110, 112, and 114 may be electrically connected to conductive lines 116A, 116B, and 116C, respectively, which connect the memory array to an underlying/overlying circuitry (e.g., control circuitry) and/or signal, power, and ground lines in the semiconductor die. For example, conductive vias 118 may extend through the IMD 70 to electrically connect conductive lines 116C to the underlying circuitry of the interconnect structure 220 and the active devices on the substrate 50 as illustrated by FIG. 31C. Other conductive vias may be formed through the IMD 70 to electrically connect the conductive lines 116A and 116B to the underlying circuitry of the interconnect structure 220. In alternate embodiments, routing and/or power lines to and from the memory array may be provided by an interconnect structure formed over the memory array 200 in addition to or in lieu of the interconnect structure 220. Accordingly, the memory array 200 may be completed.

Although the embodiments of FIGS. 2 through 31B illustrate a particular pattern for the conductive lines 106 and 108, other configurations are also possible. For example, in these embodiments, the conductive lines 106/108 have a staggered pattern. In some embodiments, the conductive lines 106/108 that are in a same row of the array are all aligned with each other.

Figure 32:
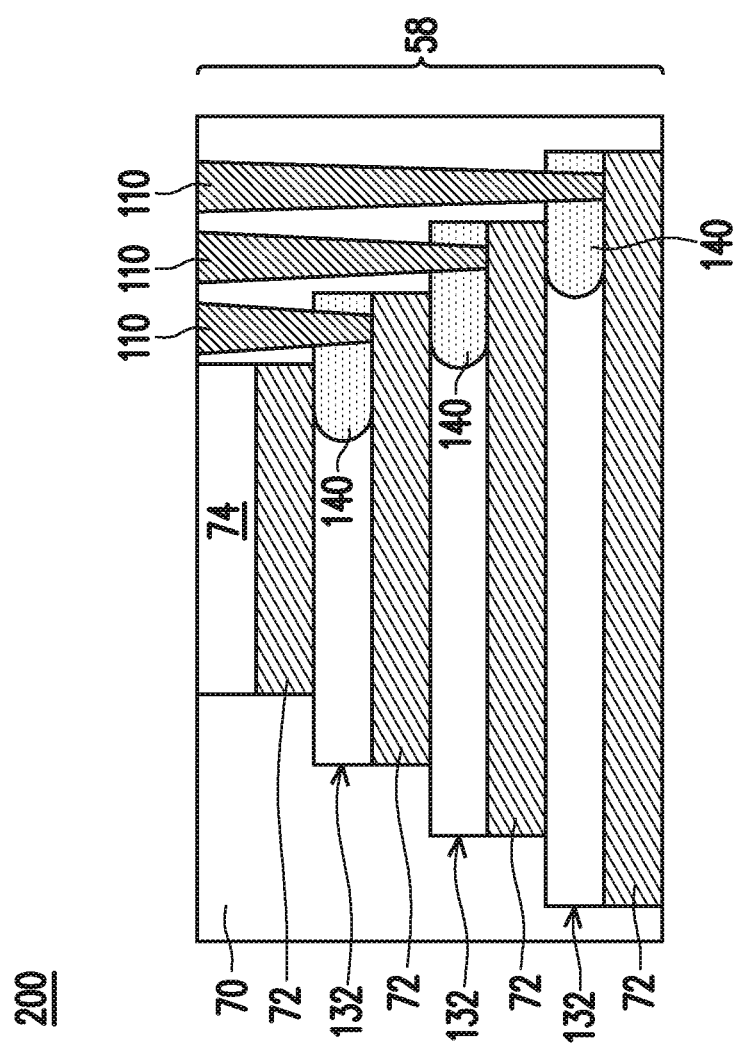
FIGS. 32, 33, and 34 illustrate cross-sectional views of intermediate steps in the manufacture of a memory array, in accordance with some embodiments.

FIG. 32 illustrates a cross-sectional view of an intermediate step in the manufacture of a memory array 200, in accordance with some embodiments. The structure shown in FIG. 32 is similar to the structure shown in FIG. 30, except that the sidewalls of the seals 140 protruding into the air gaps 132 have a substantially convex shape instead of a substantially flat shape. In some cases, one or more precursors that form the seal material 134 during deposition are less likely to adhere to a metal surface than to a dielectric surface. For example, the precursors may be less likely to adhere to the metal material of the conductive lines 72 than to the oxide material of the IMD 70. This can cause slowed or delayed deposition of the seal material 134 on the conductive lines 72, which can result in the seal material 134 forming a convex sidewall as the seal material 134 is formed within the air gaps 132. Once the air gap 132 is fully sealed by the seal material 134, no further precursors can enter the air gap 132 and the convex sidewall of the seal material 134 remains. In some cases, the slowed or delayed deposition of the seal material 134 on the conductive lines 72 as described can limit the distance the seal material 134 extends into the air gaps 132. By limiting or reducing the protrusion of the seals 140 into the air gaps 132 in this manner, air gaps 132 may be formed having relatively longer lengths L5, which can result in reduced parasitic capacitance between conductive lines 72.

Figure 33:
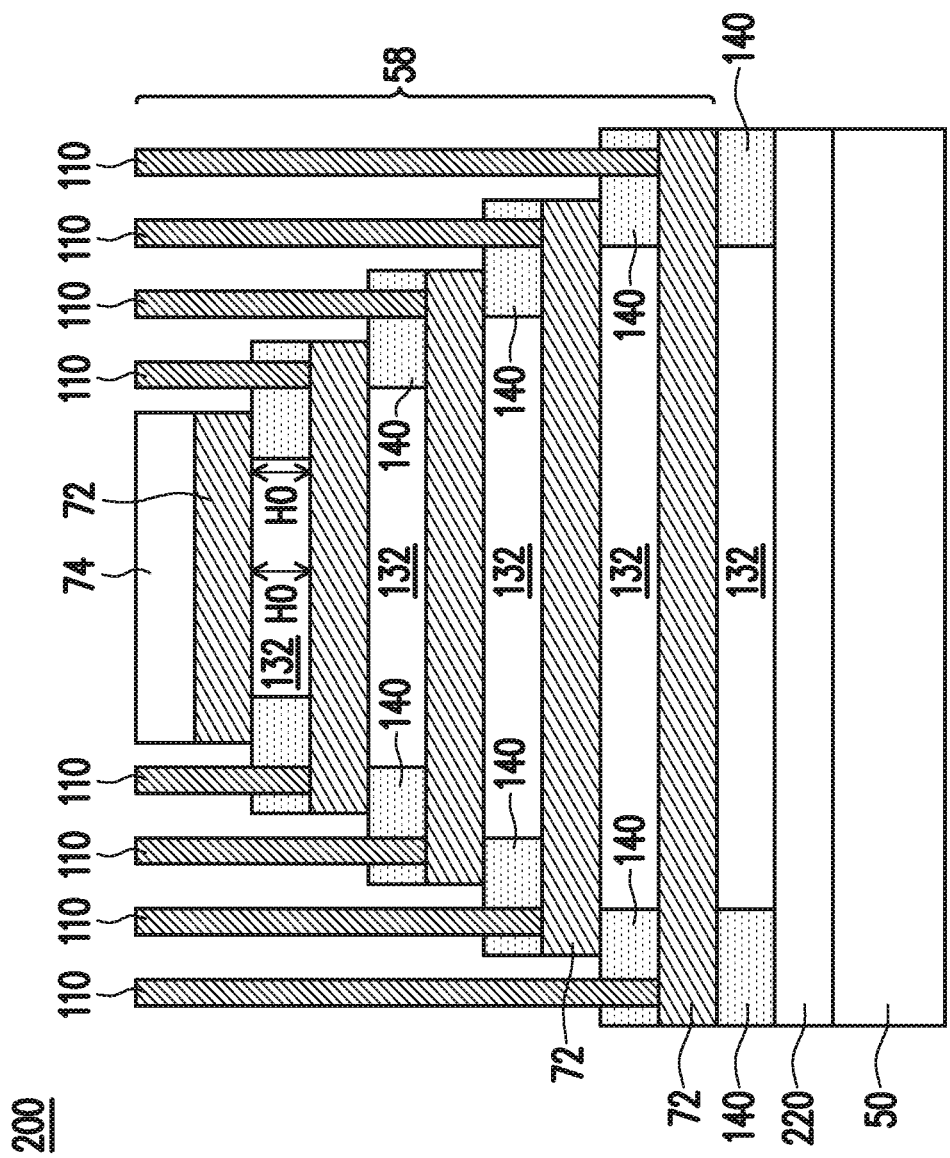

FIG. 33 illustrates a cross-sectional view of an intermediate step in the manufacture of a memory array 200, in accordance with some embodiments. The structure shown in FIG. 33 is similar to the structure shown in FIG. 30, except that seals 140 are formed on both ends of each air gap 132. In other embodiments, the seals 140 and/or contacts 110 may be formed in other configurations. For example, a seal 140 may be formed at one end of a conductive line 72, but contacts 110 formed at both ends of that conductive line 72. As another example, a seal 140 may be formed at one end of a conductive line 72, but a contact 110 formed at the opposite end of that conductive line 72. Other configurations are possible, and considered within the scope of the present disclosure.

Figure 34:
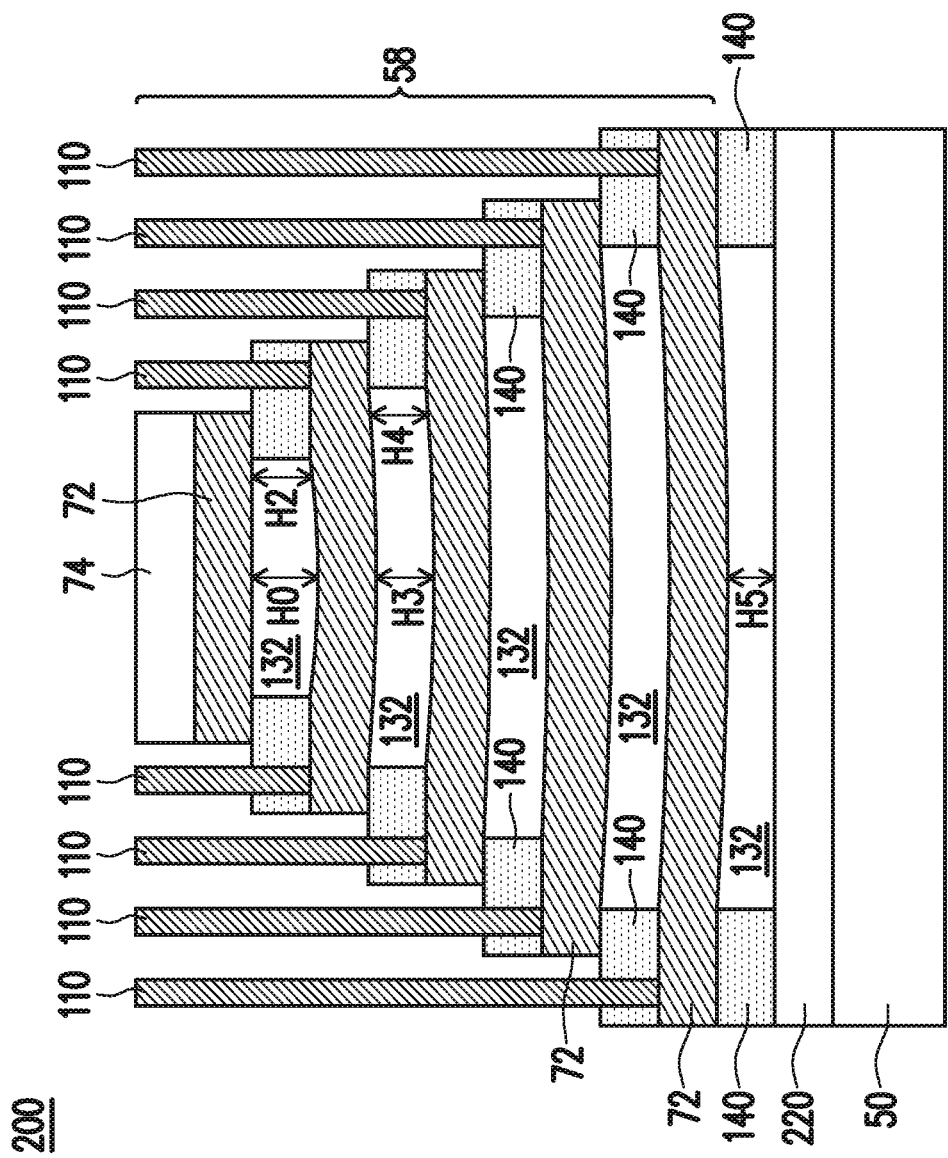

FIG. 34 illustrates a cross-sectional view of an intermediate step in the manufacture of a memory array 200, in accordance with some embodiments. The structure shown in FIG. 34 is similar to the structure shown in FIG. 33, except that the conductive lines 72 have a curved shape. In some cases, the conductive lines 72 may bow, bend, or sag after the sacrificial layers 74 are removed to form the air gaps 132. The conductive lines 72 may have a greater or lesser curvature than shown in FIG. 34, and/or different conductive lines 72 may have different curvatures. In some embodiments, a conductive line 72 may sag a vertical distance that is in the range between about 30 µm and about 100 µm, though other distances are possible. In some embodiments, due to the sagging, the height of an air gap 132 near the center of that air gap 132 may be larger than the height of that air gap 132 near the end of that air gap 132. For example, a height H1 near the center of the topmost airgap 132 of a multi-layer stack 58 may be larger than a height H2 near an end of that topmost airgap 132. In other embodiments, the height H1 may be about the same as the height H2. In some embodiments, the height H3 of an air gap 132 near the center of that air gap 132 may be larger, smaller, or about the same as the height H4 of that air gap 132 near the end of that air gap 132. In some embodiments, one or more of the air gaps 132 below the topmost airgap 132 of a multi-layer stack 58 may have a smaller height (e.g., heights H3 or H5 shown in FIG. 34) than the height H1 of the topmost airgap 132. In other embodiments, the heights of different airgaps 132 may be similar, or the height of a first airgap 132 may be greater than the height of a second airgap 132 above it. In some embodiments, the topmost airgap 132 of a multi-layer stack 58 may have the largest height of the airgaps 132 in that multi-layer stack 58 (for example, height H1 in FIG. 34), and/or the bottommost airgap 132 of a multi-layer stack 58 may have the smallest height of the airgaps 132 in that multi-layer stack 58 (for example, height H5 in FIG. 34). The heights of the airgaps 132 in a multi-layer stack 58 may be similar or different in other combinations than described here, and all such combinations are considered with the scope of the present disclosure.

Figure 35A:
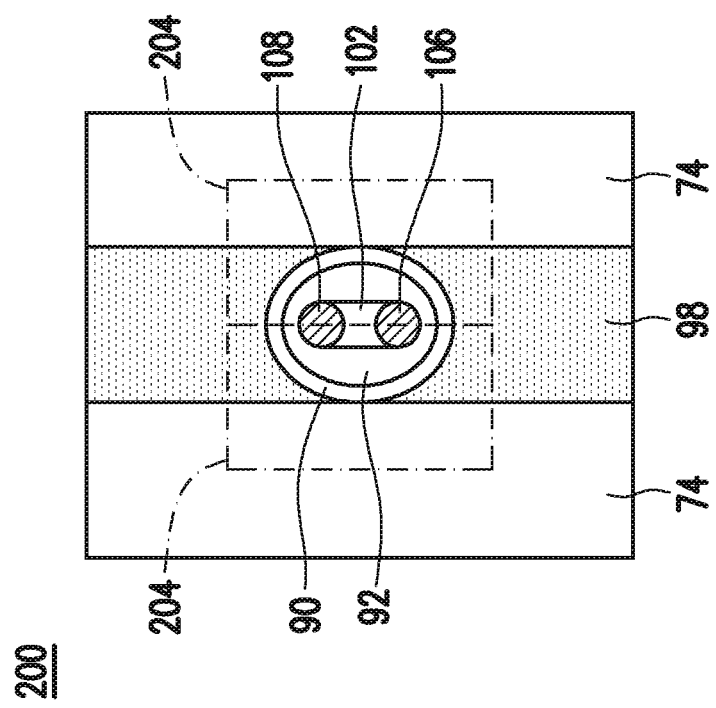
FIGS. 35A, 35B, and 35C illustrate plan views of intermediate steps in the manufacture of a memory array, in accordance with some embodiments.
Figure 35B:
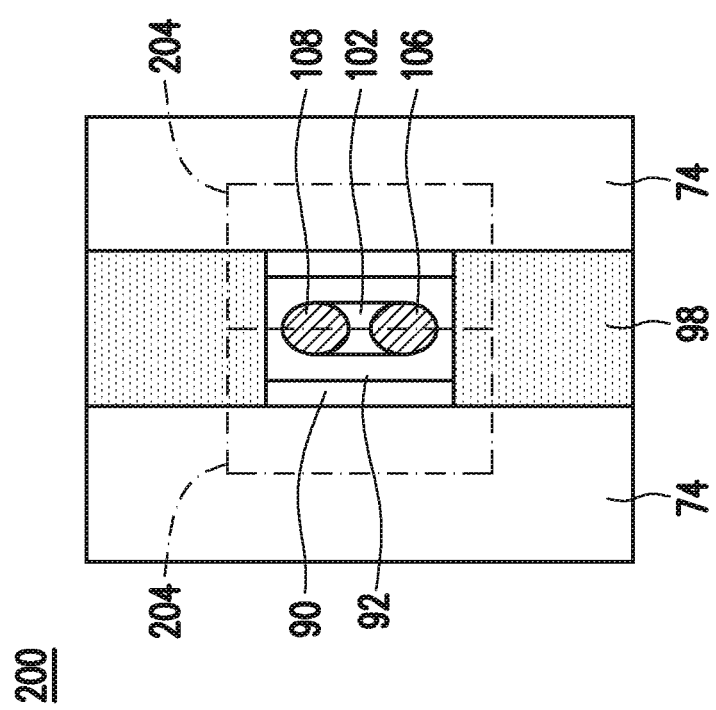
Figure 35C:
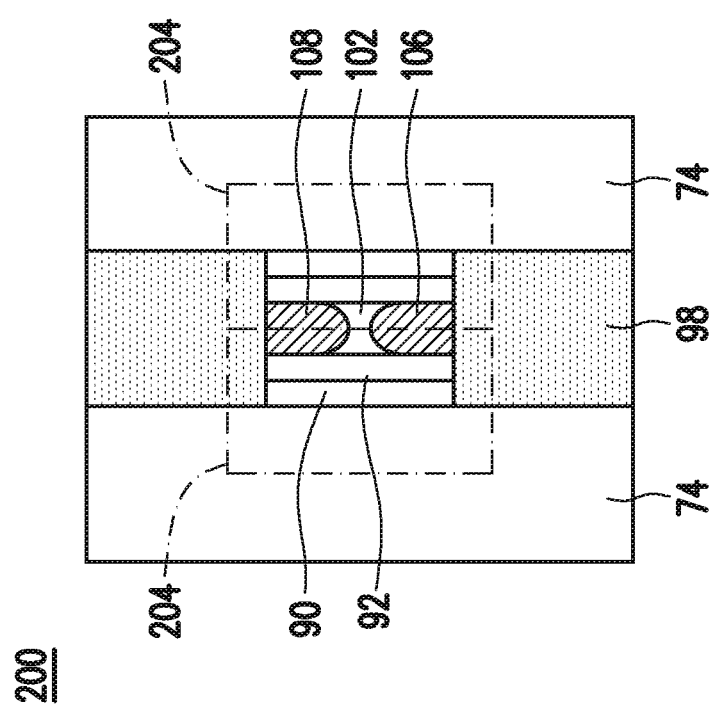

FIGS. 35A-C show plan views of transistors 204 having different shapes, in accordance with some embodiments. FIGS. 35A-C each show a magnified portion of a plan view similar to that in FIG. 25B, except that the dielectric material 102, the memory film 90, the OS layer 92, the conductive lines 106/108, and the dielectric material 98 have different shapes than in FIG. 25B. The embodiments shown in FIGS. 35A-C may be partly or wholly incorporated into other embodiments described herein. The structures shown in FIGS. 35A-C are examples, and other structures are possible.

In FIG. 35A, the memory film 90, the OS layer 92, and the conductive lines 106/108 are formed having rounded shapes, such as shapes with a circular, elliptical, or generally round lateral cross-section. In some embodiments, the structure shown in FIG. 35A may be formed by etching the trenches 88 (see FIGS. 20A-C) in the dielectric material 98 such that the trenches 88 have a rounded shape. The trenches 88 may be formed having a rounded shape, for example, by patterning openings having a rounded shape in the photoresist used to pattern the trenches 88. The memory film 90 and the OS layer 92 deposited in the trenches 88 (see FIGS. 21-22) thus have a corresponding rounded shape. After depositing the dielectric material 102 (see FIGS. 23A-C), the trenches 120 (see FIGS. 24A-C) may be formed in the dielectric material 102 having rounded shapes. The conductive material 104 deposited in the trenches 120 thus forms conductive lines 106/108 having similarly rounded shapes.

In FIG. 35B, the conductive lines 106/108 are formed having a rounded shape, and the memory film 90 is not formed extending across sidewalls of the dielectric material 98. In some embodiments, the structure shown in FIG. 35B may be formed by using a selective deposition process to deposit the memory film 90 within the trenches 88 (see FIG. 21). For example, the precursors of the deposition process may be chosen or controlled such that the memory film 90 deposits selectively on surfaces other than surfaces of the dielectric material 98. The material of the dielectric material 98 may be chosen to enhance or provide this deposition selectivity. After depositing the OS layer 92 and the dielectric material 102 (see FIGS. 22-23C), the trenches 120 (see FIGS. 24A-C) may be formed in the dielectric material 102 having rounded shapes. The conductive material 104 deposited in the trenches 120 thus forms conductive lines 106/108 having similarly rounded shapes. In some cases, forming transistors 204 similar to that shown in FIG. 35B can increase the contact area between the conductive lines 106/108 and the OS layer 92, which can reduce resistance of the contact between the conductive lines 106/108 and the OS layer 92. In some cases, forming the conductive lines 106/108 in this manner can increase the lateral extent of the contact area by a distance in the range of about 5 nm to about 15 nm.

In FIG. 35C, both the memory film 90 and the OS layer 92 are not formed extending across sidewalls of the dielectric material 98, and the conductive lines 106/108 are formed having a partially rounded shape and extending across the dielectric material 98. In some embodiments, the structure shown in FIG. 35C may be formed by the selective deposition of the OS layer 92 In some cases, forming transistors 204 similar to that shown in FIG. 35C can increase the contact area between the conductive lines 106/108 and the OS layer 92, which can reduce resistance of the contact between the conductive lines 106/108 and the OS layer 92. In some cases, forming the conductive lines 106/108 in this manner can increase the lateral extent of the contact area by a distance in the range of about 5 nm to about 30 nm.

Various embodiments provide a 3D memory array with vertically stacked memory cells. The memory cells each comprise a transistor with a memory film, gate dielectric material and an oxide semiconductor channel region. The transistor comprises source/drain electrodes, which are also source lines and bit lines in the memory array. The transistor further comprises gate electrodes, which are also word lines in the memory array. A dielectric material is disposed between and isolates adjacent ones of the source/drain electrodes. In some embodiments, a sacrificial layer is formed between each word line of a vertical stack of word lines. The sacrificial layer is removed, forming air gaps between the vertically adjacent word lines. Because air has a lower dielectric constant than many other dielectric materials (e.g., oxides, nitrides, or the like), separating word lines with air gaps instead of a dielectric material can reduce parasitic capacitance between different word lines. By reducing parasitic capacitance in this manner, the speed (e.g., response speed, switching speed, etc.) of the device may be improved and parasitic noise may be reduced. This can improve the operation of the device, particularly when operated at relatively high frequencies.

In accordance with some embodiments, a memory device includes a semiconductor substrate; a first transistor over the semiconductor substrate, wherein the first transistor includes a first word line extending over the semiconductor substrate; a second transistor over the semiconductor substrate, wherein the second transistor includes a second word line extending over the first word line; a first air gap extending between the first word line and the second word line; a memory film extending along the first word line and the second word line, wherein the memory film contacts the first word line and the second word line; a channel layer extending along the memory film; a source line extending along the channel layer, wherein the memory film is between the source line and the word line; a bit line extending along the channel layer, wherein the memory film is between the bit line and the word line; and an isolation region between the source line and the bit line. In an embodiment, at least one end of the air gap is sealed by a first dielectric material extending between the first word line and the second word line. In an embodiment, the memory device includes a conductive contact that extends through the first dielectric material to physically contact the first word line. In an embodiment, the memory device includes an inter-metal dielectric layer (IMD) over and physically contacting the first word line and the first dielectric material. In an embodiment, the air gap has a first length and the second word line has a second length, wherein the first length is in the range of 5% to 80% of the second length. In an embodiment, the memory device includes a second dielectric material extending over and physically contacting the second word line. In an embodiment, the memory device includes a third transistor over the semiconductor substrate, wherein the third transistor includes a third word line extending over the second word line and a second air gap extending between the second word line and the third word line. In an embodiment, a volume of the second air gap is smaller than a volume of the first air gap.

In accordance with some embodiments, a device includes a semiconductor substrate; a first memory cell over the semiconductor substrate, the first memory cell including a first transistor, wherein the first transistor includes a first gate electrode including a portion of a first word line, wherein a bottom surface of the first gate electrode is exposed by a first air gap, wherein a top surface of the first gate electrode is exposed by a second air gap; a first portion of a ferroelectric material, wherein the first portion of the ferroelectric material is on a sidewall of the first gate electrode; and a first channel region on a sidewall of the first portion of the ferroelectric material; a source line, wherein a first portion of the source line provides a first source/drain electrode for the first transistor; a bit line, wherein a first portion of the bit line provides a second source/drain electrode for the first transistor; and a first dielectric material separating the source line and the bit line. In an embodiment, the device includes a second memory cell over the first memory cell, the second memory cell including a second transistor, wherein the second transistor includes a second gate electrode including a portion of a second word line, wherein a bottom surface of the second gate electrode is exposed by the second air gap. In an embodiment, a top surface of the second gate electrode is covered by a second dielectric material. In an embodiment, the bottom surface of the first gate electrode includes a first end and a second end, wherein a portion of the bottom surface between the first end and the second end is closer to the semiconductor substrate than the first end and the second end. In an embodiment, a height of the second air gap is greater than a height of the first air gap. In an embodiment, the device includes a first seal on the bottom surface of the first gate electrode and a second seal on the top surface of the first gate electrode, wherein the first seal and the second seal are a seal material. In an embodiment, a lateral cross-section of the source line and a lateral cross-section of the bit line have a rounded shape.

In accordance with some embodiments, a method includes depositing alternating layers of conductive material and sacrificial material to form a multi-layer stack comprising conductive material layers and sacrificial material layers; depositing a memory film along a sidewall of the multi-layer stack; depositing an oxide semiconductor (OS) layer over the memory film; forming an inter-metal dielectric layer (IMD) over the multi-layer stack; patterning trenches in the IMD, wherein each trench of the trenches exposes a respective sacrificial material layer of the sacrificial material layers; performing an etching process through the trenches to remove the sacrificial material layers, wherein removing the sacrificial layers forms air gaps between conductive material layers of the conductive material layers; and depositing a dielectric material in the trenches, wherein the dielectric material seals the air gaps. In an embodiment, the sacrificial material is silicon. In an embodiment, the etching process includes performing a dry etching process followed by a wet etching process. In an embodiment, depositing the dielectric material includes depositing an oxide using a PECVD process. In an embodiment, the method includes forming contacts to the conductive layers, which includes depositing a conductive material in the trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a semiconductor substrate;
   a first transistor over the semiconductor substrate, wherein the first transistor comprises a first word line extending over the semiconductor substrate;
   a second transistor over the semiconductor substrate, wherein the second transistor comprises a second word line extending over the first word line;
   a first air gap extending between the first word line and the second word line;
   a memory film extending along the first word line and the second word line, wherein the memory film contacts the first word line and the second word line;
   a channel layer extending along the memory film;
   a source line extending along the channel layer, wherein the memory film is between the source line and the word line;
   a bit line extending along the channel layer, wherein the memory film is between the bit line and the word line; and
   an isolation region between the source line and the bit line.

2. The memory device of claim 1, wherein at least one end of the air gap is sealed by a first dielectric material extending between the first word line and the second word line.

3. The memory device of claim 2 further comprising a conductive contact that extends through the first dielectric material to physically contact the first word line.

4. The memory device of claim 2 further comprising an inter-metal dielectric layer (IMD) over and physically contacting the first word line and the first dielectric material.

5. The memory device of claim 1, wherein the air gap has a first length and the second word line has a second length, wherein the first length is in the range of 5% to 80% of the second length.

6. The memory device of claim 1 further comprising a second dielectric material extending over and physically contacting the second word line.

7. The memory device of claim 1 further comprising:
   a third transistor over the semiconductor substrate, wherein the third transistor comprises a third word line extending over the second word line; and
   a second air gap extending between the second word line and the third word line.

8. The memory device of claim 7, wherein a volume of the second air gap is smaller than a volume of the first air gap.

9. A device comprising:
   a semiconductor substrate;
   a first memory cell over the semiconductor substrate, the first memory cell comprising a first transistor, wherein the first transistor comprises:
      a first gate electrode comprising a portion of a first word line, wherein a bottom surface of the first gate electrode is exposed by a first air gap, wherein a top surface of the first gate electrode is exposed by a second air gap;
      a first portion of a ferroelectric material, wherein the first portion of the ferroelectric material is on a sidewall of the first gate electrode; and
      a first channel region on a sidewall of the first portion of the ferroelectric material;
   a source line, wherein a first portion of the source line provides a first source/drain electrode for the first transistor;
   a bit line, wherein a first portion of the bit line provides a second source/drain electrode for the first transistor; and
   a first dielectric material separating the source line and the bit line.

10. The device of claim 9 further comprising a second memory cell over the first memory cell, the second memory cell comprising a second transistor, wherein the second transistor comprises a second gate electrode comprising a portion of a second word line, wherein a bottom surface of the second gate electrode is exposed by the second air gap.

11. The device of claim 9 further comprising a contact physically and electrically contacting the first gate electrode, wherein the contact penetrates through the second seal and is encircled by the second seal.

12. The device of claim 9, wherein the bottom surface of the first gate electrode comprises a first end and a second end, wherein a portion of the bottom surface between the first end and the second end is closer to the semiconductor substrate than the first end and the second end.

13. The device of claim 9, wherein a height of the second air gap is greater than a height of the first air gap.

14. The device of claim 9 further comprising a first seal on the bottom surface of the first gate electrode and a second seal on the top surface of the first gate electrode, wherein the first seal and the second seal comprise a seal material.

15. The device of claim 9, wherein a lateral cross-section of the source line and a lateral cross-section of the bit line have a rounded shape.

16. A method comprising:
   depositing alternating layers of conductive material and sacrificial material to form a multi-layer stack comprising a plurality of conductive material layers and a plurality of sacrificial material layers;
   depositing a memory film along a sidewall of the multi-layer stack;
   depositing an oxide semiconductor (OS) layer over the memory film;
   forming an inter-metal dielectric layer (IMD) over the multi-layer stack;
   patterning a plurality of trenches in the IMD, wherein each trench of the plurality of trenches exposes a respective sacrificial material layer of the plurality of sacrificial material layers;
   performing an etching process within the plurality of trenches to remove the plurality of sacrificial material layers, wherein removing the plurality of sacrificial layers forms air gaps between conductive material layers of the plurality of conductive material layers;
   depositing a dielectric material in the plurality of trenches, wherein the dielectric material seals the air gaps;

performing an etching process within the plurality of trenches to extend each trench through the dielectric material and expose a respective conductive material layer; and depositing a conductive fill material in the plurality of trenches to form a plurality of contacts, wherein each contact physically and electrically contacts a respective conductive material layer.

17. The method of claim 16, wherein the sacrificial material is silicon.

18. The method of claim 16, wherein the etching process comprises performing a dry etching process followed by a wet etching process.

19. The method of claim 16, wherein depositing the dielectric material comprises depositing an oxide using a PECVD process.

20. The method of claim 16, wherein each contact is laterally separated from a respective air gap by the dielectric material.

* * * * *